US008937703B2

(12) United States Patent
Sato

(10) Patent No.: US 8,937,703 B2
(45) Date of Patent: Jan. 20, 2015

(54) LIQUID IMMERSION MEMBER, IMMERSION EXPOSURE APPARATUS, LIQUID RECOVERING METHOD, DEVICE FABRICATING METHOD, PROGRAM, AND STORAGE MEDIUM

(75) Inventor: Shinji Sato, Fukaya (JP)

(73) Assignee: Nikon Corporation, Tokyo (JP)

( * ) Notice: Subject to any disclaimer, the term of this patent is extended or adjusted under 35 U.S.C. 154(b) by 575 days.

(21) Appl. No.: 13/180,978

(22) Filed: Jul. 12, 2011

(65) Prior Publication Data

US 2012/0013862 A1 Jan. 19, 2012

Related U.S. Application Data

(60) Provisional application No. 61/364,136, filed on Jul. 14, 2010.

(51) Int. Cl.
*G03F 7/20* (2006.01)

(52) U.S. Cl.
CPC ............ *G03F 7/709* (2013.01); *G03F 7/70341* (2013.01)
USPC .................................. 355/30; 355/53; 355/77

(58) Field of Classification Search
CPC .. G03F 7/70341; G03F 7/70708; G03F 7/2041
USPC .............................. 355/30, 53, 55, 72, 75, 77
See application file for complete search history.

(56) References Cited

U.S. PATENT DOCUMENTS

| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,452,292 | B1 | 9/2002 | Binnard |
| 6,611,316 | B2 | 8/2003 | Sewell |
| 6,778,257 | B2 | 8/2004 | Bleeker et al. |

(Continued)

FOREIGN PATENT DOCUMENTS

| JP | A-2005-191344 | 7/2005 |
| WO | WO 01/35168 A1 | 5/2001 |
| WO | WO 2004/019128 A2 | 3/2004 |

OTHER PUBLICATIONS

International Search Report issued in International Application No. PCT/JP2011/066510 on Oct. 18, 2011.

(Continued)

*Primary Examiner* — Steven H Whitesell Gordon
(74) *Attorney, Agent, or Firm* — Oliff PLC

(57) ABSTRACT

A liquid immersion member is disposed inside an immersion exposure apparatus and at least partly around an optical member and around an optical path of exposure light that passes through a liquid between the optical member and an object. The liquid immersion member comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway. The first member comprises a first portion and a second portion. The second portion hinders a gas flowing from a space between the object and the first surface into the recovery passageway via the holes more than the first portion does.

138 Claims, 35 Drawing Sheets

(56) References Cited

U.S. PATENT DOCUMENTS

| | | | |
|---|---|---|---|
| 6,897,963 B1 | 5/2005 | Taniguchi et al. | |
| 7,420,188 B2* | 9/2008 | Chang et al. | 250/492.2 |
| 7,576,833 B2* | 8/2009 | Poon et al. | 355/53 |
| 7,602,470 B2* | 10/2009 | Kemper et al. | 355/30 |
| 2006/0038968 A1* | 2/2006 | Kemper et al. | 355/18 |
| 2007/0127006 A1 | 6/2007 | Shibazaki | |
| 2007/0177125 A1 | 8/2007 | Shibazaki | |
| 2008/0049209 A1 | 2/2008 | Nagasaka et al. | |
| 2008/0231824 A1* | 9/2008 | Nagasaka | 355/30 |
| 2009/0002648 A1* | 1/2009 | Poon et al. | 355/30 |
| 2009/0046261 A1 | 2/2009 | Van Der Net | |
| 2009/0237631 A1* | 9/2009 | Poon et al. | 355/30 |
| 2009/0268175 A1* | 10/2009 | Chibana et al. | 355/30 |
| 2010/0045949 A1* | 2/2010 | Nakano et al. | 355/30 |
| 2010/0045950 A1* | 2/2010 | Kemper et al. | 355/30 |
| 2010/0097585 A1* | 4/2010 | Poon et al. | 355/30 |
| 2010/0099050 A1* | 4/2010 | Yoshida | 430/325 |
| 2010/0134773 A1* | 6/2010 | Poon et al. | 355/30 |
| 2010/0283980 A1* | 11/2010 | Sato et al. | 355/30 |
| 2011/0222031 A1* | 9/2011 | Sato | 355/30 |
| 2012/0013862 A1* | 1/2012 | Sato | 355/30 |
| 2012/0013863 A1* | 1/2012 | Sato | 355/30 |
| 2012/0013864 A1* | 1/2012 | Sato | 355/30 |

OTHER PUBLICATIONS

Written Opinion of the International Searching Authority issued in International Application No. PCT/JP2011/066510 on Oct. 18, 2011.

* cited by examiner

LIQUID IMMERSION MEMBER, IMMERSION EXPOSURE APPARATUS, LIQUID RECOVERING METHOD, DEVICE FABRICATING METHOD, PROGRAM, AND STORAGE MEDIUM

CROSS-REFERENCE TO RELATED APPLICATION

This application is a non-provisional application claiming priority to and the benefit of U.S. provisional application No. 61/364,136, filed Jul. 14, 2010. The entire contents of which are incorporated herein by reference.

BACKGROUND

1. Field of the Invention

The present invention relates to a liquid immersion member, an immersion exposure apparatus, a liquid recovering method, a device fabricating method, a program, and a storage medium.

2. Description of Related Art

As disclosed in, for example, U.S. Patent Application Publication No. 2009/0046261, among exposure apparatuses used in photolithography, an immersion exposure apparatus is known that exposes a substrate with exposure light through a liquid in an immersion space.

SUMMARY

In the immersion exposure apparatus, exposure failures might occur if, for example, the immersion space cannot be formed in a desired state. These problems could result in the production of defective devices.

An object of aspects of the present invention is to provide a liquid immersion member that can satisfactorily form an immersion space. Another object of aspects of the present invention is to provide both an immersion exposure apparatus and a liquid recovering method that can prevent exposure failures from occurring. Yet another object of the present invention is to provide a device fabricating method, a program, and a storage medium that can prevent defective devices from being produced.

A first aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and the second portion hinders the gas flowing from a space between the object and the first surface into the recovery passageway via the holes more than the first portion does.

A second aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and the inflow resistance of a gas from a space between the object and the first surface into the recovery passageway via the holes is larger in the second portion than in the first portion.

A third aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and a percentage of the holes per unit of area in the first surface is smaller in the second portion than in the first portion.

A fourth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and a dimension of the holes in the second portion is smaller than the dimension of the holes in the first portion.

A fifth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and the number of the holes in the second portion is smaller than the number of the holes in the first portion.

A sixth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and a surface of each of the holes in the second portion is more lyophilic with respect to the liquid than the surface of each of the holes in the first portion is.

A seventh aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which separately discharges a liquid and a gas from the recovery passageway; wherein, the first member comprises a first portion and a second portion; and an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

An eighth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and the second portion hinders the gas flowing from a space between the object and the first surface into the recovery passageway via the holes more than the first portion does.

A ninth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and the inflow resistance of the gas from the space between the object and the first surface into the recovery passageway via the holes is larger in the second portion than in the first portion.

A tenth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and a percentage of the holes per unit of area in the first surface is smaller in the second portion than in the first portion.

An eleventh aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and a dimension of the holes in the second portion is smaller than the dimension of the holes in the first portion.

A twelfth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and the number of the holes in the second portion is smaller than the number of the holes in the first portion.

A thirteenth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and a surface of each of the holes in the second portion is more lyophilic with respect to the liquid than the surface of each of the holes in the first portion is.

A fourteenth aspect of the present invention provides a liquid immersion member, which is disposed inside an immersion exposure apparatus and at least partly around an optical member and around an optical path of exposure light that passes through a liquid between the optical member and an object, that comprises: a first member, which has a first surface, a second surface that faces a direction other than that faced by the first surface, and a plurality of holes that connects the first surface and the second surface, that recovers at least some of the liquid from the space above the object opposing the first surface via the holes; a recovery passageway, wherethrough the liquid recovered via the holes of the first member flows; and a discharge part, which discharges a liquid and a gas from the recovery passageway; wherein, the discharge part has a first discharge port and a second discharge port; the first discharge port hinders the inflow of the gas more than the second discharge port does; the second discharge port hinders the inflow of the liquid more than the first discharge port does; the first member comprises a first portion and a second portion; and an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

A fifteenth aspect of the present invention provides an immersion exposure apparatus, which exposes a substrate with exposure light that transits a liquid, that comprises: a liquid immersion member according to any one aspect of the first through fourteenth aspects.

A sixteenth aspect of the present invention provides a device fabricating method that comprises: exposing a substrate using an immersion exposure apparatus according to the fifteenth aspect; and developing the exposed substrate.

A seventeenth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, the second portion hindering the flow of a gas from a space that the first surface faces into a recovery passageway, which the second surface faces, via the holes more than the first portion does; and separately discharging the liquid and the gas from the recovery passageway, wherethrough the liquid recovered via the holes of the first member flows.

An eighteenth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the resistance to the flow of a gas from a space that the first surface faces into a recovery passageway, which the second surface faces, via the holes is larger in the second portion than in the first portion; and separately discharging the liquid and the gas from the recovery passageway, wherethrough the liquid recovered via the holes of the first member flows.

A nineteenth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the percentage of the holes per unit of area in the first surface is smaller in the second portion than in the first portion; and separately discharging the liquid and a gas from a recovery passageway, wherethrough the liquid recovered from the space above the substrate via the holes of the first member flows.

A twentieth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a dimension of the holes in the second portion is smaller than the dimension of the holes in the first portion; and separately discharging the liquid and a gas from a recovery passageway, wherethrough the liquid recovered from the space above the substrate via the holes of the first member flows.

A twenty-first aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the number of the holes in the second portion is smaller than the number of the holes in the first portion; and separately discharging the liquid and a gas from a recovery passageway, wherethrough the liquid recovered from the space above the substrate via the holes of the first member flows.

A twenty-second aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a surface of each of the holes in the second portion is more lyophilic with respect to the liquid than the surface of each of the holes in the first portion is; and separately discharging the liquid and a gas from a recovery passageway, wherethrough the liquid recovered from the space above the substrate via the holes of the first member flows.

A twenty-third aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; and separately discharging the liquid and a gas from a recovery passageway, wherethrough the liquid recovered from the space above the substrate via the holes of the first member flows.

A twenty-fourth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, the second portion hindering the flow of a gas from a space that the first surface faces into a recovery passageway, which the second surface faces, via the holes more than the first portion does; discharging the fluid that includes the liquid in the recovery passageway, wherethrough the liquid recovered via the holes of the first member flows, via the first discharge port, which faces the recovery port; and discharging the fluid that includes the gas in the recovery passageway via the second discharge port, which hinders the inflow of the liquid more than the first discharge port does.

A twenty-fifth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the resistance to the flow of a gas from a space that the first surface faces into a recovery passageway, which the second surface faces, via the holes is larger in the second portion than in the first portion; discharging the fluid that includes the liquid in the recovery passageway, wherethrough the liquid recovered via the holes of the first member flows, via the first discharge port, which faces the recovery port; and discharging the fluid that includes the gas in the recovery passageway via the second discharge port, which hinders the inflow of the liquid more than the first discharge port does.

A twenty-sixth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the percentage of the holes per unit of area in the first surface is smaller in the second portion than in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via the second discharge port, which hinders the inflow of the liquid more than the first discharge port does.

A twenty-seventh aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a dimension of the holes in the second portion is smaller than the dimension of the holes in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via the second discharge port, which hinders the inflow of the liquid more than the first discharge port does.

A twenty-eighth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the number of the holes in the second portion is smaller than the number of the holes in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via the second discharge port, which hinders the inflow of the liquid more than the first discharge port does.

A twenty-ninth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a surface of each of the holes in the second portion is more lyophilic with respect to the liquid than the surface of each of the holes in the first portion is; discharging the fluid that includes the liquid in the recovery passageway, wherethrough the liquid recovered via the holes of the first member flows, via the first discharge port, which faces the recovery port; and discharging the fluid that includes a gas in the recovery passageway via the second discharge port, which hinders the inflow of the liquid more than the first discharge port does.

A thirtieth aspect of the present invention provides a liquid recovering method that is used by an immersion exposure apparatus wherein an immersion space is formed such that an optical path of exposure light between an optical member, wherefrom the exposure light can emerge, and a substrate is filled with a liquid and the substrate is exposed with the exposure light that transits the liquid, and that comprises: causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via the second discharge port, which hinders the inflow of the liquid more than the first discharge port does.

A thirty-first aspect of the present invention provides a device fabricating method that comprises: filling an optical path of exposure light radiated to a substrate with a liquid using a liquid recovering method according to any one aspect of the seventeenth through thirtieth aspects; exposing the substrate with the exposure light that transits the liquid; and developing the exposed substrate.

A thirty-second aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid;

exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes of the first member in at least one portion selected from the group consisting of a first portion and a second portion, wherein the second portion hinders the flow of a gas from a space that the first surface faces into a recovery passageway, which the second surface faces, via the holes more than the first portion does; and separately discharging the liquid and the gas from the recovery passageway, wherethrough the liquid recovered via the holes of the first member flows.

A thirty-third aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the resistance to the flow of a gas from a space that the first surface faces into a recovery passageway, which the second surface faces, via the holes is larger in the second portion than in the first portion; and separately discharging the liquid and the gas from the recovery passageway, wherethrough the liquid recovered via the holes of the first member flows.

A thirty-fourth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the percentage of the holes per unit of area in the first surface is smaller in the second portion than in the first portion; and separately discharging the liquid and a gas from a recovery passageway, wherethrough the liquid recovered from the space above the substrate via the holes of the first member flows.

A thirty-fifth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a dimension of the holes in the second portion is smaller than the dimension of the holes in the first portion; and separately discharging the liquid and a gas from a recovery passageway, wherethrough the liquid recovered from the space above the substrate via the holes of the first member flows.

A thirty-sixth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the number of the holes in the second portion is smaller than the number of the holes in the first portion; and separately discharging the liquid and a gas from a recovery passageway, wherethrough the liquid recovered from the space above the substrate via the holes of the first member flows.

A thirty-seventh aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a surface of each of the holes in the second portion is more lyophilic with respect to the liquid than the surface of each of the holes in the first portion is; and separately discharging the liquid and a gas from a recovery passageway, wherethrough the liquid recovered from the space above the substrate via the holes of the first member flows.

A thirty-eighth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid;

exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; and separately discharging the liquid and a gas from a recovery passageway, wherethrough the liquid recovered from the space above the substrate via the holes of the first member flows.

A thirty-ninth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes of the first member in at least one portion selected from the group consisting of a first portion and a second portion, wherein the second portion hinders the flow of a gas from a space that the first surface faces into a recovery passageway, which the second surface faces, via the holes more than the first portion does; discharging the fluid that includes the liquid in the recovery passageway, wherethrough the liquid recovered via the holes of the first member flows, via the first discharge port, which faces the recovery port; and discharging the fluid that includes the gas in the recovery passageway via a second discharge port, which hinders the inflow of the liquid more than the first discharge port does.

A fortieth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the resistance to the flow of a gas from a space that the first surface faces into a recovery passageway, which the second surface faces, via the holes is larger in the second portion than in the first portion; discharging the fluid that includes the liquid in the recovery passageway, wherethrough the liquid recovered via the holes of the first member flows, via the first discharge port, which faces the recovery port; and discharging the fluid that includes the gas in the recovery passageway via a second discharge port, which hinders the inflow of the liquid more than the first discharge port does.

A forty-first aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the percentage of the holes per unit of area in the first surface is smaller in the second portion than in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via a second discharge port, which hinders the inflow of the liquid more than the first discharge port does.

A forty-second aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a dimension of the holes in the second portion is smaller than the dimension of the holes in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via a second discharge port, which hinders the inflow of the liquid more than the first discharge port does.

A forty-third aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the number of the holes in the second portion is smaller than the number of the holes in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via a second discharge port, which hinders the inflow of the liquid more than the first discharge port does.

A forty-fourth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein a surface of each of the holes in the second portion is more lyophilic with respect to the liquid than the surface of each of the holes in the first portion is; discharging the fluid that includes the liquid in the recovery passageway, wherethrough the liquid recovered via the holes of the first member flows, via the first discharge port, which faces the recovery port; and discharging the fluid that includes a gas in the recovery passageway via a second discharge port, which hinders the inflow of the liquid more than the first discharge port does.

A forty-fifth aspect of the present invention provides a program that causes a computer to control an immersion exposure apparatus that exposes a substrate with exposure light that transits a liquid, and that comprises: forming an immersion space such that an optical path of the exposure light between the substrate and an optical member, wherefrom the exposure light can emerge, is filled with the liquid; exposing the substrate with the exposure light that transits the liquid in the immersion space; causing the substrate to oppose a first surface of a first member, the first member having the first surface, a second surface that faces a direction other than that faced by the first surface, and a plurality of holes that connect the first surface and the second surface; recovering at least some of the liquid from the space above the substrate via the holes in at least one portion of the first member selected from the group consisting of a first portion and a second portion, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; discharging the fluid that includes the liquid in the recovery passageway, wherethrough the liquid recovered via the holes of the first member flows, via the first discharge port, which faces the recovery port; and discharging the fluid that includes a gas in the recovery passageway via a second discharge port, which hinders the inflow of the liquid more than the first discharge port does.

A forty-sixth aspect of the present invention provides a computer readable storage medium whereon a program according to any one aspect of the thirty-second through forty-fifth aspects is stored.

According to the aspects of the present invention, an immersion space can be formed satisfactorily. In addition, according to the aspects of the present invention, it is possible to prevent exposure failures from occurring and thereby to prevent defective devices from being produced.

DESCRIPTION OF EMBODIMENTS

The embodiments of the present invention will now be explained, referencing the drawings; however, the present invention is not limited thereto. The explanation below defines an XYZ orthogonal coordinate system, and the positional relationships among parts are explained referencing this system. Prescribed directions within the horizontal plane are the X axial directions, directions orthogonal to the X axial directions in the horizontal plane are the Y axial directions, and directions orthogonal to the X axial directions and the Y axial directions (i.e., the vertical directions) are the Z axial directions. In addition, the rotational directions (i.e., the tilting directions) around the X, Y, and Z axes are the θX, θY, and θZ directions, respectively.

<First Embodiment>

Figure 1:
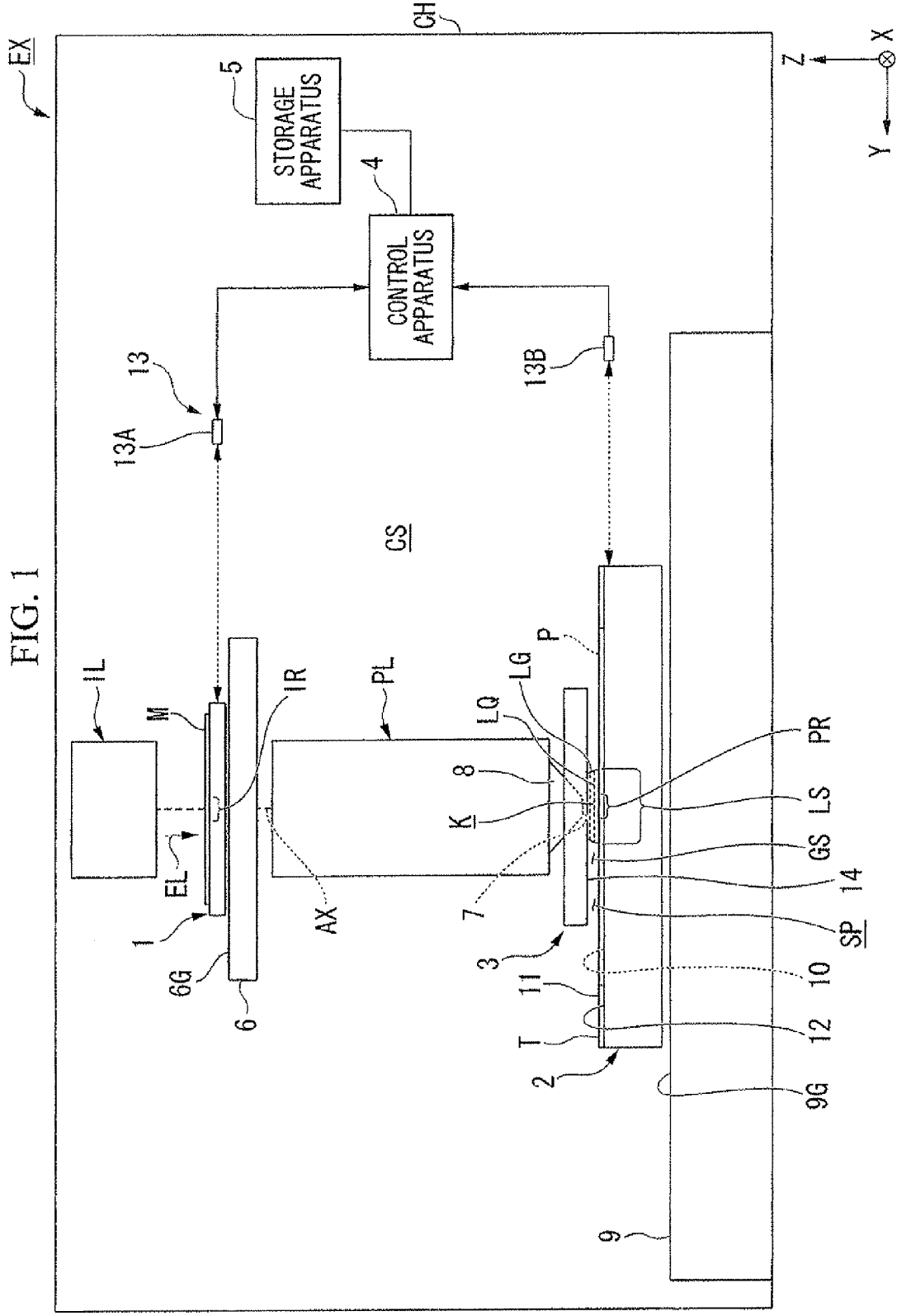
FIG. 1 is a schematic block diagram that shows one example of an exposure apparatus according to a first embodiment.

A first embodiment will now be explained. FIG. 1 is a schematic block diagram that shows one example of an exposure apparatus EX according to a first embodiment. The exposure apparatus EX of the present embodiment is an immersion exposure apparatus that exposes a substrate P with exposure light EL that passes through a liquid LQ. In the present embodiment, an immersion space LS is formed so that at least part of an optical path K of the exposure light EL is filled with the liquid LQ. An immersion space LS refers to a portion (i.e., a space or an area) that is filled with liquid. The substrate P is exposed with the exposure light EL, which transits the liquid LQ in the immersion space LS. In the present embodiment, water (i.e., pure water) is used as the liquid LQ.

In FIG. 1, the exposure apparatus EX comprises: a movable mask stage 1 that holds a mask M; a movable substrate stage 2 that holds the substrate P; an illumination system IL that illuminates the mask M with the exposure light EL; a projection optical system PL that projects an image of a pattern of the mask M, which is illuminated by the exposure light EL, to the substrate P; a liquid immersion member 3, which forms the immersion space LS by holding the liquid LQ between itself and the substrate P such that the optical path K of the exposure light EL radiated to the substrate P is filled with the liquid LQ; a control apparatus 4, which controls the operation of the entire exposure apparatus EX; and a storage apparatus 5, which is connected to the control apparatus 4 and stores various exposure-related information. The storage apparatus 5 comprises a storage medium such as memory (e.g., RAM), a hard disk, a CD-ROM, and the like. In the storage apparatus 5, an operating system (OS) that controls a computer system is installed and a program for controlling the exposure apparatus EX is stored.

In addition, the exposure apparatus EX comprises a chamber apparatus CH, which forms an internal space CS wherein at least the projection optical system PL, the liquid immersion member 3, and the substrate stage 2 are disposed. The chamber apparatus CH comprises an environmental control apparatus, which controls the environment (i.e., the temperature, the humidity, the pressure, and the cleanliness level) of the internal space CS.

The mask M may be a reticle on which a device pattern to be projected to the substrate P is formed. The mask M may be a transmissive mask comprising a transparent plate, such as a glass plate, and the pattern, which is formed on the transparent plate using a shielding material, such as chrome. Furthermore, the mask M may alternatively be a reflective mask.

The substrate P is a substrate for fabricating devices. The substrate P comprises, for example, a base material, such as a semiconductor wafer, and a photosensitive film, which is formed on the base material. The photosensitive film comprises a photosensitive material (e.g., photoresist). In addition to the photosensitive film, the substrate P may comprise a separate film. For example, the substrate P may comprise an antireflection film or a protective film (i.e., a topcoat film) that protects the photosensitive film.

The illumination system IL radiates the exposure light EL to a prescribed illumination area IR. The illumination area IR includes a position whereto the exposure light EL that emerges from the illumination system IL can be radiated. The illumination system IL illuminates at least part of the mask M disposed in the illumination area IR with the exposure light EL, which has a uniform luminous flux intensity distribution. Examples of light that can be used as the exposure light EL that emerges from the illumination system IL include: deep ultraviolet (DUV) light, such as a bright line (i.e., g-line, h-line, or i-line) light emitted from, for example, a mercury lamp, and KrF excimer laser light (with a wavelength of 248 nm); and vacuum ultraviolet (VUV) light, such as ArF excimer laser light (with a wavelength of 193 nm) and $F_2$ laser light (with a wavelength of 157 nm). In the present embodiment, ArF excimer laser light, which is ultraviolet light (e.g., vacuum ultraviolet light), is used as the exposure light EL.

In the state wherein it holds the mask M, the mask stage 1 is capable of moving on a guide surface 6G of a base member 6 that includes the illumination area IR. The mask stage 1 moves by the operation of a drive system, which comprises a planar motor as disclosed in, for example, U.S. Pat. No. 6,452,292. The planar motor comprises a slider, which is disposed on the mask stage 1, and a stator, which is disposed on the base member 6. In the present embodiment, the mask stage 1 is capable of moving in six directions along the guide surface 6G, namely, the X axial, Y axial, Z axial, θX, θY, and θZ directions, by the operation of the drive system.

The projection optical system PL radiates the exposure light EL to a prescribed projection area PR. The projection area PR includes a position whereto the exposure light EL that emerges from the projection optical system PL can be radiated. The projection optical system PL projects with a prescribed projection magnification an image of the pattern of the mask M to at least part of the substrate P, which is disposed in the projection area PR. The projection optical system PL of the present embodiment is a reduction system that has a projection magnification of, for example, ¼, ⅕, or ⅛. Furthermore, the projection optical system PL may be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The projection optical system PL has an emergent surface 7 wherefrom the exposure light EL emerges and travels toward an image plane of the projection optical system PL. The emergent surface 7 belongs to a last optical element 8, which is the optical element of the plurality of optical elements of the projection optical system PL that is closest to the image plane of the projection optical system PL. The projection area PR includes a position whereto the exposure light EL that emerges from the emergent surface 7 can be radiated. In the present embodiment, the emergent surface 7 faces the −Z direction and is parallel to the XY plane. Furthermore, the emergent surface 7, which faces the −Z direction, may be a convex or a concave surface. The optical axis of the last optical element 8 is parallel to the Z axis. In the present embodiment, the exposure light EL that emerges from the emergent surface 7 proceeds in the −Z direction.

In the state wherein it holds the substrate P, the substrate stage 2 is capable of moving on a guide surface 9G of a base member 9, which includes the projection area PR. The substrate stage 2 moves by the operation of a drive system, which comprises a planar motor as disclosed in, for example, U.S. Pat. No. 6,452,292. The planar motor comprises a slider, which is disposed on the substrate stage 2, and a stator, which is disposed on the base member 9. In the present embodiment, the substrate stage 2 is capable of moving in six directions along the guide surface 9G, namely, the X axial, Y axial, Z axial, θX, θY, and θZ directions, by the operation of the drive system. Furthermore, the drive system that moves the substrate stage 2 does not have to comprise a planar motor. For example, the drive system may comprise a linear motor.

The substrate stage 2 comprises a substrate holding part 10, which releasably holds the substrate P. The substrate holding part 10 holds the substrate P such that the front surface thereof faces the +Z direction. In the present embodiment, the front surface of the substrate P held by the substrate holding part 10 and an upper surface 11 of the substrate stage 2 disposed around the substrate P are disposed within the same plane (i.e., they are flush with one another). The upper surface 11 is flat. In the present embodiment, the front surface of the substrate P, which is held by the substrate holding part 10, and the upper surface 11 of the substrate stage 2 are substantially parallel to the XY plane.

Furthermore, the upper surface 11 of the substrate stage 2 and the front surface of the substrate P held by the substrate holding part 10 do not have to be disposed within the same plane; furthermore, the front surface of the substrate P or the upper surface 11, or both, may be nonparallel to the XY plane. In addition, the upper surface 11 does not have to be flat. For example, the upper surface 11 may include a curved surface.

In addition, in the present embodiment, the substrate stage 2 comprises a cover member holding part 12, which releasably holds a cover member T, as disclosed in, for example, U.S. Patent Application Publication No. 2007/0177125 and U.S. Patent Application Publication No. 2008/0049209. In the present embodiment, the upper surface 11 of the substrate stage 2 includes an upper surface of the cover member T held by the cover member holding part 12.

Furthermore, the cover member T does not have to be releasable. In such a case, the cover member holding part 12 could be omitted. In addition, the upper surface 11 of the substrate stage 2 may include the front surface of any sensor, measuring member, or the like installed on the substrate stage 2.

In the present embodiment, an interferometer system 13, which comprises laser interferometer units 13A, 13B, measures the positions of the mask stage 1 and the substrate stage 2. The laser interferometer unit 13A is capable of measuring the position of the mask stage 1 using measurement mirrors, which are disposed on the mask stage 1. The laser interferometer unit 13B is capable of measuring the position of the substrate stage 2 using measurement mirrors, which are disposed on the substrate stage 2. When an exposing process or a prescribed measuring process is performed on the substrate P, the control apparatus 4 controls the positions of the mask stage 1 (i.e., the mask M) and the substrate stage 2 (i.e., the substrate P) based on the measurement results of the interferometer system 13.

The exposure apparatus EX of the present embodiment is a scanning type exposure apparatus (i.e., a so-called scanning stepper) that projects the image of the pattern of the mask M to the substrate P while synchronously moving the mask M and the substrate P in prescribed scanning directions. In the present embodiment, the scanning directions (i.e., the synchronous movement directions) of both the substrate P and the mask M are the Y axial directions. The control apparatus 4 radiates the exposure light EL to the substrate P through the projection optical system PL and the liquid LQ in the immersion space LS above the substrate P while moving the substrate P in the Y axial directions with respect to the projection area PR of the projection optical system PL and moving the mask M, synchronized to the movement of the substrate P, in the Y axial direction with respect to the illumination area IR of the illumination system IL.

The liquid immersion member 3 forms the immersion space LS such that the optical path K of the exposure light EL radiated to the projection area PR is filled with the liquid LQ. The liquid immersion member 3 forms the immersion space LS by holding the liquid LQ between itself and an object, which is disposed at a position to which the exposure light EL emerging from the emergent surface 7 of the last optical element 8 can be radiated, such that the optical path K of the exposure light EL between the last optical element 8 and the object is filled with the liquid LQ.

In the present embodiment, the position whereto the exposure light EL emerging from the emergent surface 7 can be radiated includes the projection area PR. In addition, the position whereto the exposure light EL that emerges from the emergent surface 7 can be radiated includes the position opposes the emergent surface 7. In the present embodiment, the object that is capable of being disposed at the position at which the object opposes the emergent surface 7, in other words, the object that is capable of being disposed in the projection area PR, may be either the substrate stage 2 or the substrate P, which is held by the substrate stage 2 (i.e., the substrate holding part 10), or both. In the exposure of the substrate P, the liquid immersion member 3 forms the immersion space LS by holding the liquid LQ between itself and the substrate P such that the optical path K of the exposure light EL radiated to the substrate P is filled with the liquid LQ.

In the present embodiment, the liquid immersion member 3 is disposed at least partly around the last optical element 8 and the optical path K of the exposure light EL wherethrough the liquid LQ between the last optical element 8 and the object disposed in the projection area PR passes. In the present embodiment, the liquid immersion member 3 is annular. In the present embodiment, part of the liquid immersion member 3 is disposed around the last optical element 8 and part of the liquid immersion member 3 is disposed around the optical path K of the exposure light EL between the last optical element 8 and the object. The immersion space LS is formed such that the optical path K of the exposure light EL between the last optical element 8 and the object disposed in the projection area PR is filled with the liquid LQ.

Furthermore, the liquid immersion member 3 does not have to be annular. For example, the liquid immersion member 3 may be disposed partly around the last optical element 8 and the optical path K. In addition, the liquid immersion member 3 does not have to be disposed at least partly around the last optical element 8. For example, the liquid immersion member 3 may be disposed at least partly around the optical path K between the emergent surface 7 and the object and not around the last optical element 8. In addition, the liquid immersion member 3 does not have to be disposed at least partly around the optical path K between the emergent surface 7 and the object. For example, the liquid immersion member 3 may be disposed at least partly around the last optical element 8 and not around the optical path K between the emergent surface 7 and the object.

The liquid immersion member 3 has a lower surface 14 that is capable of opposing the front surface (i.e., the upper surface) of the object disposed in the projection area PR. The lower surface 14 of the liquid immersion member 3 can hold the liquid LQ between itself and the front surface of the object. In the present embodiment, some of the liquid LQ in the immersion space LS is held between the last optical element 8 and the object disposed such that the object opposes the emergent surface 7 of the last optical element 8. In addition, some of the liquid LQ in the immersion space LS is held between the liquid immersion member 3 and the object disposed such that the object opposes the lower surface 14 of the liquid immersion member 3. Holding the liquid LQ between the emergent surface 7 and the lower surface 14 on one side and the front surface (i.e., the upper surface) of the object on the other side forms the immersion space LS such that the optical path K of the exposure light EL between the last optical element 8 and the object is filled with the liquid LQ.

In the present embodiment, when the substrate P is being irradiated with the exposure light EL, the immersion space LS is formed such that part of the area of the front surface of the substrate P that includes the projection area PR is covered with the liquid LQ. At least part of an interface LG (i.e., a meniscus or edge) of the liquid LQ is formed between the lower surface 14 of the liquid immersion member 3 and the front surface of the substrate P. Namely, the exposure apparatus EX of the present embodiment adopts a local liquid immersion system. The outer side of the immersion space LS (i.e., the outer side of the interface LG) is a gas space GS.

Figure 2:
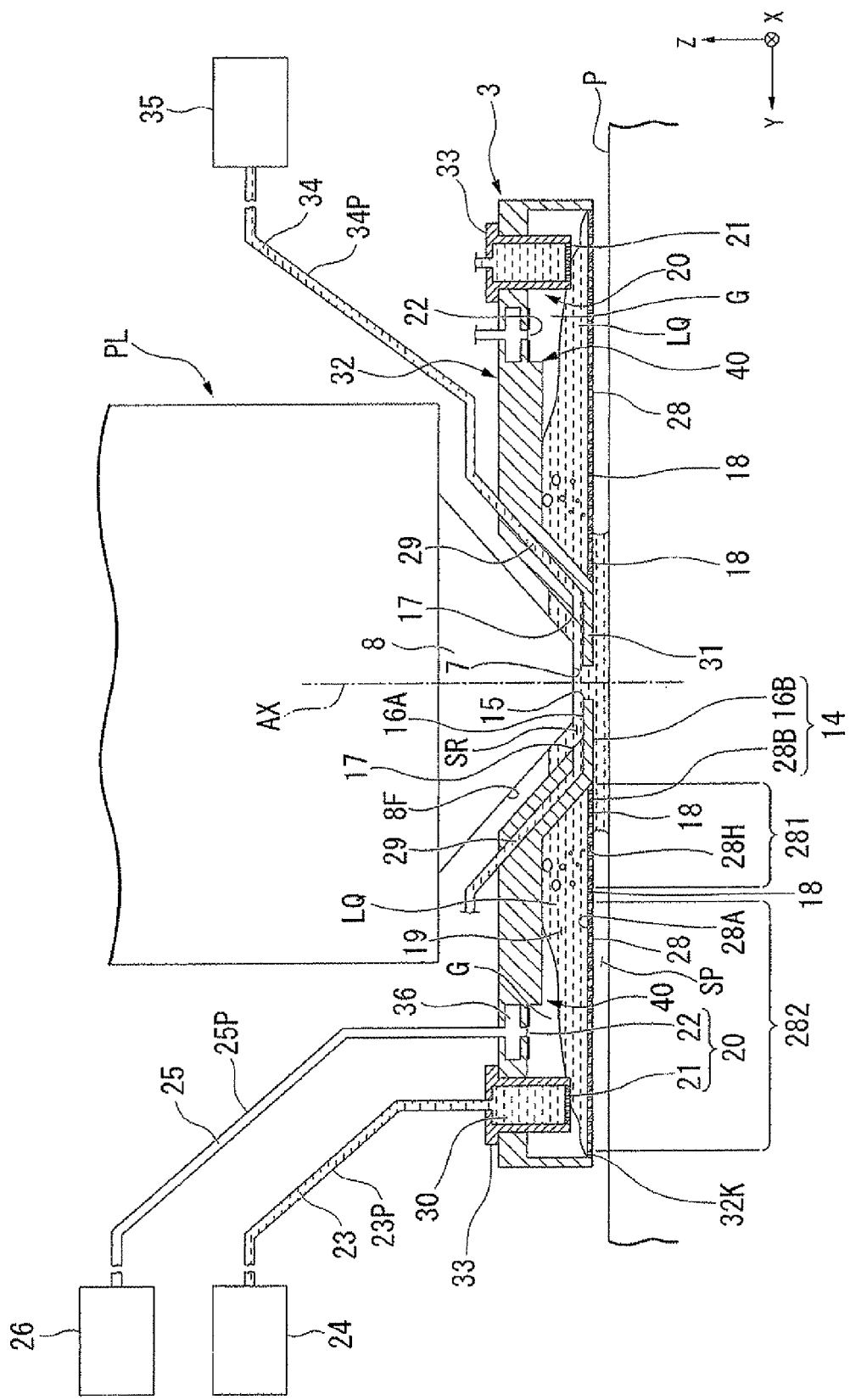
FIG. 2 is a side cross sectional view that shows one example of a liquid immersion member according to the first embodiment.
Figure 3:
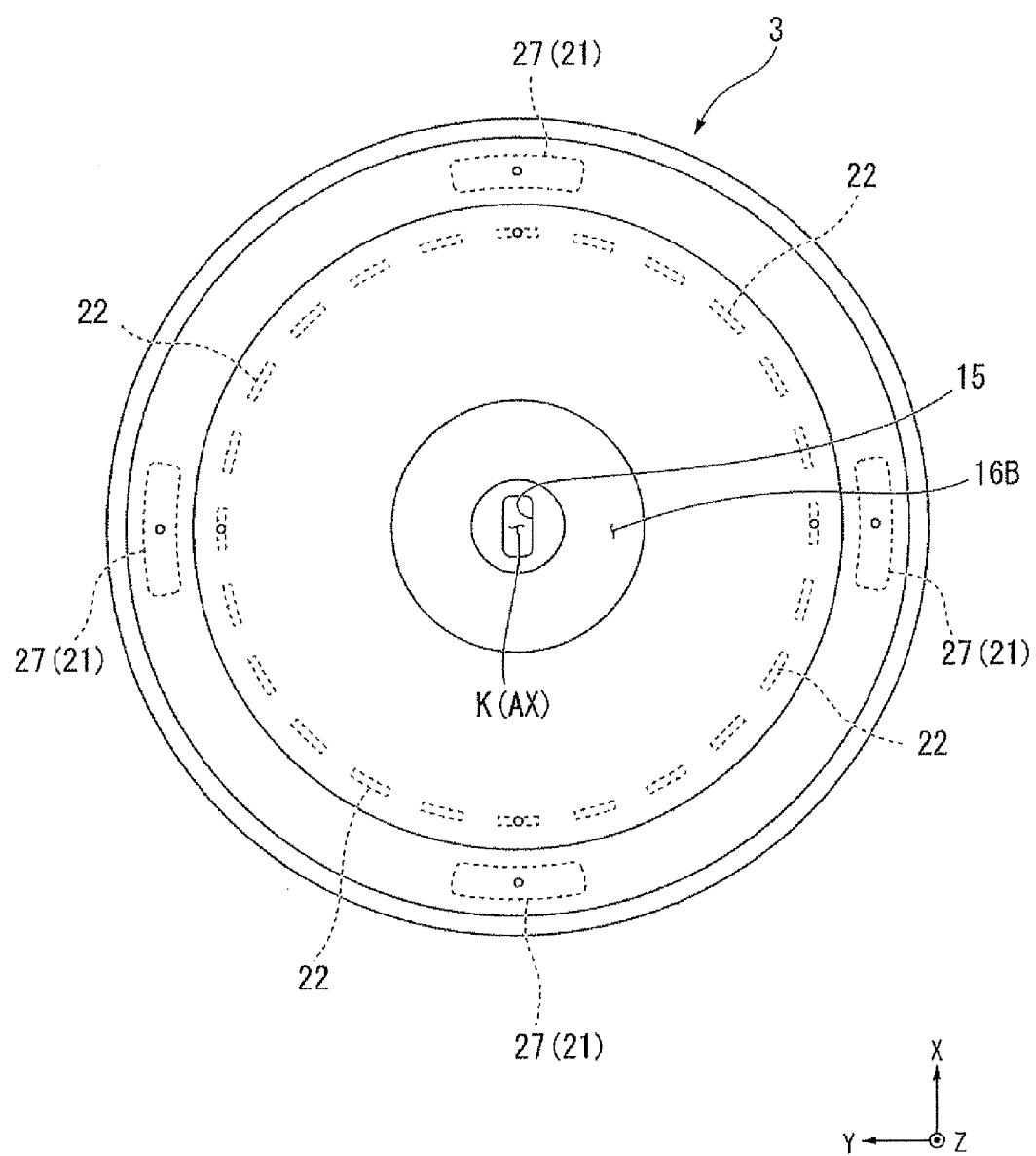
FIG. 3 shows the liquid immersion member according to the first embodiment, viewed from above.
Figure 4:
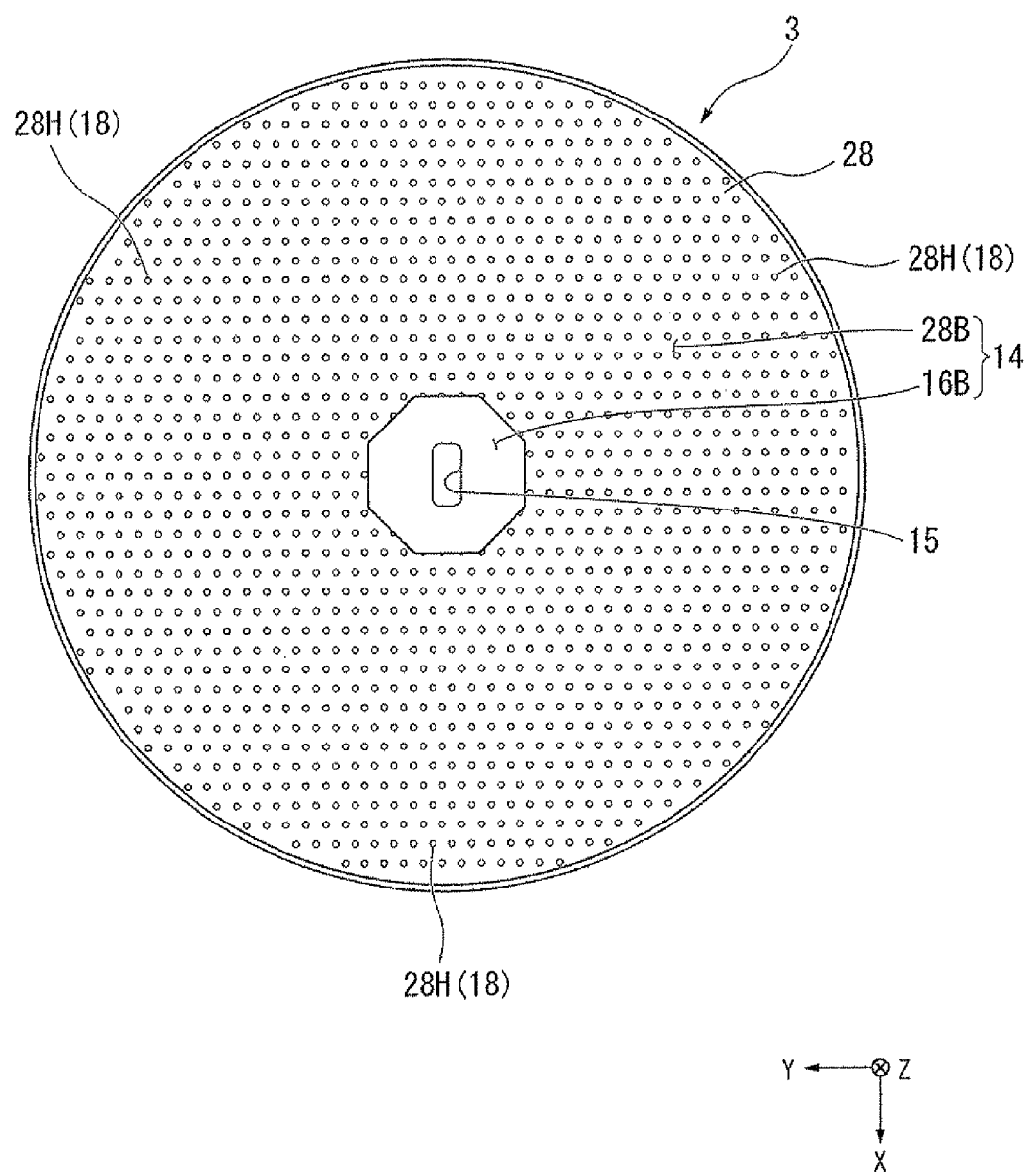
FIG. 4 shows the liquid immersion member according to the first embodiment, viewed from below.
Figure 5:
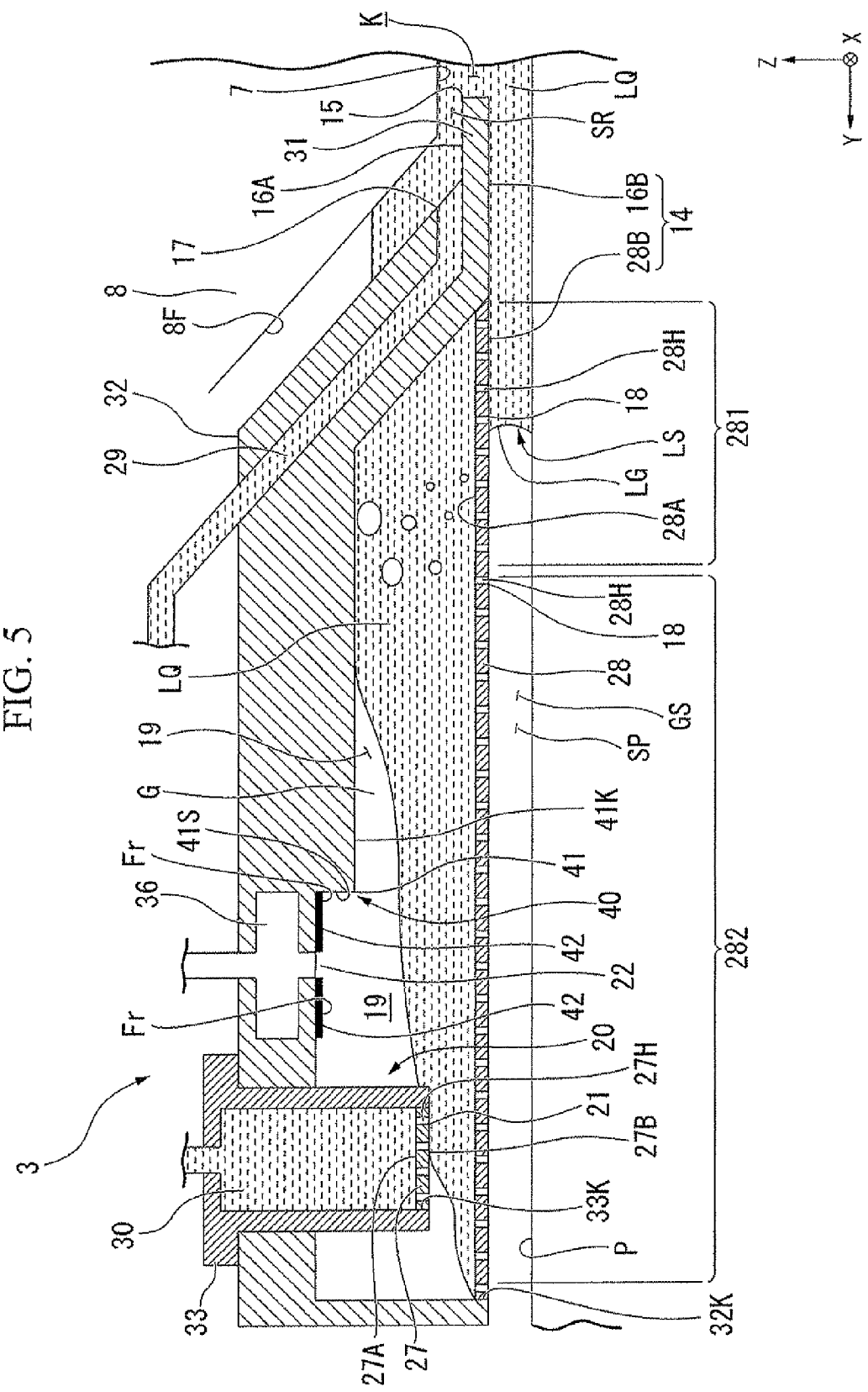
FIG. 5 is a partial side cross sectional view of the liquid immersion member according to the first embodiment.

FIG. 2 is a side cross sectional view that shows one example of the liquid immersion member 3 according to the present embodiment; FIG. 3 is a view that shows the liquid immersion member 3 from the upper side (i.e., the +Z side); FIG. 4 is a view that shows the liquid immersion member 3 from the lower side (i.e., the −Z side); and FIG. 5 is a partial enlarged view of FIG. 2. The text below explains an exemplary case, referencing FIG. 2 through FIG. 5, wherein the substrate P is disposed in the projection area PR, but, for example, the substrate stage 2 (i.e., the cover member T) can also be disposed in the projection area PR as discussed above.

In the present embodiment, the liquid immersion member 3 comprises a plate part 31, at least part of which is disposed such that the plate part 31 opposes the emergent surface 7, a main body part 32, at least part of which is disposed such that the main body part 32 opposes a side surface 8F of the last optical element 8, and a passageway forming member 33. In the present embodiment, the plate part 31 and the main body part 32 are one body. In the present embodiment, the passageway forming member 33 is different from the plate part 31 and the main body part 32. In the present embodiment, the passageway forming member 33 is supported by the main body part 32. Furthermore, the passageway forming member 33, the plate part 31, and the main body part 32 may be one body.

Furthermore, the side surface 8F is disposed around the emergent surface 7. In the present embodiment, the side surface 8F is inclined upward toward the outer side in radial directions with respect to the optical path K. Furthermore, the radial directions with respect to the optical path K include the radial directions with respect to the optical axis AX of the projection optical system PL as well as the directions perpendicular to the Z axis.

The liquid immersion member 3 has an opening 15, which is formed at a position at which the opening 15 faces the emergent surface 7. The exposure light EL that emerges from the emergent surface 7 can be radiated through the opening 15 to the substrate P. In the present embodiment, the plate part 31 has an upper surface 16A, which opposes at least part of the emergent surface 7, and a lower surface 16B, which is capable of opposing the front surface of the substrate P. The opening 15 is a hole that is formed such that the opening 15 connects the upper surface 16A and the lower surface 16B. The upper surface 16A is disposed around an upper end of the opening 15 and the lower surface 16B is disposed around a lower end of the opening 15.

In the present embodiment, the upper surface 16A is flat. The upper surface 16A is substantially parallel to the XY plane. Furthermore, at least part of the upper surface 16A may be tilted with respect to the XY plane and may include a curved surface. In the present embodiment, the lower surface 16B is flat. The lower surface 16B is substantially parallel to the XY plane. Furthermore, at least part of the lower surface 16B may be tilted with respect to the XY plane and may include a curved surface. The lower surface 16B holds the liquid LQ between itself and the front surface of the substrate P.

As shown in FIG. 4, in the present embodiment, the external shape of the lower surface 16B is octagonal. Furthermore, the external shape of the lower surface 16B may be an arbitrary polygonal shape such as, for example, a quadrilateral or a hexagon. In addition, the external shape of the lower surface 16B may be circular, elliptical, and the like.

The liquid immersion member 3 has: supply ports 17, which are capable of supplying the liquid LQ; recovery ports 18, which are capable of recovering the liquid LQ; a recovery passageway 19, wherethrough the liquid LQ recovered via the recovery ports 18 flows; and discharge parts 20, which separately discharge the liquid LQ and a gas G from the recovery passageway 19.

The supply ports 17 are capable of supplying the liquid LQ to the optical path K. In the present embodiment, the supply ports 17 supply the liquid LQ to the optical path K during at least part of the exposure of the substrate P. The supply ports 17 are disposed in the vicinity of the optical path K such that they face the optical path K. In the present embodiment, the supply ports 17 supply the liquid LQ to a space SR between the emergent surface 7 and the upper surface 16A. At least some of the liquid LQ supplied to the space SR via the supply ports 17 is supplied onto the substrate P via the opening 15 as well as to the optical path K. Furthermore, at least part of at least one of the supply ports 17 may face the side surface 8F.

The liquid immersion member 3 comprises supply passageways 29, which are connected to the supply ports 17. At least part of each of the supply passageways 29 is formed inside the liquid immersion member 3. In the present embodiment, each of the supply ports 17 includes an opening, which is formed at one end of the corresponding supply passageway 29. The other end of each of the supply passageways 29 is connected to a liquid supply apparatus 35 via a passageway 34 formed by a supply piping 34P.

The liquid supply apparatus 35 is capable of supplying the liquid LQ, which is clean and temperature adjusted. The liquid LQ that is supplied from the liquid supply apparatus 35 is supplied to the supply ports 17 via the passageway 34 and the supply passageways 29. The supply ports 17 supply the liquid LQ from the supply passageways 29 to the optical path K (i.e., the space SR).

The recovery ports 18 are capable of recovering at least some of the liquid LQ from the space above the substrate P (i.e., the object). The recovery ports 18 recover at least some of the liquid LQ from the space above the substrate P during the exposure of the substrate P. The recovery ports 18 face the −Z direction. The front surface of the substrate P faces the recovery ports 18 during at least part of the exposure of the substrate P.

In the present embodiment, the liquid immersion member 3 comprises a first member 28, which has the recovery ports 18. The first member 28 has: a first surface 28B; a second surface 28A, which faces a direction other than that faced by the first surface 28B; and a plurality of holes 28H, which connect the first surface 28B and the second surface 28A. In the present embodiment, the recovery ports 18 include the holes 28H of the first member 28. In the present embodiment, the first member 28 is a porous member that has the plurality of holes 28H (i.e., openings or pores). Furthermore, the first member 28 may be a mesh filter, which is a porous member wherein numerous small holes are formed as a mesh. Namely, a variety of members that have holes capable of recovering the liquid LQ can serve as the first member 28.

At least part of the recovery passageway 19 is formed inside the liquid immersion member 3. In the present embodiment, an opening 32K is formed in a lower end of the recovery passageway 19. The opening 32K is disposed at least partly around the lower surface 16B. The opening 32K is formed at the lower end of the main body part 32. The opening 32K faces downward (i.e., the −Z direction). In the present embodiment, the first member 28 is disposed in the opening 32K. The recovery passageway 19 includes a space between the main body part 32 and the first member 28.

The first member 28 is disposed at least partly around the optical path K (i.e., the lower surface 16B). In the present embodiment, the first member 28 is disposed around the optical path K. Furthermore, the annular first member 28 may be disposed around the optical path K (i.e., the lower surface 16B) or a plurality of the first members 28 may be disposed such that the first members 28 are distributed around the optical path K (i.e., the lower surface 16B).

In the present embodiment, the first member 28 is a plate shaped member. The first surface 28B is one surface of the first member 28 and the second surface 28A is the other surface of the first member 28. In the present embodiment, the first surface 28B faces a space SP, which is on the lower side (i.e., the −Z side) of the liquid immersion member 3. The space SP includes, for example, the space between the lower surface 14 of the liquid immersion member 3 and the front surface of the object (i.e., the substrate P and the like) that opposes the lower surface 14 of the liquid immersion member 3. If the immersion space LS is formed above the object (i.e., the substrate P and the like) opposing the lower surface 14 of the liquid immersion member 3, then the space SP includes the immersion space LS (i.e., a liquid space) and the gas space GS. In the present embodiment, the first member 28 is disposed in the opening 32K such that the first surface 28B faces the space SP and the second surface 28A faces the recovery passageway 19. In the present embodiment, the first surface 28B and the second surface 28A are substantially parallel. The first member 28 is disposed in the opening 32K such that the second surface 28A faces the +Z direction and the first surface 28B faces the opposite direction (i.e., the −Z direction) to that faced by the first surface 28A. In addition, in the present embodiment, the first member 28 is disposed in the opening 32K such that the first surface 28B and the second surface 28A are substantially parallel to the XY plane.

In the explanation below, the first surface 28B is called the lower surface 28B where appropriate, and the second surface 28A is called the upper surface 28A where appropriate.

Furthermore, the first member 28 does not have to be plate shaped. In addition, the lower surface 28B and the upper surface 28A may be nonparallel. In addition, at least part of the lower surface 28B may be tilted with respect to the XY plane and may include a curved surface. In addition, at least part of the upper surface 28A may be tilted with respect to the XY plane and may include a curved surface.

The holes 28H are formed such that they connect the lower surface 28B and the upper surface 28A. The fluid (i.e., the fluid containing the gas G or the liquid LQ, or both) is capable of passing through the holes 28H of the first member 28. In the present embodiment, the recovery ports 18 include the openings at the lower ends of the holes 28H on the lower surface 28B side. The lower surface 28B is disposed around the lower ends of the holes 28H, and the upper surface 28A is disposed around the upper ends of the holes 28H.

The recovery passageway 19 is connected to the holes 28H (i.e., the recovery ports 18) of the first member 28. The first member 28 recovers at least some of the liquid LQ from the space above the substrate P (i.e., the object) opposing the lower surface 28B via the holes 28H (i.e., the recovery ports 18). The liquid LQ recovered via the holes 28H of the first member 28 flows through the recovery passageway 19.

In the present embodiment, the lower surface 14 of the liquid immersion member 3 includes the lower surface 16B and the lower surface 28B. In the present embodiment, the lower surface 28B is disposed at least partly around the lower surface 16B. In the present embodiment, the annular lower surface 28B is disposed around the lower surface 16B. Furthermore, a plurality of the lower surfaces 28B may be disposed such that the lower surfaces 28B are distributed around the lower surface 16B (i.e., the optical path K).

In the present embodiment, the first member 28 comprises a first portion 281 and a second portion 282. In the present embodiment, the second portion 282 is disposed on the outer side of the first portion 281 in radial directions with respect to the optical path K. In the present embodiment, the second portion 282 hinders the flow of the gas G from the space SP into the recovery passageway 19 via the holes 28H more than the first portion 281 does. In the present embodiment, the width of the first portion 281 is smaller than the width of the second portion 282 in the radial directions with respect to the optical path K.

In the present embodiment, the inflow resistance of the gas G from the space SP into the recovery passageway 19 via the holes 28H is greater at the second portion 282 than at the first portion 281.

The first portion 281 and the second portion 282 each have a plurality of the holes 28H. For example, in the state wherein the immersion space LS is being formed in the space SP, some of the holes 28H among the plurality of the holes 28H of the first portion 281 might contact the liquid LQ in the immersion space LS and some might not. In addition, some of the holes 28H among the plurality of the holes 28H of the second portion 282 might contact the liquid LQ in the immersion space LS and some might not.

In the present embodiment, the first portion 281 is capable of recovering the liquid LQ to the recovery passageway 19 via the holes 28H that contact the liquid LQ in the space SP (i.e., the liquid LQ in the space above the substrate P). In addition, the first portion 281 suctions the gas G into the recovery passageway 19 via the holes 28H that do not contact the liquid LQ.

Namely, the first portion 281 is capable of recovering the liquid LQ in the immersion space LS to the recovery passageway 19 via the holes 28H that face the immersion space LS, and the first portion 281 suctions the gas G into the recovery passageway 19 via the holes 28H that face the gas space GS on the outer side of the immersion space LS.

In other words, the first portion 281 is capable of recovering the liquid LQ in the immersion space LS to the recovery passageway 19 via the holes 28H that face the immersion space LS, and the first portion 281 suctions the gas G into the recovery passageway 19 via the holes 28H that do not face the immersion space LS.

Namely, if the interface LG of the liquid LQ in the immersion space LS is present between the first portion 281 and the substrate P, then the first portion 281 recovers to the recovery passageway 19 the liquid LQ together with the gas G. Furthermore, at the interface LG, both the liquid LQ and the gas G may be suctioned via the holes 28H that face both the immersion space LS and the gas space GS.

The second portion 282 is capable of recovering the liquid LQ to the recovery passageway 19 via the holes 28H that contact the liquid LQ in the space SP (i.e., the liquid LQ in the space above the substrate P). In addition, the second portion 282 hinders the flow of the gas G into the recovery passageway 19 via the holes 28H that do not contact the liquid LQ.

Namely, the second portion 282 is capable of recovering the liquid LQ in the immersion space LS to the recovery passageway 19 via the holes 28H that face the immersion space LS, and the second portion 282 hinders the flow of the gas G into the recovery passageway 19 via the holes 28H that face the gas space GS, which is disposed on the outer side of the immersion space LS.

In the present embodiment, the second portion 282 recovers substantially only the liquid LQ, and not the gas G, to the recovery passageway 19.

Figure 6:
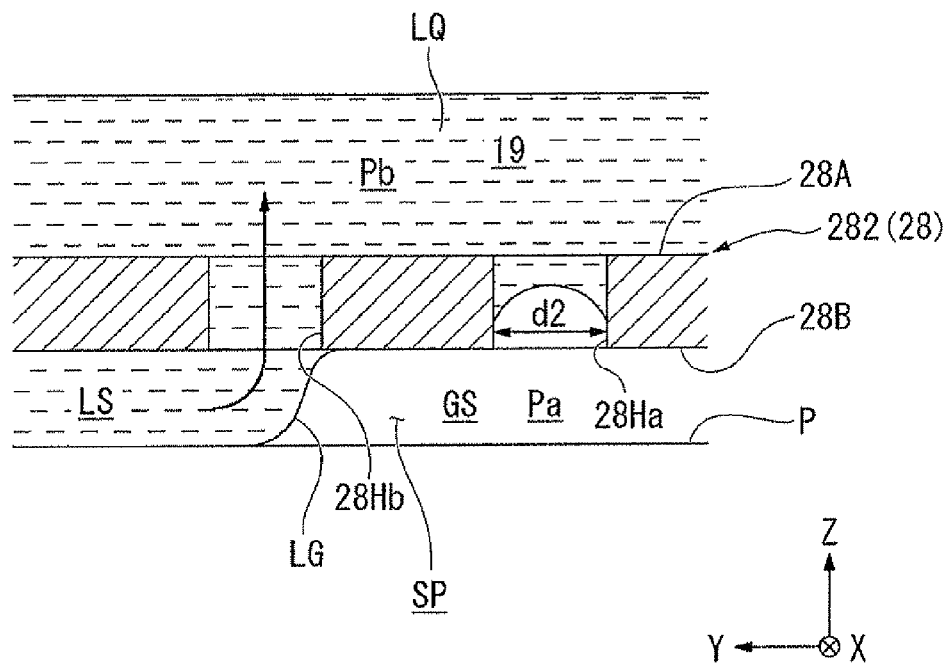
FIG. 6 is a schematic drawing that shows one example of a state wherein a second portion according to the first embodiment recovers a fluid.

FIG. 6 is a partial enlarged cross sectional view of the second portion 282 of the first member 28 and serves as a schematic drawing for explaining one example of the state wherein the second portion 282 is recovering only the liquid LQ.

In FIG. 6, there is a difference between a pressure Pa in the space SP (i.e., the gas space GS) and a pressure Pb in the recovery passageway 19. In the present embodiment, the pressure Pb in the recovery passageway 19 is lower than the pressure Pa in the space SP. When the liquid LQ is being recovered from the space above the substrate P (i.e., the object) via the first member 28, the liquid LQ is recovered from the space above the substrate P to the recovery passageway 19 via a hole 28Hb of the second portion 282, and the flow of the gas G into the recovery passageway 19 via a hole 28Ha of the second portion 282 is hindered.

In FIG. 6, the immersion space LS (i.e., the liquid space) and the gas space GS are formed in the space SP between the lower surface 28B of the second portion 282 and the front surface of the substrate P. In FIG. 6, the space that the lower end of the hole 28Ha of the second portion 282 faces is the gas space GS, and the space that the lower end of the hole 28Hb of the second portion 282 faces is the immersion space LS (i.e., the liquid space). In addition, in FIG. 6, the liquid LQ in the recovery passageway 19 (i.e., a liquid space) is present on the upper side of the second portion 282.

In the present embodiment, the liquid LQ is recovered from the space above the substrate P to the recovery passageway 19 via the hole 28Hb of the second portion 282, which contacts the liquid LQ, and the flow of the gas G into the recovery passageway 19 via the hole 28Ha of the second portion 282, which does not contact the liquid LQ, is hindered.

In FIG. 6, the condition below is satisfied.

$$(4 \times \gamma \times \cos \theta 2)/d2 \geq (Pb - Pa) \tag{1}$$

Therein, Pa is the pressure in the gas space GS that the lower end of the hole 28Ha faces (i.e., the pressure on the lower surface 28B side), Pb is the pressure in the recovery passageway 19 (i.e., the liquid space) on the upper side of the first member 28 (i.e., the pressure on the upper surface 28A side), d2 is the dimension (i.e., the pore size or the diameter) of each of the holes 28Ha, 28Hb, θ2 is the contact angle of the liquid LQ with respect to the surface (i.e., the inner surface) of each of the holes 28H of the second portion 282, and γ is the surface tension of the liquid LQ. Furthermore, to simplify the explanation, the condition expressed in the abovementioned equation (1) does not take the hydrostatic pressure of the liquid LQ on the upper side of the first member 28 into consideration.

Furthermore, in the present embodiment, the dimension d2 of each of the holes 28H of the second portion 282 indicates the minimum value thereof of all of the holes 28H between the upper surface 28A and the lower surface 28B. Furthermore, the dimension d2 does not have to be the minimum dimension of all of the holes 28H between the upper surface 28A and the lower surface 28B, and may be, for example, the average value or the maximum value thereof.

In such a case, the contact angle θ2 of the liquid LQ with respect to the surface of each of the holes 28H of the second portion 282 satisfies the condition below.

$$\theta 2 < 90° \qquad (2)$$

If the above condition holds, then, even if the gas space GS is formed on the lower side (i.e., on the space SP side) of the hole 28Ha of the first member 28, the gas G in the gas space GS on the lower side of the first member 28 is hindered from moving to (i.e., flowing into) the recovery passageway 19 (i.e., the liquid space) on the upper side of the first member 28 via the hole 28Ha. Namely, if the dimension d2 (i.e., the pore size or diameter) of the holes 28H of the second portion 282, the contact angle θ2 (i.e., the affinity) of the liquid LQ with respect to the surface of each of the holes 28H of the second portion 282, the surface tension γ of the liquid LQ, and the pressures Pa, Pb satisfy the above condition, then the interface between the liquid LQ and the gas G is kept on the inner side of the hole 28Ha and the gas G is hindered from flowing from the space SP into the recovery passageway 19 via the hole 28Ha of the second portion 282. Moreover, because the immersion space LS (i.e., the liquid space) is formed on the lower side (i.e., on the space SP side) of the hole 28Hb, only the liquid LQ is recovered via the hole 28Hb.

In the present embodiment, the above condition is satisfied for all of the holes 28H of the second portion 282 and substantially only the liquid LQ are recovered via the holes 28H of the second portion 282.

In the explanation below, the state wherein only the liquid LQ is recovered via the holes of the porous member (e.g., the holes 28H of the first member 28) is called a liquid selective recovery state where appropriate, and the condition wherein only the liquid LQ is recovered via the holes of the porous member is called a liquid selective recovery condition where appropriate.

Figure 7:
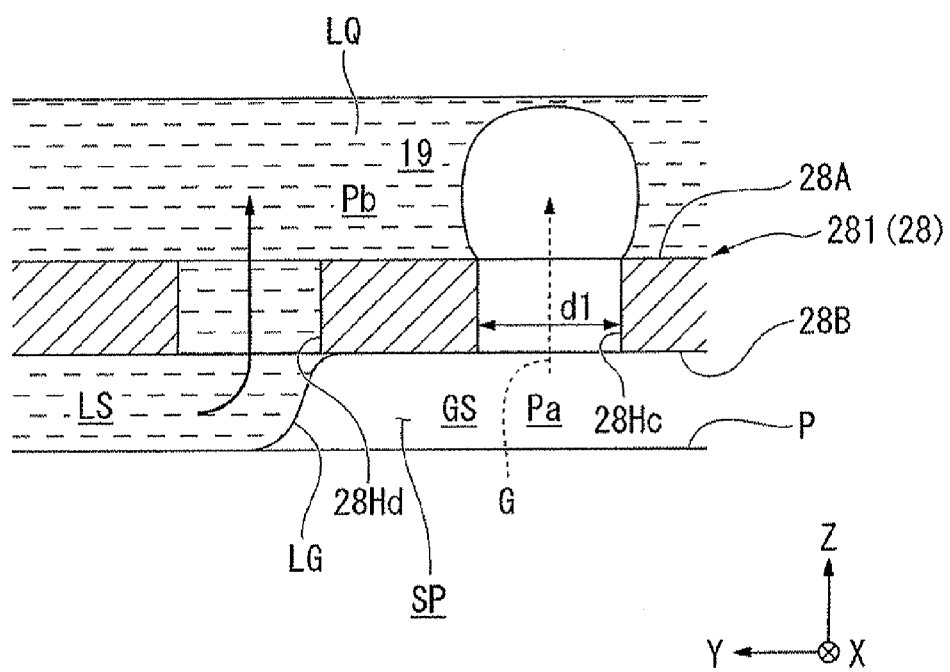
FIG. 7 is a schematic drawing that shows one example of a state wherein a first portion according to the first embodiment recovers the fluid.

FIG. 7 is a partial enlarged cross sectional view of the first portion 281 of the first member 28 and serves as a schematic drawing for explaining one example of the state wherein the first portion 281 is recovering the liquid LQ and the gas G.

In FIG. 7, there is a difference between the pressure Pa in the space SP (i.e., the gas space GS) and the pressure Pb in the recovery passageway 19. In the present embodiment, when the pressure Pb in the recovery passageway 19 is lower than the pressure Pa in the space SP and when the liquid LQ is being recovered from the space above the substrate P (i.e., the object) via the first member 28, the gas G is suctioned into the recovery passageway 19 via a hole 28Hc of the first portion 281.

In FIG. 7, the immersion space LS (i.e., the liquid space) and the gas space GS are formed in the space SP. In FIG. 7, the space that the lower end of the hole 28Hc of the first portion 281 faces is the gas space GS, and the space that the lower end of a hole 28Hd of the first portion 281 faces is the immersion space LS (i.e., the liquid space). In addition, in FIG. 7, the liquid LQ in the recovery passageway 19 (i.e., the liquid space) is present on the upper side of the first portion 281.

In the present embodiment, the liquid LQ is recovered from the space above the substrate P to the recovery passageway 19 via the hole 28Hd of the first portion 281, which contacts the liquid LQ, and the gas G is suctioned into the recovery passageway 19 via the hole 28Hc of the first portion 281, which does not contact the liquid LQ.

In the present embodiment, the dimension (i.e., the pore size or the diameter) of each of the holes 28H or a contact angle θ1 of the liquid LQ with respect to the surface (i.e., the inner surface) of each of the holes 28H, or both, is different at the first portion 281 than it is at the second portion 282. Owing to the difference between the pressure Pa in the space SP (i.e., the gas space GS) and the pressure Pb in the recovery passageway 19, the liquid LQ is recovered from the space above the substrate P to the recovery passageway 19 via the hole 28Hd of the first portion 281, which contacts the liquid LQ, and the gas G is suctioned into the recovery passageway 19 via the hole 28Hc of the first portion 281, which does not contact the liquid LQ.

Furthermore, in the present embodiment, a dimension d1 of each of the holes 28H of the first portion 281 indicates the minimum value thereof of all of the holes 28H between the upper surface 28A and the lower surface 28B. Furthermore, the dimension d1 does not have to be the minimum dimension of all of the holes 28H between the upper surface 28A and the lower surface 28B, and may be, for example, the average value or the maximum value thereof.

In the present embodiment, the surface of each of the holes 28H of the second portion 282 is more lyophilic with respect to the liquid LQ than the surface of each of the holes 28H of the first portion 281 is. Namely, the contact angle θ2 of the liquid LQ with respect to the surface (i.e., the inner surface) of each of the holes 28H of the second portion 282 is smaller than the contact angle θ1 of the liquid LQ with respect to the surface (i.e., the inner surface) of each of the holes 28H of the first portion 281. Thereby, the first portion 281 recovers the liquid LQ together with the gas C and the second portion 282 recovers the liquid LQ while hindering the flow of the gas G into the recovery passageway 19.

In the present embodiment, the contact angle θ2 of the liquid LQ with respect to the surface of each of the holes 28H of the second portion 282 is less than 90°. For example, the contact angle θ2 of the liquid LQ with respect to the surface of each of the holes 28H of the second portion 282 may be less than 50°, less than 40°, less than 30°, or less than 20°.

Furthermore, the dimension d1 of each of the holes 28H of the first portion 281 may be different from the dimension d2 of each of the holes 28H of the second portion 282. For example, by making the dimension d2 of each of the holes 28H of the second portion 282 smaller than the dimension d1 of each of the holes 28H of the first portion 281, the first portion 281 recovers the liquid LQ together with the gas G, and the second portion 282 recovers the liquid LQ while hindering the flow of the gas G into the recovery passageway 19.

Figure 8A:
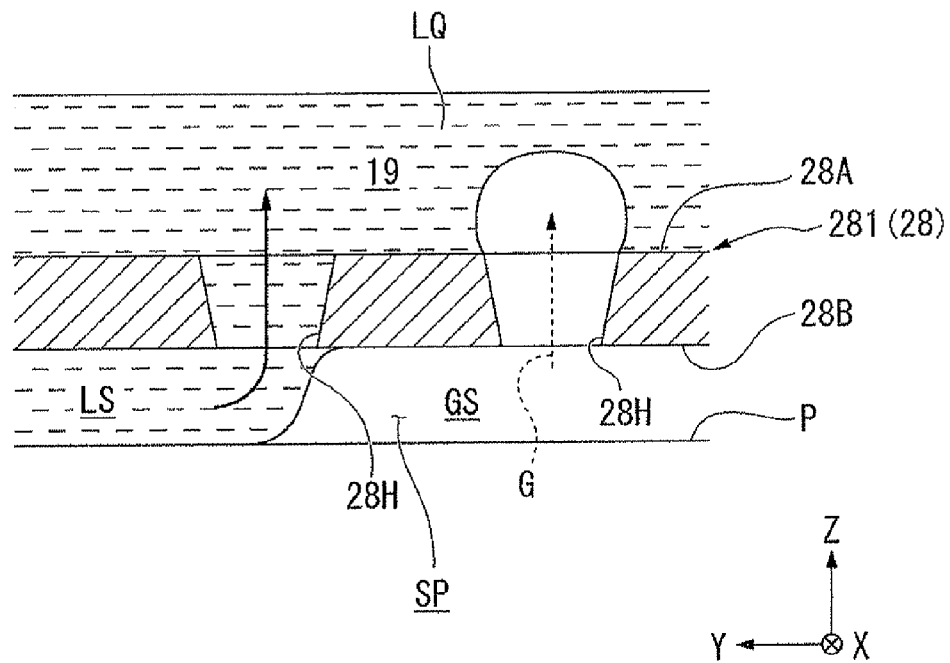
FIG. 8A is a schematic drawing that show one example of a state wherein the first portion according to the first embodiment recovers the fluid.
Figure 8B:
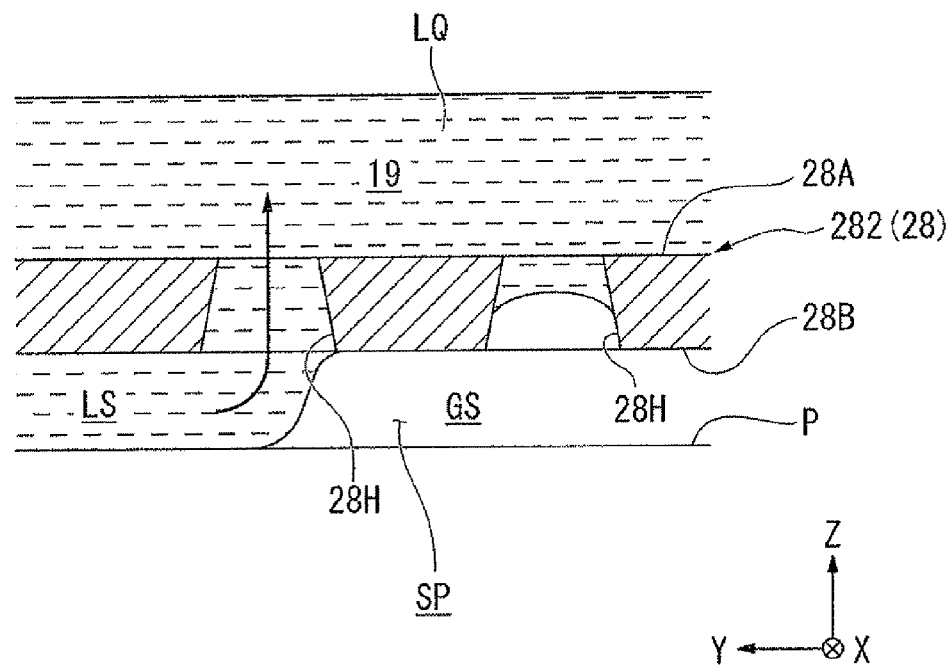
FIG. 8B is a schematic drawing that shows one example of a state wherein the second portion according to the first embodiment recovers the fluid.

In addition, as shown in, for example, FIG. 8A and FIG. 8B, the cross sectional shape of the holes 28H of the first portion 281 within the YZ plane may be different from that of the holes 28H of the second portion 282. For example, the inclination angle of the inner surface of each of the holes 28H of the first portion 281 and the inclination angle of the inner surface of each of the holes 28H of the second portion 282 may be different such that the contact angle of the liquid LQ with respect to the inner surface of each of the holes 28H of the second portion 282 is substantially larger than the contact angle of the liquid LQ with respect to the inner surface of each of the holes 28H of the first portion 281. Furthermore, the inclination angle of each of the holes 28H indicates the inclination angle along the Z axis. Furthermore, conceptually, the inclination angle of each of the holes 28H may be the tilt angle with respect to the XY plane, which is substantially parallel to the front surface of the substrate P (i.e., the object).

FIG. 8A is a schematic drawing that shows one example of the holes 28H of the first portion 281, and FIG. 8B is a schematic drawing that shows one example of the holes 28H of the second portion 282. As shown in FIG. 8A and FIG. 8B, for example, each of the holes 28H of the first portion 281 may be formed such that it widens proceeding from the lower surface 28B to the upper surface 28A, and each of the holes 28H of the second portion 282 may be formed such that it widens proceeding from the upper surface 28A to the lower surface 28B. The contact angle of the liquid LQ with respect to the inner surface of each of the holes 28H substantially varies with the inclination angle of the inner surface of each of the holes 28H. Accordingly, the inclination angle of the inner surface of each of the holes 28H may be determined such that the flow of the gas G from the space SP into the recovery passageway 19 via the holes 28H of the second portion 282 is hindered more than the flow of the gas G from the space SP into the recovery passageway 19 via the holes 28H of the first portion 281. In the example shown in FIG. 8A and FIG. 8B, the first portion 281 recovers the liquid LQ together with the gas G, and the second portion 282 recovers the liquid LQ while hindering the flow of the gas G into the recovery passageway 19.

In addition, in the present embodiment, the liquid recovery capacity per unit of area of the lower surface 28B may be higher at the first portion 281 than at the second portion 282. In this case, the amount of the liquid LQ that flows from the space SP to the recovery passageway 19 via the holes 28H of the first portion 281 may be greater than the amount of the liquid LQ that flows from the space SP to the recovery passageway 19 via the holes 28H of the second portion 282.

The text below explains the discharge parts 20, referencing FIG. 2 through FIG. 5. Each of the discharge parts 20 has first discharge ports 21, which face the recovery passageway 19 and are for discharging the liquid LQ from the recovery passageway 19, and a second discharge port 22, which faces the recovery passageway 19 and is for discharging the gas G from the recovery passageway 19.

In the present embodiment, the first discharge ports 21 are disposed above (i.e., in the +Z direction of) the recovery ports 18 such that the first discharge ports 21 face the recovery passageway 19. The second discharge ports 22 are disposed above (i.e., in the +Z direction of) the recovery ports 18 such that the second discharge ports 22 face the recovery passageway 19.

In the present embodiment, the first discharge ports 21 or the second discharge ports 22, or both, face downward (i.e., in the −Z direction). In the present embodiment, the first discharge ports 21 and the second discharge ports 22 each face downward.

In the present embodiment, the first discharge ports 21 are disposed on the outer side of the second discharge ports 22 in radial directions with respect to the optical path K. Namely, in the present embodiment, the first discharge ports 21 are farther from the optical path K than the second discharge ports 22 are.

In the present embodiment, at least part of at least one of the first discharge ports 21 opposes the upper surface 28A of the second portion 282 of the first member 28. In the present embodiment, all of each of the first discharge ports 21 opposes the upper surface 28A of the second portion 282. The first discharge ports 21, which oppose the first member 28, oppose the recovery ports 18.

In the present embodiment, at least part of at least one of the second discharge ports 22 opposes the upper surface 28A of the second portion 282 of the first member 28. In the present embodiment, all of the second discharge ports 22 oppose the upper surface 28A of the second portion 282. The second discharge ports 22, which oppose the first member 28, oppose the recovery ports 18.

In the present embodiment, the first discharge ports 21 are disposed below the second discharge ports 22.

In addition, in the present embodiment, the second discharge ports 22 are disposed more spaced apart from the upper surface 28A of the first member 28 than the first discharge ports 21 are.

In addition, in the present embodiment, at least part of the second portion 282 is disposed on the outer side of the first discharge ports 21 and the second discharge ports 22 in the radial directions with respect to the optical path K. Namely, in the present embodiment, at least part of the second portion 282 is farther from the optical path K than the first discharge ports 21 and the second discharge ports 22 are. In the example shown in FIG. 5, an outer edge of the second portion 282 is disposed on the outer side of the first discharge ports 21 and the second discharge ports 22 in the radial directions with respect to the optical path K.

In addition, in the present embodiment, at least part of the first portion 281 of the first member 28 is disposed on the inner side of the first discharge ports 21 and the second discharge ports 22 in the radial directions with respect to the optical path K. Namely, in the present embodiment, at least part of the first portion 281 is closer to the optical path K than the first discharge ports 21 and the second discharge ports 22 are. In the example shown in FIG. 5, substantially the entire first portion 281 is disposed on the inner side of the first discharge ports 21 and the second discharge ports 22 in the radial directions with respect to the optical path K.

As discussed above, the first member 28 (i.e., the first portion 281) recovers the liquid LQ together with the gas G from the space SP to the recovery passageway 19. The liquid LQ and the gas G in the space SP between the substrate P and the first member 28, flows to the recovery passageway 19 via the first member 28. As shown in FIG. 2 and FIG. 5, a gas space and a liquid space are formed in the recovery passageway 19. The first discharge ports 21 discharge the liquid LQ from the recovery passageway 19, and the second discharge ports 22 discharge the gas G from the recovery passageway 19.

In the present embodiment, the first discharge ports 21 hinder the inflow of the gas G more than the second discharge ports 22 do. The second discharge ports 22 hinder the inflow of the liquid LQ more than the first discharge ports 21 do. In the present embodiment, the percentage of the liquid LQ in the fluid discharged via the first discharge ports 21 is greater than the percentage of the liquid LQ in the fluid discharged via the second discharge ports 22. In the present embodiment, the percentage of the gas G in the fluid discharged via the first discharge ports 21 is less than the percentage of the gas G in the fluid discharged via the second discharge ports 22.

In the present embodiment, the first discharge ports 21 discharge substantially only the liquid LQ from the recovery passageway 19. The second discharge ports 22 discharge substantially only the gas G from the recovery passageway 19.

In the present embodiment, the liquid immersion member 3 comprises second members 27, which have the first discharge ports 21. Each of the second members 27 has: a third surface 27B, which faces the recovery passageway 19; a fourth surface 27A, which faces a direction other than that faced by the third surface 27B; and multiple holes 27H, which connect the third surface 27B and the fourth surface 27A. In the present embodiment, the first discharge ports 21 include the holes 27H of the second members 27. In the present embodiment, each of the second members 27 is a porous member that has the multiple holes 27H. Furthermore, each of the second members 27 may be a mesh filter, which is a porous member wherein numerous small holes are formed as a mesh. Namely, a variety of members that have holes capable of hindering the inflow of the gas G can serve as each of the second members 27.

In the present embodiment, openings 33K are formed at the lower end of the passageway forming member 33. The openings 33K face downward (i.e., in the −Z direction). In the present embodiment, the second members 27 are disposed in the openings 33K.

In the present embodiment, the second members 27 are plate shaped members. Each of the third surfaces 27B is one surface of the corresponding second member 27, and each of the fourth surfaces 27A is the other surface of the corresponding second member 27. In the present embodiment, the second members 27 are disposed in the openings 33K such that the third surfaces 27B face the recovery passageway 19 and the fourth surfaces 27A face passageways 30 of the passageway forming member 33. In the present embodiment, the third surfaces 27B and the fourth surfaces 27A are substantially parallel. The second members 27 are disposed in the openings 33K such that the fourth surfaces 27A face the +Z direction and the third surfaces 27B face the opposite direction (i.e., the −Z direction) to that faced by the fourth surfaces 27A. In addition, in the present embodiment, the second members 27 are disposed in the openings 33K such that the third surfaces 27B and the fourth surfaces 27A are substantially parallel to the XY plane.

In the explanation below, the third surfaces 27B are called the lower surfaces 27B where appropriate, and the fourth surfaces 27A are called the upper surfaces 27A where appropriate.

Furthermore, the second members 27 do not have to be plate shaped members. In addition, the lower surfaces 27B and the upper surfaces 27A may be nonparallel. In addition, at least part of each of the lower surfaces 27B may be tilted with respect to the XY plane and may include a curved surface. In addition, at least part of each of the upper surfaces 27A may be tilted with respect to the XY plane and may include a curved surface.

The holes 27H are disposed such that they connect each of the lower surfaces 27B to the corresponding upper surface 27A. The fluid (i.e., the fluid containing the liquid LQ or the gas G, or both) can flow through the holes 27H of the second members 27. In the present embodiment, each of the first discharge ports 21 is disposed at the lower ends of the holes 27H on the corresponding lower surface 27B side. In other words, the first discharge ports 21 are the openings at the lower ends of the holes 27H. Each of the lower surfaces 27B is disposed around the lower ends of the corresponding holes 27H, and each of the upper surfaces 27A is disposed around the upper ends of the corresponding holes 27H.

Each of the passageways 30 are connected to the holes 27H (i.e., the first discharge ports 21) of the corresponding second member 27. The second members 27 discharge at least some of the liquid LQ from the recovery passageway 19 via the holes 27H (i.e., the first discharge ports 21). The liquid LQ discharged via the holes 2714 of the second members 27 flows through the passageways 30.

In the present embodiment, the pressure differential between the recovery passageway 19 that the lower surfaces 27B face and the passageways 30 (i.e., the spaces) that the upper surfaces 27A face is adjusted such that the discharge of the gas G via the first discharge ports 21 is hindered.

In the present embodiment, the second members 27 discharge substantially only the liquid LQ, and not the gas G, to the passageways 30.

Figure 44:
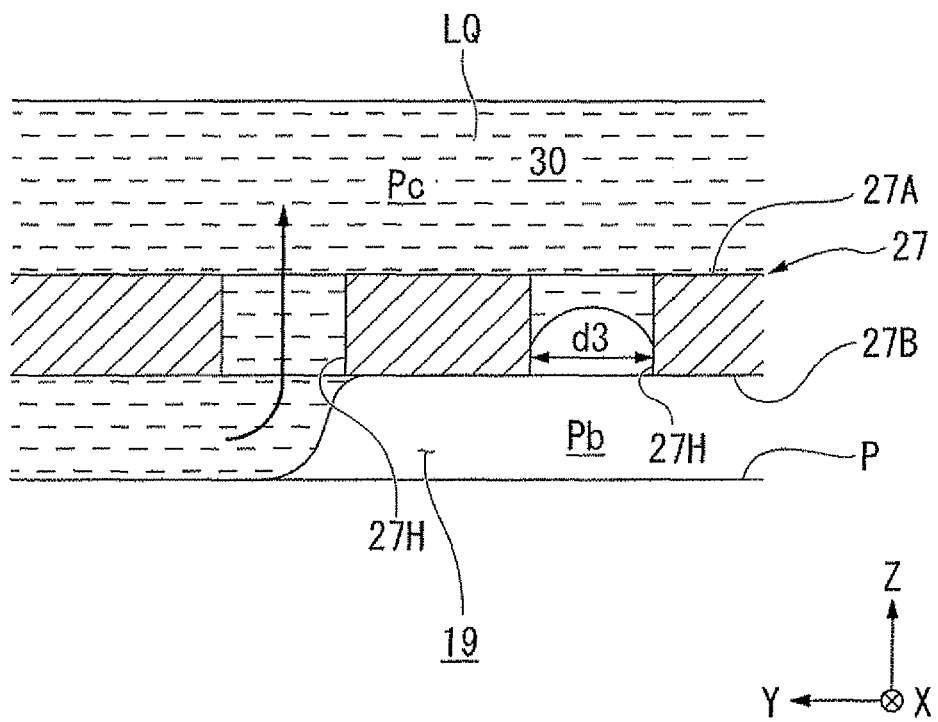
FIG. 44 is a schematic drawing that shows one example of a state wherein a first discharge port according to the first embodiment discharges a liquid.

In the present embodiment, the recovery condition (i.e., the discharge condition) of the liquid LQ via the holes 27H of the second members 27 satisfies the liquid selective recovery condition, as explained referencing FIG. 6 and the like. Namely, as shown in FIG. 44, by making a dimension d3 (i.e., a pore size or diameter) of each of the holes 27H of the second members 27, a contact angle $\theta 3$ (i.e., an affinity) of the liquid LQ with respect to the surface of each of the holes 27H of the second members 27, the surface tension $\gamma$ of the liquid LQ, the pressure Pb in the recovery passageway 19 that the lower surfaces 27B face, and a pressure Pc in the passageways 30 that the upper surfaces 27A face satisfy the liquid selective recovery condition, the interface between the liquid LQ and the gas G is kept on the inner side of the holes 27H, and the gas G is hindered from flowing from the recovery passageway 19 into the passageways 30 via the holes 27H of the second members 27. Thereby, the second members 27 (i.e., the first discharge ports 21) can discharge substantially only the liquid LQ.

In the present embodiment, the difference between the pressure Pb in the recovery passageway 19 and the pressure Pc in the passageways 30 is adjusted such that the recovery condition (i.e., the discharge condition) of the liquid LQ via the holes 27H of the second members 27 is the liquid selective recovery condition. The pressure Pc is lower than the pressure Pb. Namely, the difference between the pressure Pb in the recovery passageway 19 and the pressure Pc in the passageways 30 is prescribed such that the liquid LQ in the recovery passageway 19 is discharged to the passageways 30 via the holes 27H of the second members 27 and the gas G is hindered from flowing into the passageways 30 via the holes 27H of the second members 27. By adjusting the pressure Pb or the pressure Pc, or both, the second members 27 discharge substantially only the liquid LQ, and not the gas U, to the passageways 30 via the holes 27H.

In the present embodiment, at least part of the surface of each of the second members 27 is lyophilic with respect to the liquid LQ. In the present embodiment, at least the surfaces the inner surfaces) of the holes 27H of the second members 27 are lyophilic with respect to the liquid LQ. In the present embodiment, the contact angle of the liquid LQ with respect to the surface of each of the holes 27H is 90° or less. Furthermore, the contact angle of the liquid LQ with respect to the surface of each of the holes 27H may be less than 50', less than 40°, less than 30°, or less than 20°.

In the present embodiment, the liquid immersion member 3 comprises a hindering part 40, which is disposed in the recovery passageway 19 and hinders the liquid LQ in the recovery passageway 19 from contacting the second discharge ports 22. The hindering part 40 is provided in the recovery passageway 19 such that the second discharge ports 22 are disposed in the gas space of the recovery passageway 19. Namely, the hindering part 40 is provided in the recovery passageway 19 such that the peripheral space of each of the second discharge ports 22 in the recovery passageway 19 is the gas space. For example, the hindering part 40 adjusts the interface (i.e., the surface) of the liquid space in the recovery passageway 19 such that the liquid LQ does not contact the second discharge ports 22. Thereby, the second discharge ports 22 disposed in the gas space discharge substantially only the gas G from the recovery passageway 19.

In the present embodiment, the hindering part 40 comprises a projection 41, which is disposed at least partly around the second discharge ports 22. The projection 41 is provided inside the recovery passageway 19 such that the second discharge ports 22 are disposed in the gas space in the recovery passageway 19. The projection 41 limits the movement of the interface of the liquid space in the recovery passageway 19 such that the second discharge ports 22 are disposed in the gas space in the recovery passageway 19. Namely, the projection 41 hinders the interface of the liquid space in the recovery passageway 19 from approaching the second discharge ports 22.

In addition, in the present embodiment, the hindering part 40 comprises a liquid repellent part 42, which is disposed inside the recovery passageway 19 at least partly around the second discharge ports 22 and whose surface is liquid repellent with respect to the liquid LQ. The liquid repellent part 42 hinders contact between the second discharge ports 22 and the liquid LQ in the recovery passageway 19. The liquid repellent part 42 is provided inside the recovery passageway 19 such that the second discharge ports 22 are disposed in the gas space in the recovery passageway 19. The liquid repellent part 42 hinders the interface of the liquid space in the recovery passageway 19 from approaching the second discharge ports 22 such that the peripheral space of each of the second discharge ports 22 inside the recovery passageway 19 is the gas space.

In the present embodiment, the second discharge ports 22 are disposed on the outer side of the projection 41 in radial directions with respect to the optical path K. Namely, the second discharge ports 22 are farther from the optical path K than the projection 41 is. In addition, at least part of the liquid repellent part 42 is disposed between the second discharge ports 22 and the projection 41.

In the present embodiment, the projection 41 is disposed between the second discharge ports 22 and at least some of the recovery ports 18 in the radial directions with respect to the optical path K. In the present embodiment, the projection 41 is disposed between the recovery ports 18 of the first portion 281 and the second discharge ports 22 in the radial directions with respect to the optical path K.

The projection 41 projects downward at least partly around the second discharge ports 22. In the present embodiment, the projection 41 is formed by at least part of the inner surface of the recovery passageway 19. In the present embodiment, the surfaces of the projection 41 include a side surface 41S, which extends downward at least partly around the second discharge ports 22, and a lower surface 41K, which extends from a lower end part of the side surface 41S such that it approaches the optical path K proceeding from the inner sides of the second discharge ports 22. The side surface 41S faces the outer side in the radial directions with respect to the optical path K. The side surface 41S is substantially parallel to the optical path K. The side surface 41S is substantially parallel to the Z axis. Furthermore, the side surface 41S does not have to be parallel to the Z axis. The lower surface 41K faces the −Z direction. In the present embodiment, the lower surface 41K is substantially parallel to the XY plane. The side surface 41S and the lower surface 41K are part of the inner surface of the recovery passageway 19. In the present embodiment, the angle formed between the lower surface 41K and the side surface 41S is substantially 90°. Furthermore, the angle formed between the lower surface 41K and the side surface 41S may be less than or greater than 90°. In the present embodiment, the tip (i.e., the lower end) of the projection 41 is disposed at a position that is lower than the second discharge ports 22.

In the present embodiment, the lower surface 41K and the side surface 41S of the inner surface of the recovery passageway 19, which form the projection 41, are lyophilic with respect to the liquid LQ. In the present embodiment, the lyophilic lower surface 41K and the lyophilic side surface 41S are adjacent to the liquid repellent part 42. At least part of the liquid repellent part 42 is disposed between the lyophilic lower surface 41K and the lyophilic side surface 41S on one side and the second discharge ports 22 on the other side.

In the present embodiment, the contact angle of the liquid LQ with respect to the lyophilic inner surface (i.e., the lower surface 41K and the side surface 41S) of the recovery passageway 19 is less than 90°. The contact angle of the liquid LQ with respect to the surface of the liquid repellent part 42 is 90° or greater. In the present embodiment, the contact angle of the liquid LQ with respect to the surface of the liquid repellent part 42 may be, for example, 100° or greater or 110° or greater.

In the present embodiment, the liquid repellent part 42 is formed with films Fr that is liquid repellent with respect to the liquid LQ. The material used to form the films Fr is fluorine based. In the present embodiment, the films Fr are tetrafluoroethylene-perfluoro(alkyl vinyl ether) copolymer (PFA) films. Furthermore, the films Fr may also be, for example, polytetrafluoroethylene (PTFE) films, polyetheretherketone (PEEK) films, or Teflon® films. In addition, the films Fr may also be Cytop™ (made by Asahi Glass Co.) or Novec EGC™ (made by 3M Company) films.

Furthermore, the hindering part 40 does not have to comprise the liquid repellent part 42.

In the present embodiment, the first discharge ports 21 and the second discharge ports 22 are disposed at least partly around the optical path K. As shown in FIG. 3, in the present embodiment, the second members 27, which each have the first discharge ports 21, are disposed at prescribed intervals around the optical path K. In the present embodiment, the second members 27 are disposed at four locations around the optical path K. The second discharge ports 22 are disposed at prescribed intervals around the optical path K. Furthermore, the number of the first discharge ports 21 and the number of the second discharge ports 22 may be the same. Furthermore, the first discharge ports 21 may be provided continuously around the optical path K, the second discharge ports 22 may be provided continuously around the optical path K, or both may be so provided.

As shown in FIG. 2, each of the first discharge ports 21 is connected to a first discharge apparatus 24 via the corresponding passageway 30 and a passageway 23, which is formed by a discharge piping 23P. The second discharge ports 22 are connected to a second discharge apparatus 26 via passageway 36, which are formed inside the main body part 32, and a passageway 25, which is formed by a discharge piping 25P. Each of the first and second discharge apparatuses 24, 26 comprises, for example, a vacuum system and is capable of suctioning the fluid (i.e., the fluid containing the gas G or the liquid LQ, or both).

In the present embodiment, a discharge operation is performed via the first discharge ports 21 by the operation of the first discharge apparatus 24. In addition, in the present embodiment, a discharge operation is performed via the second discharge ports 22 by the operation of the second discharge apparatus 26.

In the present embodiment, the first discharge apparatus 24 is capable of adjusting the pressure Pc in the passageways 30 that the upper surfaces 27A of the second members 27 face. In addition, the second discharge apparatus 26 is capable of adjusting the pressure Pb in the recovery passageway 19 that the lower surfaces 27B of the second members 27 and the upper surface 28A of the first member 28 face. In addition, the internal space CS includes the space SP, and the chamber apparatus CH is capable of adjusting the pressure Pa in the space SP that the lower surface 28B of the first member 28 faces. The control apparatus 4 uses the chamber apparatus CH or the second discharge apparatus 26, or both, to adjust the pressure Pa or the pressure Pb, or both, such that the first portion 281 of the first member 28 recovers the liquid LQ together with the gas G from the space SP and such that the second portion 282 recovers the liquid LQ while hindering the inflow of the gas G. In addition, the control apparatus 4 uses the first discharge apparatus 24 or the second discharge apparatus 26, or both, to set the pressure Pb or the pressure Pc, or both, such that the second members 27 discharge the liquid LQ from the recovery passageway 19 while hindering the inflow of the gas G. Furthermore, the second discharge apparatus 26 does not have to be capable of adjusting the pressure Pb.

Furthermore, the exposure apparatus EX comprises the first discharge apparatus 24 or the second discharge apparatus 26, or both. Furthermore, the first discharge apparatus 24 or the second discharge apparatus 26, or both, may be an apparatus that is external to the exposure apparatus EX. Furthermore, the first discharge apparatus 24 or the second discharge apparatus 26, or both, may be equipment in the factory wherein the exposure apparatus EX is installed.

In the present embodiment, at least part of the surface of the liquid immersion member 3 includes a surface of an amorphous carbon film. The amorphous carbon film includes a tetrahedral amorphous carbon film. In the present embodiment, at least part of the surface of the liquid immersion member 3 includes a surface of a tetrahedral amorphous carbon film. In the present embodiment, at least part of the surface of the liquid immersion member 3 that contacts the liquid LQ in the immersion space LS during an exposure of the substrate P includes a surface of an amorphous carbon film (i.e., a tetrahedral amorphous carbon film). In the present embodiment, the base material of the plate part 31 and the main body part 32 may be titanium, and the amorphous carbon film is formed on the surface of that base material. In the present embodiment, the base material of the first member 28 and the second members 27 may be titanium, and the amorphous carbon film is formed on the surface of that base material.

Furthermore, the base material of the liquid immersion member 3, which comprises the plate part 31, the main body part 32, the first member 28, or the second members 27, or any combination thereof, may be a metal, such as stainless steel or aluminum, or a ceramic material.

Furthermore, the amorphous carbon film may be formed on the base material using, for example, chemical vapor deposition (CVD), physical vapor deposition (PVD), and the like.

Furthermore, at least part of the surface of the liquid immersion member 3 does not have to include the surface of the amorphous carbon film.

A method of using the exposure apparatus EX that has the abovementioned configuration to expose the substrate P will now be explained. In order to form the immersion space LS between the last optical element 8 and the liquid immersion member 3 on one side and the substrate P on the other side after the unexposed substrate P has been loaded onto the substrate holding part 10, the control apparatus 4 causes the substrate P held by the substrate stage 2 to oppose the emergent surface 7 and the lower surface 14. In the state wherein the substrate P opposes the emergent surface 7 and the lower surface 14, the immersion space LS is formed by supplying the liquid LQ via the supply ports 17 such that the optical path K of the exposure light EL between the last optical element 8 and the substrate P is filled with the liquid LQ.

In the present embodiment, the immersion space LS is formed with the liquid LQ between the last optical element 8 and the liquid immersion member 3 on one side and the substrate P (i.e., the object) on the other side by recovering the liquid LQ via the recovery ports 18 in parallel with supplying the liquid LQ via the supply ports 17.

Furthermore, in the present embodiment, the dimension (i.e., the size) of the immersion space LS is prescribed such that the interface LG of the liquid LQ in the immersion space LS is disposed between the first portion 281 and the object in the state wherein the object (i.e., the substrate P) opposing the last optical element 8 and the liquid immersion member 3 is substantially stationary. The control apparatus 4 controls the amount of the liquid LQ supplied per unit of time via the supply ports 17 and the amount of the liquid LQ recovered per unit of time via the recovery ports 18 such that the interface LG is formed between the first portion 281 and the object in the state wherein the object is substantially stationary.

Furthermore, in the state wherein the object is substantially stationary, the interface LG of the liquid LQ in the immersion space LS may be disposed between the second portion 282 and the object.

The control apparatus 4 starts the process of exposing the substrate P. The control apparatus 4 radiates the exposure light EL, which emerges from the mask M illuminated with the exposure light EL from the illumination system IL, to the substrate P through the projection optical system PL and the liquid LQ in the immersion space LS. Thereby, the substrate P is exposed with the exposure light EL, which transits the liquid LQ in the immersion space LS and emerges from the emergent surface 7, and thus the image of the pattern of the mask M is projected to the substrate P.

When recovering the liquid LQ via the recovery ports 18, the control apparatus 4 operates the second discharge apparatus 26 to discharge the gas G from the recovery passageway 19 via the second discharge ports 22. Thereby, the pressure in the recovery passageway 19 decreases. In the present embodiment, the control apparatus 4 controls the second discharge apparatus 26 such that the pressure Pb in the recovery passageway 19 is lower than the pressure Pa in the space SP. By making the pressure Pb lower than the pressure Pa, at least some of the liquid LQ is recovered from the space above the substrate P to the recovery passageway 19 via the holes 28H of the first portion 281 of the first member 28 or the holes 28H of the second portion 282 of the first member 28, or both. In addition, at least some of the gas G is recovered from the space SP to the recovery passageway 19 via the holes 28H. The liquid LQ and the gas G are separately discharged from the recovery passageway 19 via the discharge parts 20.

In the present embodiment, the discharge operation via the second discharge ports 22 is performed in the state wherein the hindering part 40, which comprises the projection 41 and the liquid repellent part 42, is disposed at least partly around the second discharge ports 22. The gas G is discharged from the recovery passageway 19 via the second discharge ports 22 while the hindering part 40 hinders the liquid LQ in the recovery passageway 19 from contacting the second discharge ports 22.

In the present embodiment, the liquid LQ and the gas G flow in the recovery passageway 19 such that the liquid LQ in the recovery passageway 19 contacts the first discharge ports 21 but not the second discharge ports 22. In the present embodiment, the arrangement of the first discharge ports 21, the second discharge ports 22, the recovery ports 18, and the like, and, for example, the shape of the inner surface of the recovery passageway 19, a characteristic (e.g., the contact angle) of the inner surface of the recovery passageway 19 with respect to the liquid LQ, the shape of the surface of each of the members that faces the recovery passageway 19, and a characteristic (e.g., the contact angle) of the surface of the members that face the recovery passageway 19 with respect to the liquid LQ are prescribed such that the liquid LQ recovered to the recovery passageway 19 via the holes 28H of the first member 28 flows toward the first discharge ports 21 without contacting the second discharge ports 22.

In the present embodiment, the liquid LQ is recovered to the recovery passageway 19 via the first portion 281 of the first member 28, together with the gas G, and is recovered to the recovery passageway 19 via the second portion 282 while hindering the flow of the gas G into the recovery passageway 19.

Because the pressure Pb in the recovery passageway 19 decreases to a pressure lower than the pressure Pa in the space SP between the liquid immersion member 3 and the substrate P, the liquid LQ in the space above the substrate P flows into the recovery passageway 19 via the recovery ports 18 (i.e., the first member 28). Namely, because a pressure differential is generated between the upper surface 28A and the lower surface 28B of the first member 28, the liquid LQ in the space above the substrate P flows into the recovery passageway 19 via the recovery ports 18 (i.e., the first member 28).

In addition, the control apparatus 4 operates the first discharge apparatus 24 in order to discharge the liquid LQ from the recovery passageway 19 via the first discharge ports 21. The operation of the first discharge apparatus 24 lowers the pressure in the passageways 30. In the present embodiment, the control apparatus 4 controls the first discharge apparatus 24 such that the pressure Pc in the passageways 30 becomes lower than the pressure Pb in the recovery passageway 19.

The control apparatus 4 controls the first discharge apparatus 24 and thereby controls the pressure Pc in the passageways 30 such that only the liquid LQ is discharged to the passageways 30 via the second members 27.

By making the pressure Pc in the passageways 30 lower than the pressure Pb in the recovery passageway 19, the liquid LQ in the recovery passageway 19 flows into the passageways 30 via the first discharge ports 21 (i.e., the second members 27). Namely, because a pressure differential is generated between the upper surface 27A and the lower surface 27B of each of the second members 27, the liquid LQ in the recovery passageway 19 flows into the passageways 30 via the first discharge ports 21 (i.e., the second members 27).

During the recovery of the liquid LQ via the recovery ports 18, the liquid LQ continues to be discharged from the recovery passageway 19 via the first discharge ports 21. To recover the liquid LQ via the recovery ports 18, the second discharge ports 22 continue to discharge the gas G from the recovery passageway 19.

To discharge only the gas G from the recovery passageway 19, the second discharge ports 22 hinder the pressure Pb in the recovery passageway 19 from fluctuating greatly. Namely, the pressure Pb in the recovery passageway 19 is held substantially constant by ensuring a continuous gas passageway between the second discharge apparatus 26 and the gas space at the upper part of the recovery passageway 19 and by the second discharge ports 22 continuing to discharge the gas G from the recovery passageway 19. Because the pressure Pb in the recovery passageway 19 is substantially constant, fluctuations in the amount of the liquid LQ recovered per unit of time from the space above the substrate P (i.e., in the immersion space LS) via the recovery ports 18 are hindered.

In the present embodiment, to form the immersion space LS, the supply ports 17 supply a prescribed amount of the liquid LQ per unit of time. In the present embodiment, the supply ports 17 continue to supply a substantially constant amount of the liquid LQ. In addition, the recovery ports 18 recover a prescribed amount of the liquid LQ per unit of time. In the present embodiment, the recovery ports 18 continue to recover a substantially constant amount of the liquid LQ. Accordingly, large fluctuations in the immersion space LS are hindered.

In the present embodiment, the liquid LQ recovered to the recovery passageway 19 via the recovery ports 18 flows toward the first discharge ports 21 (i.e., the second members 27) while contacting at least part of the inner surface of the recovery passageway 19. The liquid LQ in the recovery passageway 19 that contacts the first discharge ports 21 (i.e., the second members 27) is discharged via those first discharge ports 21. For example, the liquid LQ recovered via the holes 28H of the first portion 281 flows on the upper surface 28A of the first member 28 toward the first discharge ports 21 (i.e., the second members 27). The liquid LQ is discharged from the recovery passageway 19 via the first discharge ports 21 such that the flow of the gas G from the recovery passageway 19 into the second discharge ports 22 is maintained. The control apparatus 4 controls the first discharge apparatus 24 or the second discharge apparatus 26, or both, such that the discharge of the gas G via the second discharge ports 22 continues and such that the liquid LQ is discharged via the first discharge ports 21.

In the present embodiment, when the liquid LQ is being recovered from the space above the substrate P via the first member 28, at least the upper surface 28A of the second portion 282 is covered by the liquid LQ in the recovery passageway 19. In the present embodiment as shown in FIG. 2 and FIG. 5, in the recovery passageway 19, substantially the entire area of the upper surface 28A of the first member 28 is covered by the liquid LQ in the recovery passageway 19. Namely, in the recovery passageway 19, substantially all of the upper surface 28A contacts the liquid LQ. Thereby, the liquid selective recovery condition is satisfied for the majority of the holes 28H of the second portion 282, and substantially only the liquid LQ is recovered via the second portion 282.

In the present embodiment, the liquid LQ is recovered together with the gas G via the first portion 281 of the first member 28, and the flow of the liquid LQ in the vicinity of the interface LG of the immersion space LS is hindered from stagnating. Accordingly, the contamination of the first member 28 (e.g., the adherence of particles thereto) and the dropping of particles from the first member 28 can be hindered. In addition, because the flow of the gas G from the space SP into the recovery passageway 19 via the second portion 282 is hindered, the flow of the gas G into the recovery passageway 19 via the holes 28H of the first portion 281 that face the gas space GS can be maintained stably. Thereby, the immersion space LS can be formed in the desired state while preventing exposure failures from occurring.

Figure 9A:
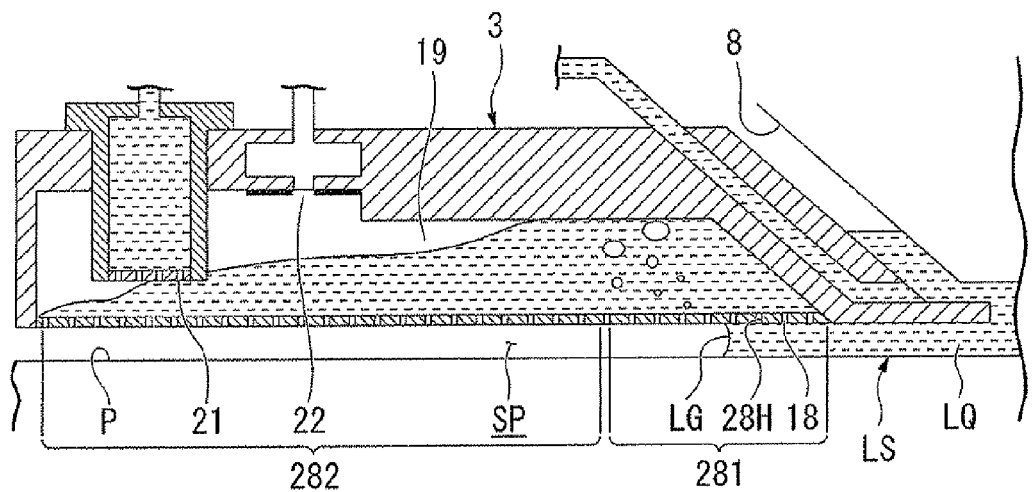
FIG. 9A is a schematic drawing for explaining one example of the operation of the liquid immersion member according to the first embodiment.
Figure 9B:
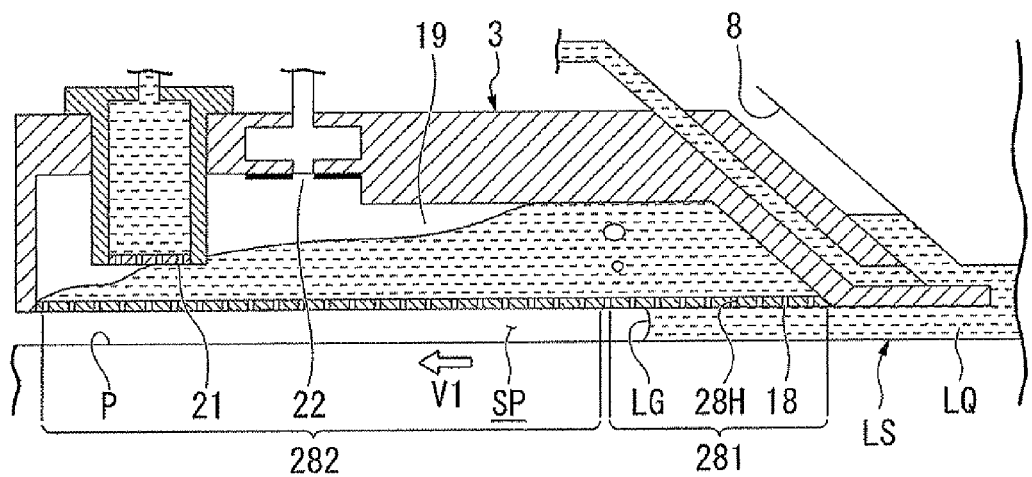
FIG. 9B is a schematic drawing for explaining one example of the operation of the liquid immersion member according to the first embodiment.
Figure 9C:
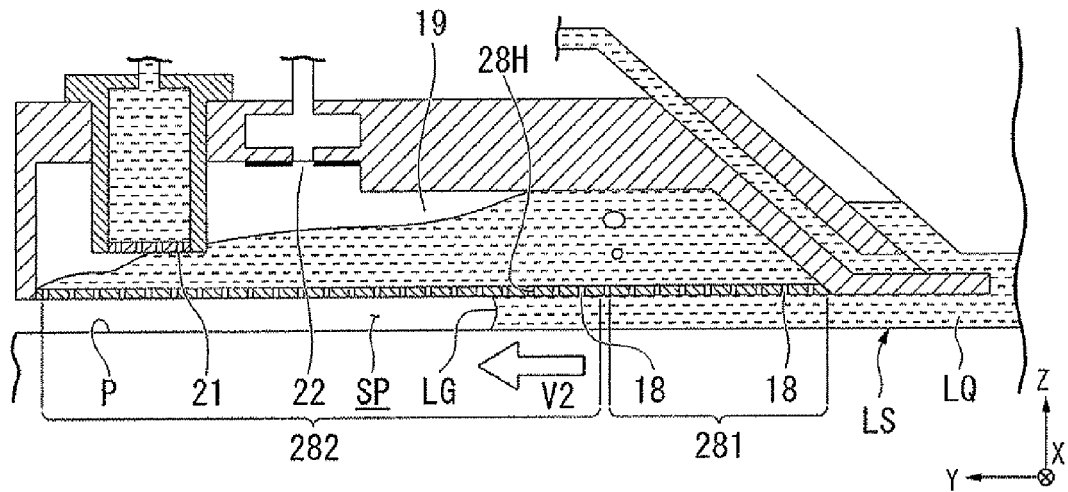
FIG. 9C is a schematic drawing for explaining one example of the operation of the liquid immersion member according to the first embodiment.

FIGS. 9A, 9B and 9C are a schematic drawings that show one example of the state wherein the immersion space LS is being formed between the last optical element 8 and the liquid immersion member 3 on one side and the substrate P (i.e., the object) on the other side. FIG. 9A is a diagram that shows one example of the state of the immersion space LS when the substrate P is substantially stationary with respect to the last optical element 8 and the liquid immersion member 3, FIG. 9B is a diagram that shows one example of the state of the immersion space LS when the substrate P is moving under a first movement condition with respect to the last optical element 8 and the liquid immersion member 3, and FIG. 9C is a diagram that shows one example of the state of the immersion space LS when the substrate P is moving under a second movement condition with respect to the last optical element 8 and the liquid immersion member 3.

The movement condition of the substrate P includes the movement velocity of the substrate P, the acceleration (including the deceleration) of the substrate P, the movement distance of the substrate P in a prescribed movement direction (e.g., the +Y direction) within the XY plane, the locus of movement of the substrate P, or any combination thereof.

The position of the interface LG between the first member 28 and the substrate P varies with the movement condition of the substrate P. In FIG. 9A, if the substrate P is substantially stationary in the state wherein the immersion space LS is formed, then the interface LG of the liquid LQ in the immersion space LS is disposed between the first portion 281 and the substrate P. In FIG. 9B, if the substrate P moves under the first movement condition in the state wherein the immersion space LS is formed, then the interface LG of the liquid LQ in the immersion space LS is disposed between the outer edge of the first portion 281 and the substrate P. In FIG. 9C, if the substrate P moves under the second movement condition in the state wherein the immersion space LS is formed, then the interface LG of the liquid LQ in the immersion space LS is disposed between the second portion 282 and the substrate P.

FIG. 9B shows one example of the state of the immersion space LS when the movement of the substrate P in the +Y direction at a first velocity V1 is set as the first movement condition. FIG. 9C shows one example of the state of the immersion space LS when the movement of the substrate P in the +Y direction at a second velocity V2, which is higher than the first velocity V1, is set as the second movement condition.

Furthermore, there is also a possibility that the position of the interface LG will vary not only with the movement condition of the substrate P but also with, for example, the contact angle of the liquid LQ with respect to the front surface of the substrate P, the contact angle of the liquid LQ with respect to the lower surface 14 of the liquid immersion member 3, and the like.

In FIG. 9A, in the state wherein the substrate P is substantially stationary, the interface LG of the liquid LQ in the immersion space LS is disposed between the first portion 281 and substantially the center of the substrate P (i.e., the object) in the radial directions with respect to the optical path K. In the state wherein the substrate P is substantially stationary, the liquid LQ is recovered from the space SP to the recovery passageway 19 via the holes 28H of the first portion 281 that contact the liquid LQ in the space SP, and the gas G flows from the space SP into the recovery passageway 19 via the holes 28H of the first portion 281 that do not contact the liquid LQ. In addition, in FIG. 9A, the gas G is hindered from flowing from the space SP into the recovery passageway 19 via the holes 28H of the second portion 282 that do not contact the liquid LQ.

In FIG. 9B, by moving the substrate P in the +Y direction, the interface LG of the liquid LQ in the immersion space LS also moves in the +Y direction. In the state wherein the substrate P moves under the first movement condition (i.e., at the first velocity V1), the interface LG of the liquid LQ in the immersion space LS is disposed between the outer edge of the first portion 281 and the substrate P (i.e., the object) in the radial directions with respect to the optical path K. In the state wherein the substrate P moves under the first movement condition, the liquid LQ is recovered from the space SP to the recovery passageway 19 via the holes 28H of the first portion 281 that contact the liquid LQ in the space SP, and the gas G flows from the space SP into the recovery passageway 19 via the holes 28H of the first portion 281 that do not contact the liquid LQ. In addition, in FIG. 9B, too, the gas G is hindered from flowing from the space SP into the recovery passageway 19 via the holes 28H of the second portion 282 that do not contact the liquid LQ.

In FIG. 9C, by moving the substrate P in the +Y direction, the interface LG of the liquid LQ in the immersion space LS also moves in the +Y direction. In the state wherein the substrate P moves under the second movement condition (i.e., at the second velocity V2), the interface LG of the liquid LQ in the immersion space LS is disposed between the inner edge (or the center or outer edge) of the second portion 282 and the substrate P (i.e., the object) in the radial directions with respect to the optical path K. In the state wherein the substrate P moves under the second movement condition, the liquid LQ is recovered from the space SP to the recovery passageway 19 via the holes 28H of the first portion 281 and the second portion 282 that contact the liquid LQ in the space SP. In addition, in FIG. 9C, too, the gas G is hindered from flowing from the space SP into the recovery passageway 19 via the holes 28H of the second portion 282 that do not contact the liquid LQ. Namely, in FIG. 9C, the gas G is hindered from flowing into the recovery passageway 19 via the holes 28H of the first member 28.

Thus, the present embodiment is not limited to the movement conditions explained in FIGS. 9A, 9B and 9C; for example, in the present embodiment, the position of the interface LG of the liquid LQ in the immersion space LS might vary between the substrate P and the lower surface 28B.

In the present embodiment, the liquid LQ in the immersion space LS continues to contact at least part of the first portion 281 in the majority of the interval during which the substrate P is being exposed. Moreover, the liquid LQ in the immersion space LS might contact at least part of the second portion 282 in part of the interval during which the substrate P is being exposed.

As shown in FIG. 9A and FIG. 9B, in the state wherein the interface LG of the liquid LQ in the immersion space LS is disposed between the first portion 281 and the substrate P, the liquid LQ is recovered together with the gas G via the first portion 281, Thereby, the contamination of the first portion 281 is hindered.

During an exposure of the substrate P, there is a possibility that, for example, a substance (e.g., an organic substance such as the photosensitive material) produced by the substrate P will intermix with the liquid LQ in the immersion space LS, or that a substance of the substrate P will elute into the liquid LQ. That substance will function as foreign matter. In addition, along with the substance produced by the substrate P, foreign matter suspended in midair and the like might intermix with the liquid LQ of the immersion space LS. As discussed above, because the first portion 281 continues to contact the liquid LQ, if a foreign matter intermixes with the liquid LQ, then that foreign matter might adhere to the first portion 281.

If the first member 28 is left in a state wherein foreign matter is adhered to its surface, then that foreign matter might likewise adhere to the substrate P during an exposure or contaminate the liquid LQ supplied via the supply ports 17. In addition, if the lower surface 28B of the first member 28 becomes contaminated, then there is also a possibility that, for example, the immersion space LS will no longer be able to be formed satisfactorily. As a result, exposure failures might occur.

In the present embodiment, the first portion 281 recovers the liquid LQ together with the gas G, and consequently the adhesion of foreign matter to the first member 28 (i.e., the first portion 281) is hindered. For example, the liquid LQ recovered together with the gas G flows at a high velocity in the vicinity of the surface of the first portion 281. Thereby, the flow of that liquid LQ can hinder the adhesion of foreign matter to the first portion 281. In addition, even if foreign matter were to adhere to the surface of the first portion 281, the flow of that liquid LQ could eliminate the foreign matter from the surface of the first portion 281, and that eliminated foreign matter could be recovered to the recovery passageway 19 together with the liquid LQ.

Furthermore, in the present embodiment as discussed above, at least part of the surface of the liquid immersion member 3, which includes the surface of the first member 28, includes a surface of an amorphous carbon film. Accordingly, the adhesion of foreign matter produced by the substrate P to the surface of the liquid immersion member 3 is hindered.

In addition, there is a possibility that the interface LG of the liquid LQ will be disposed between the second portion 282 and the substrate P and that the liquid LQ in the immersion space LS will contact at least part of the second portion 282. In the present embodiment, because the second portion 282 recovers the liquid LQ, the liquid LQ between the liquid immersion member 3 and the substrate P can be hindered from flowing out to the outer side of the space SP between the liquid immersion member 3 and the substrate P. In addition, in the present embodiment, because the gas G is hindered from flowing into the recovery passageway 19 via the second portion 282, the gas G can continue to flow stably into the recovery passageway 19 via the holes 28H of the first portion 281 that face the gas space GS. In addition, because the second portion 282 recovers the liquid LQ while hindering the inflow of the gas G, it is possible to hinder any temperature change (e.g., a temperature change caused by the heat of vaporization) in the liquid LQ caused by the vaporization of the liquid LQ, any temperature change (e.g., a temperature change caused by the heat of vaporization) in any members that contact the liquid LQ, or any temperature change (e.g., a temperature change caused by the heat of vaporization) in both the liquid LQ and any members that contact the liquid LQ.

According to the present embodiment as explained above, because the first member 28 comprises the first portion 281 and the second portion 282, the desired immersion space LS can be formed. Accordingly, it is possible to prevent exposure failures from occurring and defective devices from being produced.

In addition, according to the present embodiment, because the hindering part 40, which comprises the projection 41 and the liquid repellent part 42 that hinder the contact of the liquid LQ in the recovery passageway 19 with the second discharge ports 22, is disposed in the recovery passageway 19, the discharge of the liquid LQ via the second discharge ports 22 is hindered and the gas G is discharged stably from the recovery passageway 19. In the present embodiment, because the discharge operation via the second discharge ports 22 is performed in the state wherein the hindering part 40, which comprises the projection 41 and the liquid repellent part 42, is disposed at least partly around the second discharge ports 22, contact between the second discharge ports 22 and the liquid LQ that flows into the recovery passageway 19 via the recovery ports 18 is hindered. In the present embodiment, because substantially only the gas G is discharged from the recovery passageway 19 via the second discharge ports 22 and the liquid LQ is discharged via the first discharge ports 21, a continuous gas passageway is ensured between the second discharge apparatus 26 and the gas space in the upper part of the recovery passageway 19 (i.e., the gas space in the vicinity of the second discharge ports 22 of the recovery passageway 19). Accordingly, the second discharge ports 22 can continue to discharge the gas G from the recovery passageway 19. Thereby, the pressure in the recovery passageway 19 (i.e., the gas space) can be made substantially constant, and the desired immersion space LS can be formed.

Furthermore, in the present embodiment, the second portion 282 recovers only the liquid LQ and not the gas G; however, the flow of the gas G into the recovery passageway 19 via the holes 28H of the second portion 282 that face the gas space GS does not have to be hindered completely. Namely, the gas G may flow into the recovery passageway 19 via the holes 28H of the second portion 282 that face the gas space GS.

Furthermore, when the liquid LQ is being recovered from the space above the substrate P (i.e., the object) via the first member 28, all, or just some, of the holes 28H of the second portion 282 may be covered with the liquid LQ inside the recovery passageway 19.

In addition, it is permissible for just some, and not all, of the holes 28H of the second portion 282 to satisfy the liquid selective recovery condition discussed above.

<Second Embodiment>

A second embodiment will now be explained. In the explanation below, constituent parts that are identical or equivalent to those in the embodiment discussed above are assigned identical symbols, and the explanations thereof are therefore abbreviated or omitted.

Figure 10:
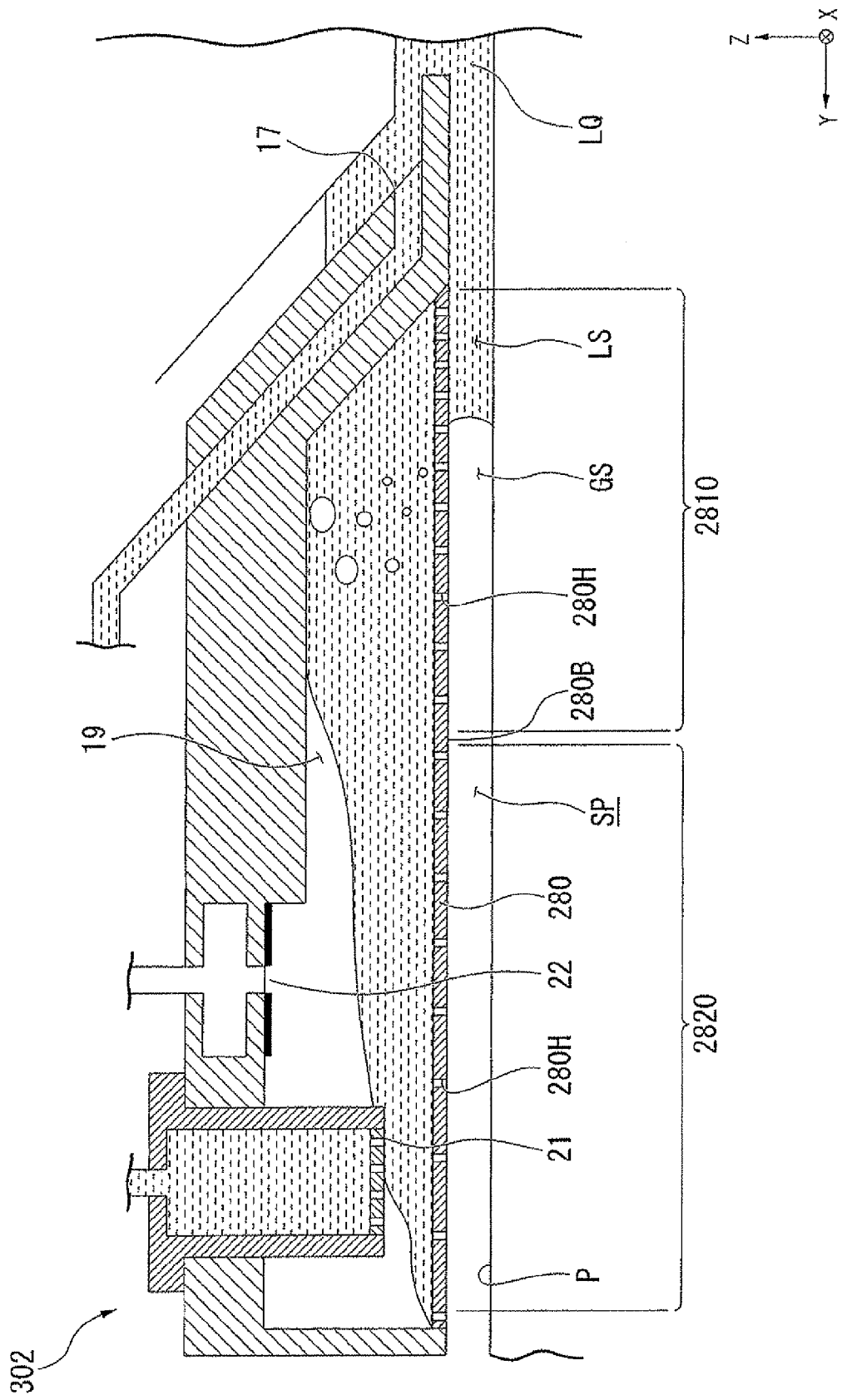
FIG. 10 is a partial side cross sectional view of the liquid immersion member according to a second embodiment.
Figure 11:
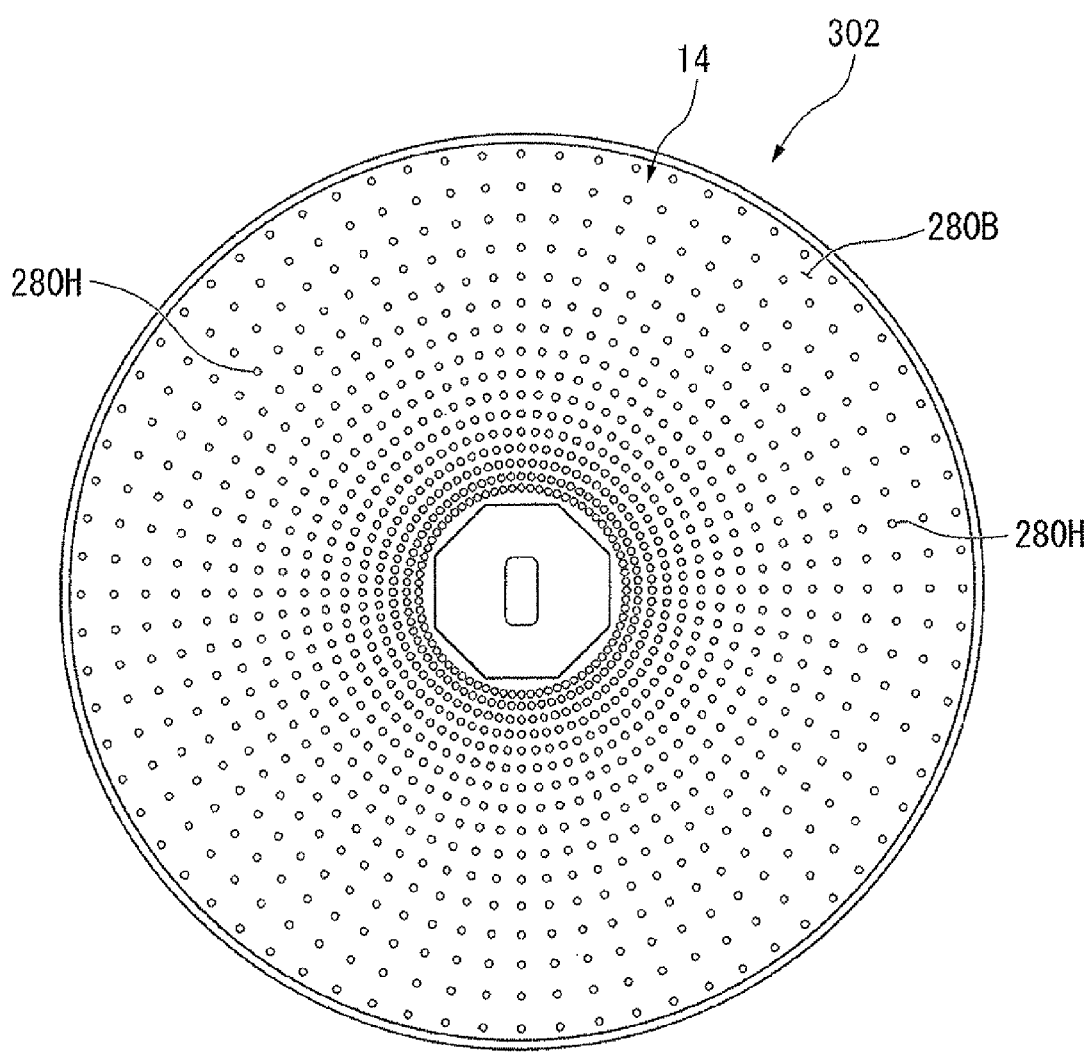
FIG. 11 shows the immersion member according to the second embodiment, viewed from below.

FIG. 10 is a side cross sectional view that shows part of a liquid immersion member 302 according to the second embodiment, and FIG. 11 is a view of the same viewed from the lower surface 14 side.

As shown in FIG. 10 and FIG. 11, the liquid immersion member 302 comprises a first member 280, which comprises a first portion 2810 and a second portion 2820. The first member 280 may be a porous member. In the present embodiment, the percentage of holes 280H per unit of area in a lower surface 280B of the first member 280 in the second portion 2820 is smaller than that in the first portion 2810.

Namely, the aperture percentage of the porous member in the second portion 2820 is small, and the aperture percentage of the porous member in the first portion 2810 is large.

In the present embodiment, the dimension of each of the holes 280H of the first portion 2810 and the dimension of each of the holes 280H of the second portion 2820 are substantially equal. The spacing between adjacent holes 280H in the second portion 2820 is larger than the spacing between adjacent holes 280H in the first portion 2810.

In addition, in the present embodiment, the number of the holes 28H in the second portion 2820 is smaller than the number of the holes 28H in the first portion 2810.

In the present embodiment, too, the second portion 2820 hinders the flow of the gas G from the space SP into the recovery passageway 19 via the holes 280H more than the first portion 2810 does, and the inflow resistance of the gas G from the space SP into the recovery passageway 19 is greater at the second portion 2820 than it is at the first portion 2810.

<Third Embodiment>

Figure 12:
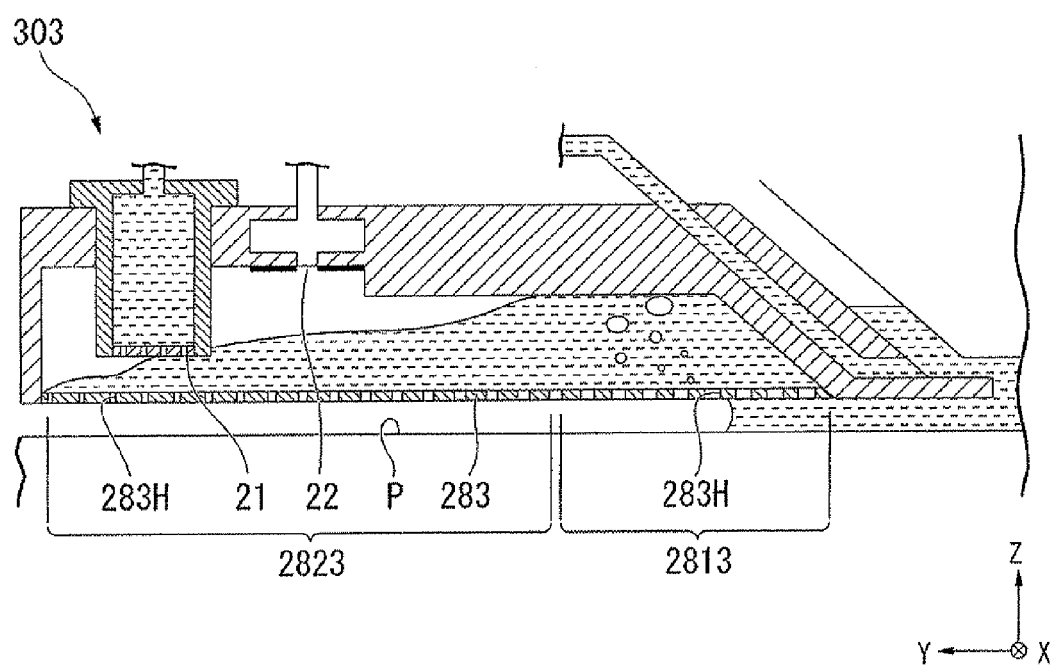
FIG. 12 is a partial side cross sectional view of the liquid immersion member according to a third embodiment.

A third embodiment will now be explained. FIG. 12 is a partial side cross sectional view of an immersion member 303 according to the third embodiment. In FIG. 12, the liquid immersion member 303 comprises a first member 283, which comprises a first portion 28B and a second portion 2823. The spacing between two adjacent holes 283H in the second portion 2823 is larger than the spacing between two adjacent holes 283H in the first portion 28B. In the present embodiment, too, the number of the holes 28H in the second portion 2823 is smaller than the number of the holes 28H in the first portion 2813.

In the present embodiment, too, the second portion 2823 hinders the flow of the gas G from the space SP into the recovery passageway 19 via the holes 283H more than the first portion 2813 does, and the inflow resistance of the gas G from the space SP into the recovery passageway 19 is greater at the second portion 2823 than it is at the first portion 2813.

<Fourth Embodiment>

Figure 13:
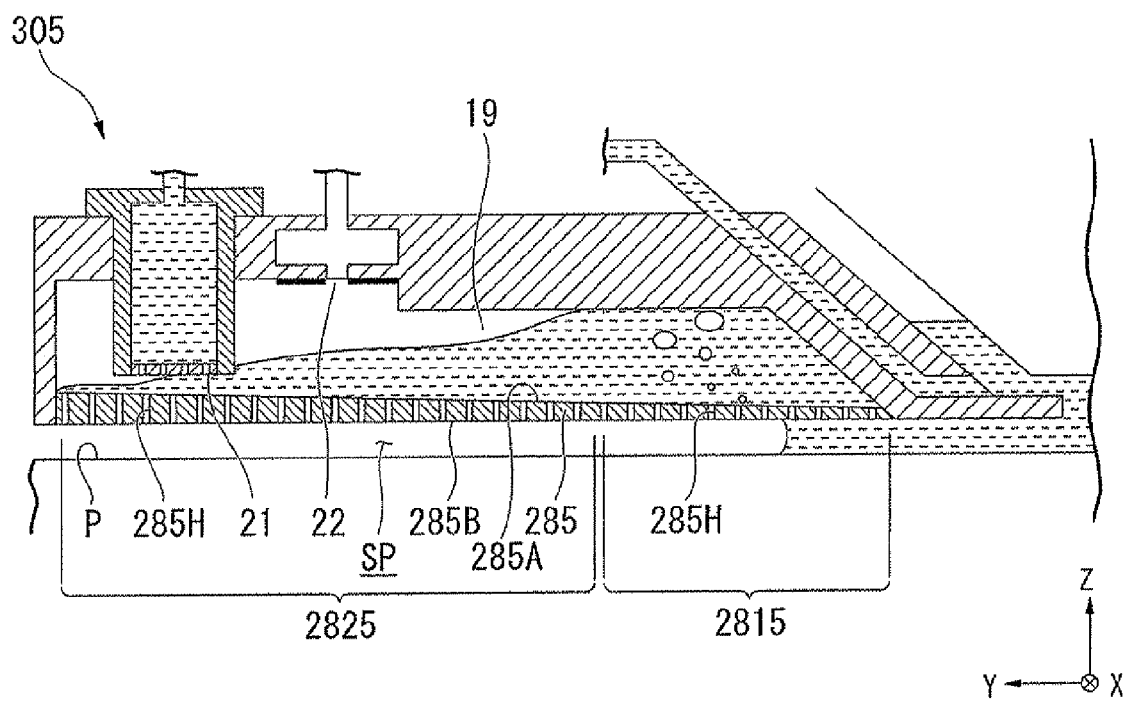
FIG. 13 is a partial side cross sectional view of the liquid immersion member according to a fourth embodiment.

A fourth embodiment will now be explained. FIG. 13 is a partial side cross sectional view of a liquid immersion member 305 according to the fourth embodiment. In FIG. 13, the liquid immersion member 305 comprises a first member 285, which comprises a first portion 2815 and a second portion 2825. In the present embodiment, the distance between a lower surface 285B and an upper surface 285A at the second portion 2825 is longer than the distance between the lower surface 285B and the upper surface 285A at the first portion 2815. In the present embodiment, the upper surface 285A is disposed such that it is tilted with respect to the horizontal plane (i.e., the XY plane) in the radial directions with respect to the optical path K. Furthermore, the lower surface 285B may be tilted with respect to the horizontal plane in the radial directions with respect to the optical path K.

In the present embodiment, too, the flow of the gas G from the space SP into the recovery passageway 19 via holes 285H is hindered more at the second portion 2825 than at the first portion 2815, and the inflow resistance of the gas G into the recovery passageway 19 is larger at the second portion 2825 than it is at the first portion 2815.

<Fifth Embodiment>

Figure 14A:
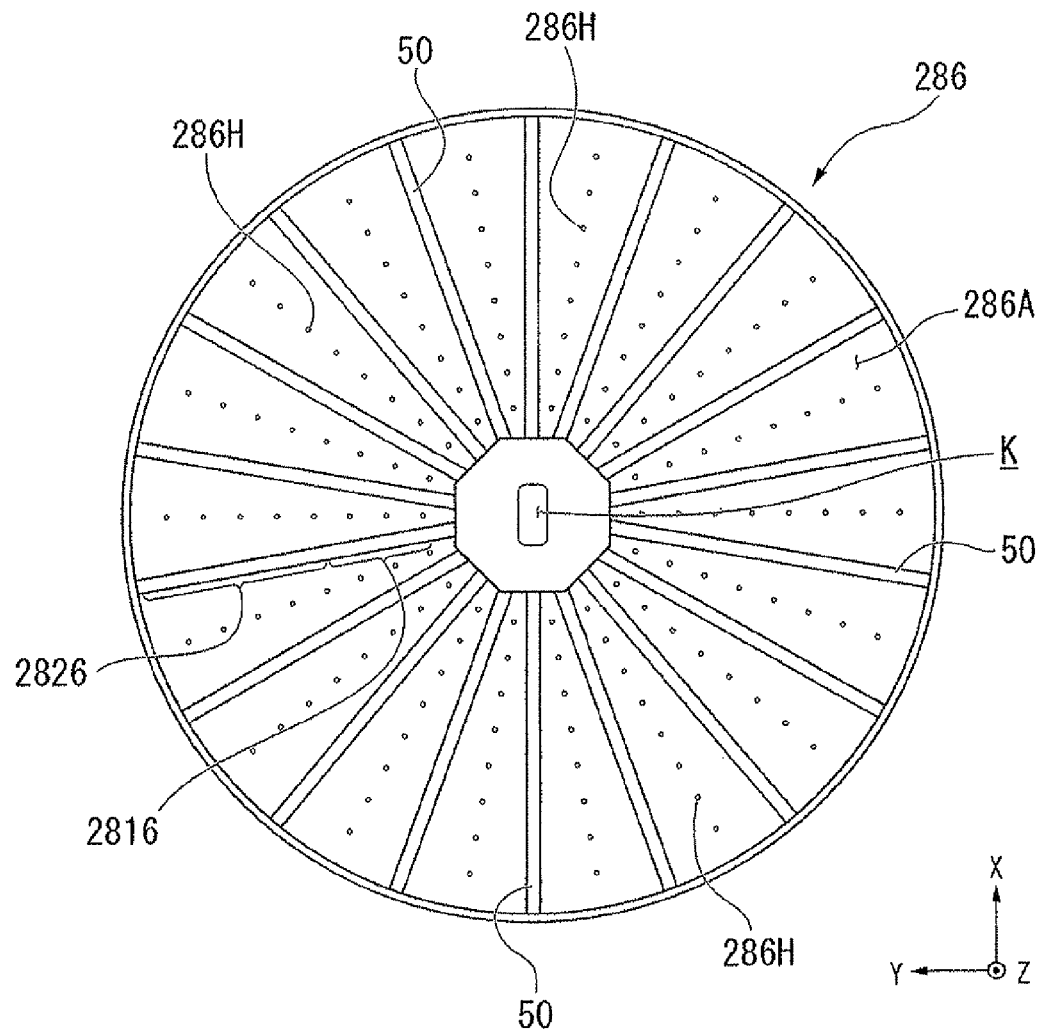
FIG. 14A shows one example of a first member according to a fifth embodiment.

A fifth embodiment will now be explained. FIG. 14A is a diagram of a first member 286 according to the fifth embodiment, viewed from the side of upper surfaces 286A, and FIG. 14B is a partial side cross sectional view of the first member 286.

Figure 14B:
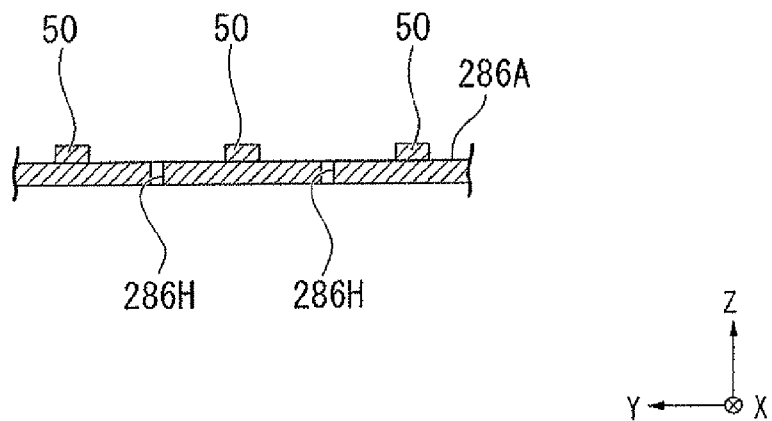
FIG. 14B shows one example of a first member according to a fifth embodiment.

As shown in FIGS. 14A and 14B, the multiple upper surfaces 286A of the first member 286 according to the present embodiment are disposed around the optical path K and comprise protruding parts 50, which extend in radial directions with respect to the optical path K. In the present embodiment, each of the protruding parts 50 is disposed in a first portion 2816 and a second portion 2826. Holes 286H are disposed between adjacent protruding parts 50.

Furthermore, the multiple protruding parts 50 may be disposed partly around the optical path K. In addition, the protruding parts 50 may be disposed in only the first portion 2816 or in only the second portion 2826.

The protruding parts 50 guide in an orderly manner the flow of the liquid LQ, which has flowed into the recovery passageway 19, to the first discharge ports 21. For example, the liquid LQ recovered via the holes 286H of the first portion 2816 flows along the protruding parts 50 in the recovery passageway 19 toward the outer side in the radial directions with respect to the optical path K. Thereby, the liquid LQ recovered via the first portion 2816 is guided smoothly to the first discharge ports 21, which are disposed on the outer side of the first portion 2816 in the radial directions with respect to the optical path K. Accordingly, the liquid LQ in the recovery passageway 19 is hindered from contacting the second discharge ports 22, and thereby the discharge of the liquid LQ via the second discharge ports 22 can be hindered.

In the present embodiment, too, the flow of the gas G from the space SP into the recovery passageway 19 via the holes 286H is hindered more at the second portion 2826 than at the first portion 2816, and the inflow resistance of the gas G into the recovery passageway 19 is larger at the second portion 2826 than it is at the first portion 2816.

<Sixth Embodiment>

Figure 15:
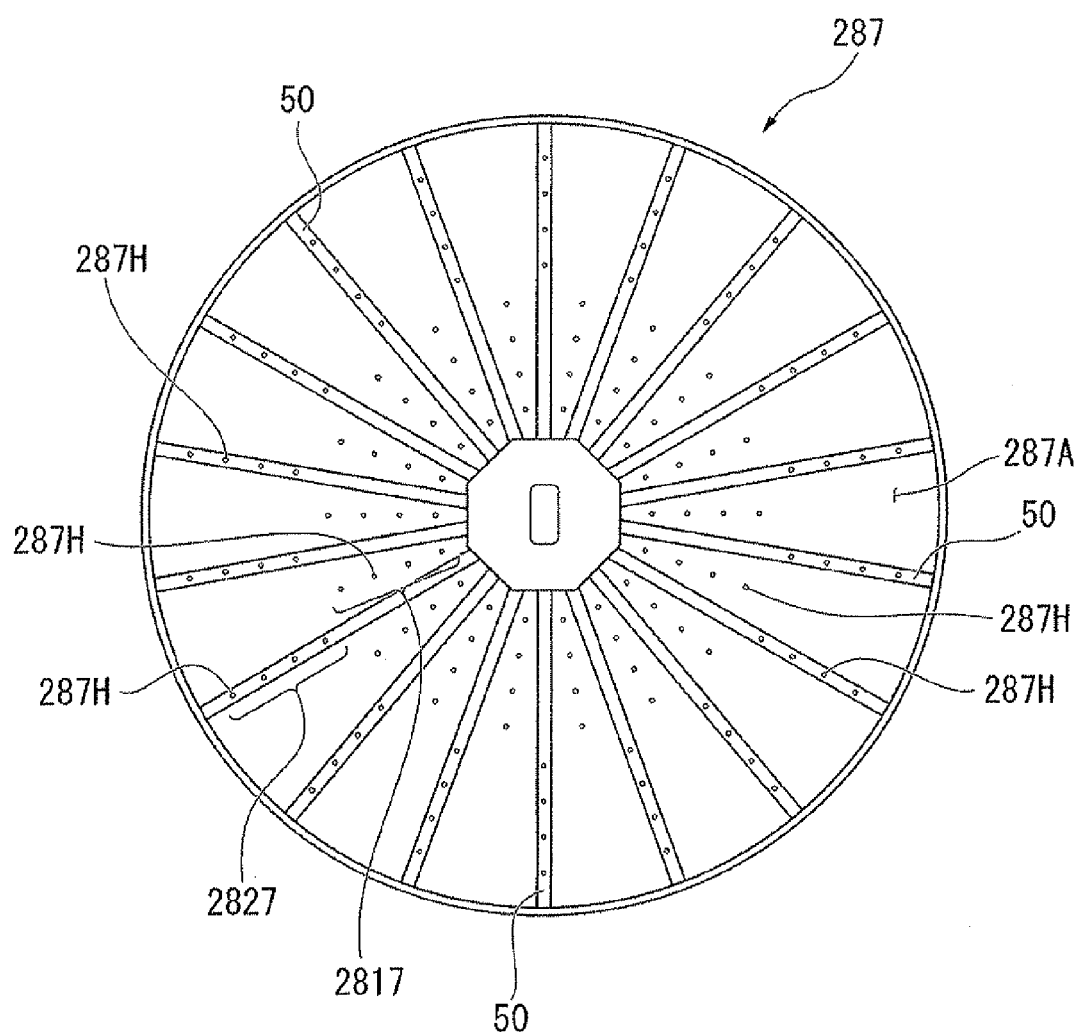
FIG. 15 shows one example of the first member according to a sixth embodiment.

A sixth embodiment will now be explained. FIG. 15 is a diagram of a first member 287 according to the sixth embodiment, viewed from the side of upper surfaces 287A. The upper surfaces 287A of the first member 287 are disposed around the optical path K, and the upper surfaces 287A comprise the protruding parts 50, which extend in the radial directions with respect to the optical path K. In the present embodiment, holes 287H are provided to at least part of each of the protruding parts 50. In the example shown in FIG. 15, in a first portion 2817 the holes 287H are disposed between adjacent protruding parts 50, and in a second portion 2827 the holes 287H are disposed in the protruding parts 50.

In the present embodiment, too, the liquid LQ in the recovery passageway 19 is hindered from contacting the second discharge ports 22, and thereby the discharge of the liquid LQ via the second discharge ports 22 can be hindered.

In addition, in the present embodiment, too, the flow of the gas G from the space SP into the recovery passageway 19 via the holes 287H is hindered more at the second portion 2827 than at the first portion 2817, and the inflow resistance of the gas G into the recovery passageway 19 is larger at the second portion 2827 than it is at the first portion 2817.

<Seventh Embodiment>

Figure 16:
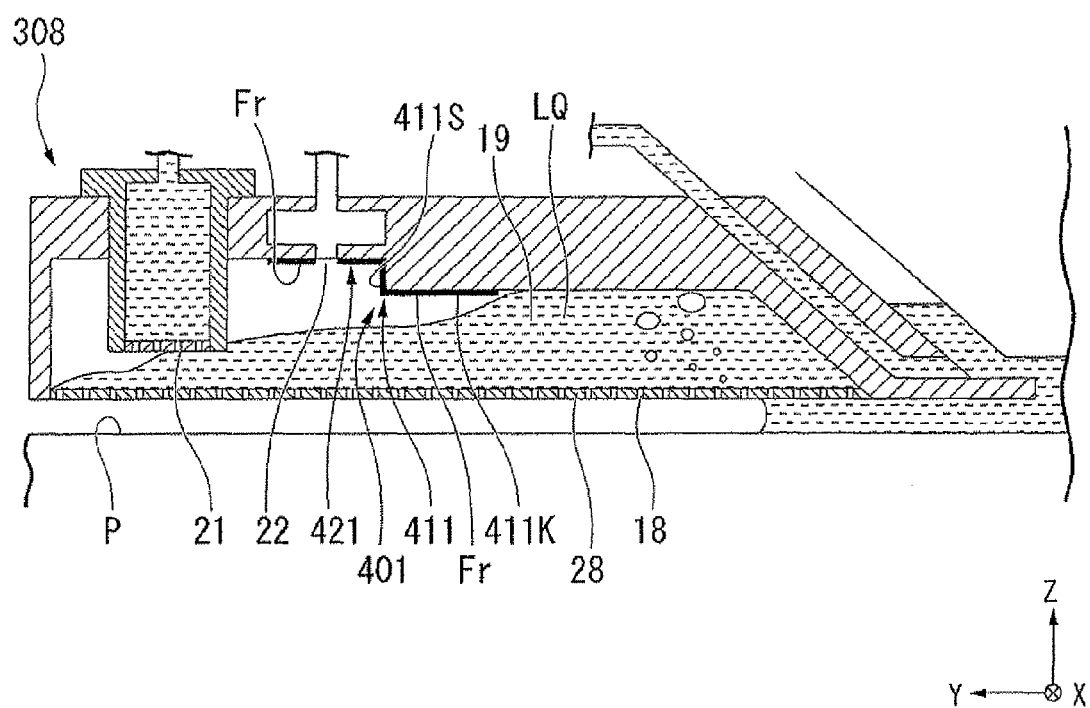
FIG. 16 is a partial side cross sectional view of the liquid immersion member according to a seventh embodiment.

A seventh embodiment will now be explained. FIG. 16 is a view that shows one example of a liquid immersion member 308 according to the seventh embodiment. The liquid immersion member 308 comprises a hindering part 401, which hinders the liquid LQ in the recovery passageway 19 from contacting the second discharge ports 22. The hindering part 401 comprises a projection 411 and a liquid repellent part 421, which is disposed around the second discharge ports 22.

In the present embodiment, at least part of the surface of the projection 411 is liquid repellent with respect to the liquid LQ. The surface of the projection 411 includes a side surface 411S and a lower surface 411K. In the present embodiment, the lower surface 411K and the side surface 411S of the projection 411 are formed with the liquid repellent films Fr. Furthermore, just part of the side surface 411S (e.g., in the vicinity of the tip of the projection 411) may be formed with the liquid repellent film Fr. In addition, just the part of the lower surface 411K that extends from the tip of the projection 411 toward the optical path K may be formed with the liquid repellent film Fr. In addition, either one, namely, the side surface 411S or the lower surface 411K, may be formed with the liquid repellent film Fr.

Furthermore, the entire inner surface of the recovery passageway 19 that includes the side surface 411S and the lower surface 411K may be formed with the liquid repellent films Fr.

In the recovery passageway 19 wherein the hindering part 401 according to the present embodiment is provided, too, the liquid LQ is hindered from contacting the second discharge ports 22.

<Eighth Embodiment>

Figure 17:
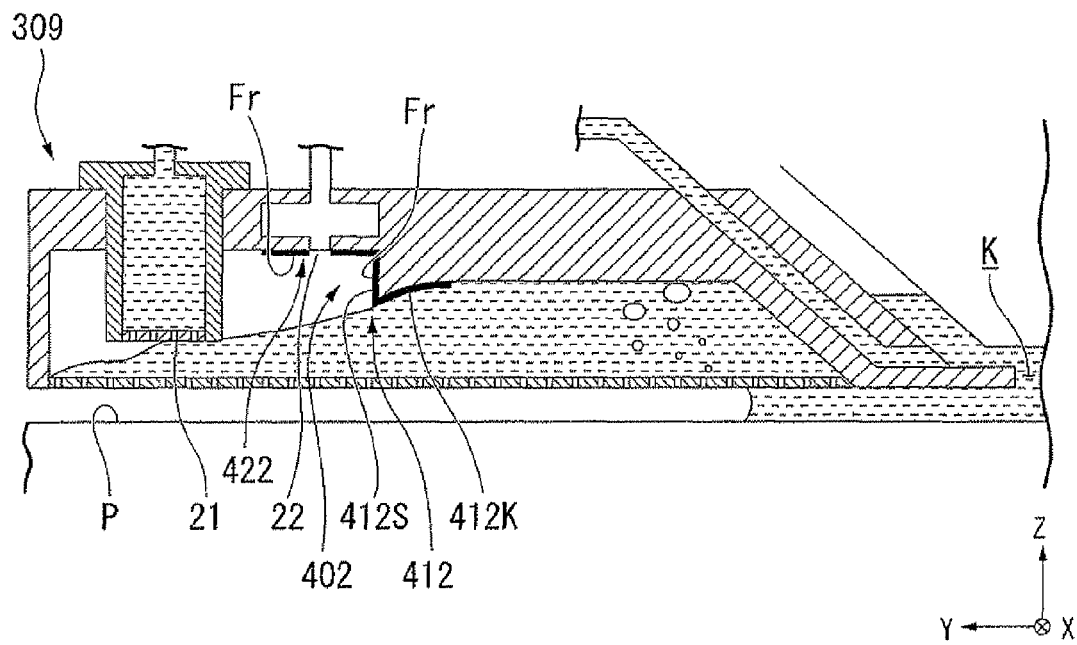
FIG. 17 is a partial side cross sectional view of the liquid immersion member according to an eighth embodiment.

An eighth embodiment will now be explained. FIG. 17 is a view that shows one example of a liquid immersion member 309 according to the eighth embodiment. The liquid immersion member 309 comprises a hindering part 402, which comprises a projection 412 and a liquid repellent part 422. The liquid repellent part 422 is disposed around the second discharge ports 22. The projection 412 is formed by a lower surface 412K and a side surface 412S.

In the present embodiment, the lower surface 412K, which extends from the tip (i.e., the lower end) of the projection 412 toward the optical path K, includes an inclined surface. In the present embodiment, at least part of the lower surface 412K is inclined upward toward the optical path K. In the present embodiment, the inclined lower surface 412K extends upward from the tip of the projection 412 toward the optical path K. In FIG. 17, the angle formed between the lower surface 412K and the side surface 412S is less than 90° (i.e., it is an acute angle). In the present embodiment, the inclined surface of the lower surface 412K includes a curved surface. Namely, in the present embodiment, the inclined surface of the lower surface 412K includes a curved surface that extends upward toward the optical path K. Furthermore, the inclined surface of the lower surface 412K may be a planar surface that extends upward toward the optical path K.

In the present embodiment, the side surface 412S may, but does not have to, be parallel to the Z axis. In addition, in the present embodiment, the side surface 412S and the lower surface 412K (i.e., the inclined surface) includes a surface whereon the liquid repellent films Fr are formed; however, the side surface 412S or the lower surface 412K (i.e., the inclined surface), or both, does not have to include a surface whereon the liquid repellent film Fr is formed.

In the recovery passageway 19 of the present embodiment, too, the liquid LQ is hindered from contacting the second discharge ports 22.

<Ninth Embodiment>

Figure 18:
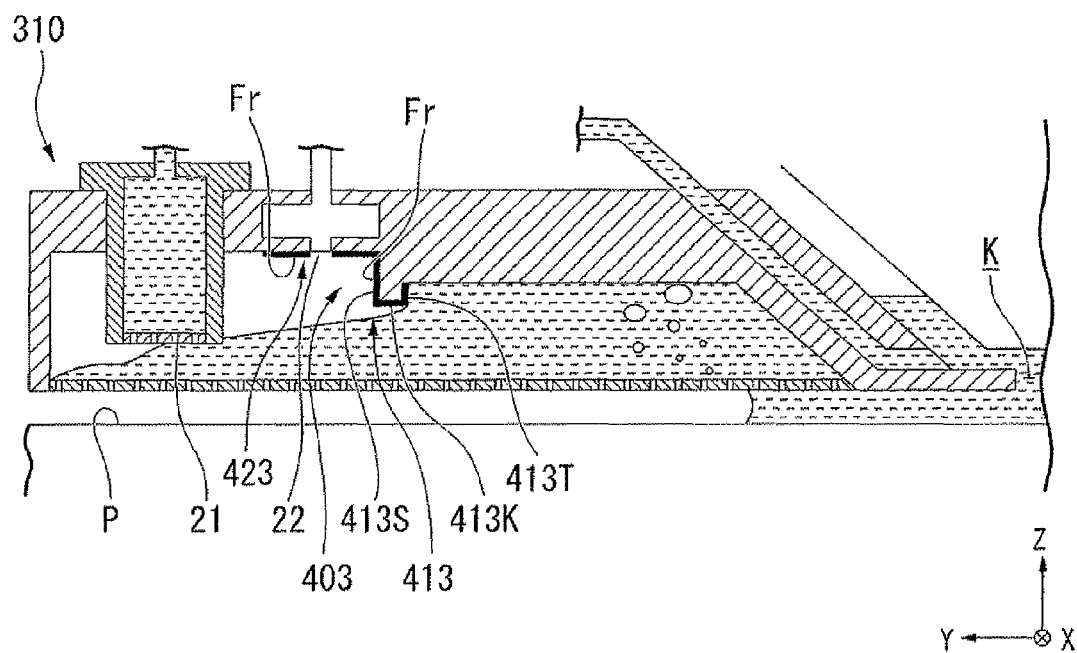
FIG. 18 is a partial side cross sectional view of the liquid immersion member according to a ninth embodiment.

A ninth embodiment will now be explained. FIG. 18 is a view that shows one example of a liquid immersion member 310 according to the ninth embodiment. The liquid immersion member 310 comprises a hindering part 403, which comprises a projection 413 and a liquid repellent part 423.

In the present embodiment, the projection 413 has: a side surface 413S, which extends downward at least partly around the second discharge ports 22; a lower surface 413K, which has a one-end part that connects to the lower end part of the side surface 413S, that extends toward the optical path K with respect to the second discharge ports 22; and a side surface 413T, which has a lower end part that connects with an other-end part of the lower surface 413K.

The side surface 413S faces the outer side and the side surface 413T faces the inner side in the radial directions with respect to the optical path K. The side surface 413S and the side surface 413T are each substantially parallel to the optical path K (i.e., the Z axis). The lower surface 413K faces the –Z direction. The lower surface 413K is substantially parallel to the XY plane. Furthermore, the side surface 413S or the side surface 413T, or both, may be inclined with respect to the Z axis. Furthermore, the lower surface 413K may be tilted with respect to the XY plane.

In addition, in the present embodiment, the side surface 413S, the lower surface 413K, and the side surface 413T each include a surface whereon the liquid repellent film Fr is formed; however, the side surface 413S, the lower surface 413K, or the side surface 413T, or any combination thereof, does not have to include a surface whereon the liquid repellent film Fr is formed.

In the recovery passageway 19 of the present embodiment, too, the liquid LQ is hindered from contacting the second discharge ports 22.

<Tenth Embodiment>

Figure 19:
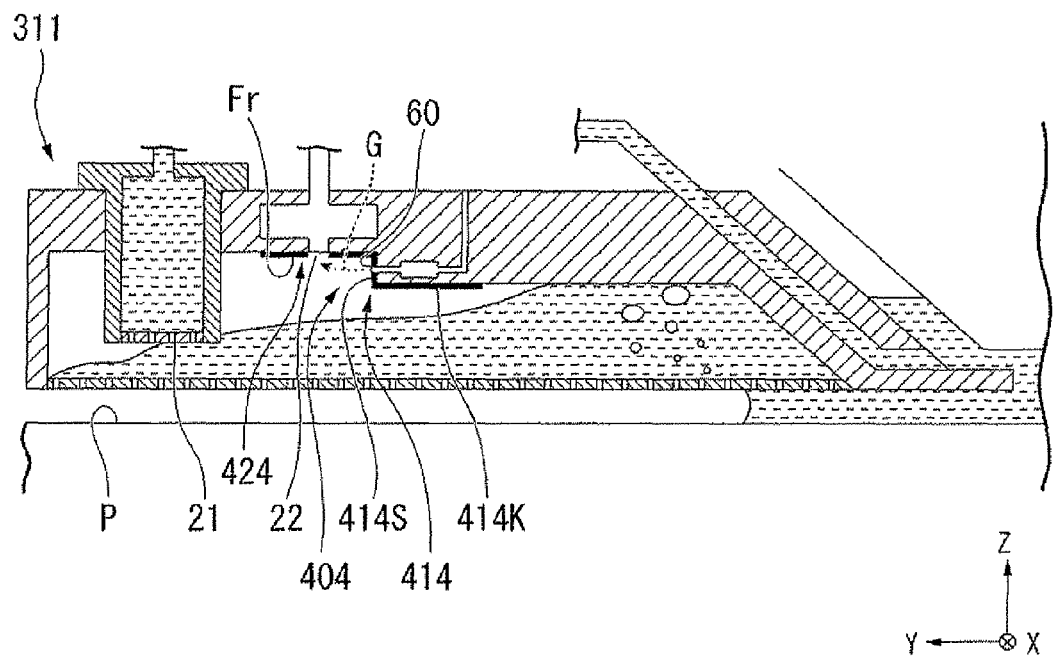
FIG. 19 is a partial side cross sectional view of the liquid immersion member according to a tenth embodiment.

A tenth embodiment will now be explained. FIG. 19 is a view that shows one example of a liquid immersion member 311 according to the tenth embodiment. The liquid immersion member 311 comprises a hindering part 404, which comprises a projection 414 and a liquid repellent part 424.

In the present embodiment, the hindering part 404 has gas supply ports 60, which supply the gas G at least partly around the second discharge ports 22. The gas supply ports 60 are disposed at least partly around the second discharge ports 22. In the example shown in FIG. 19, the gas supply port 60 is disposed in a side surface 414S. The gas supply ports 60 can blow, at least partly around the second discharge ports 22, the gas G against the second discharge ports 22. The control apparatus 4 can perform a supply operation of the gas G via the gas supply ports 60 at least partly around the second discharge ports 22 in parallel with, for example, a discharge operation of the gas G via the second discharge ports 22. The gas supply ports 60 supply the gas G such that the liquid LQ does not contact the second discharge ports 22. For example, even if at least some of the liquid LQ (e.g., a drop of the liquid LQ) in the recovery passageway 19 approaches the second discharge ports 22, the flow of the gas G supplied via the gas supply ports 60 can keep that liquid LQ spaced apart from the second discharge ports 22. In addition, even if the liquid LQ is present in the vicinity of the second discharge ports 22, the gas G supplied via the gas supply ports 60 can blow that liquid LQ away. Furthermore, the supply operation of the gas G via the gas supply ports 60 may be performed when the discharge operation of the gas G via the second discharge ports 22 is not being performed.

In addition, in the present embodiment, the side surface 414S and a lower surface 414K each include a surface whereon the liquid repellent film Fr is formed; however, the side surface 414S, the lower surface 414K, or both, does not have to include a surface whereon the liquid repellent film Fr is formed.

<Eleventh Embodiment>

Figure 20:
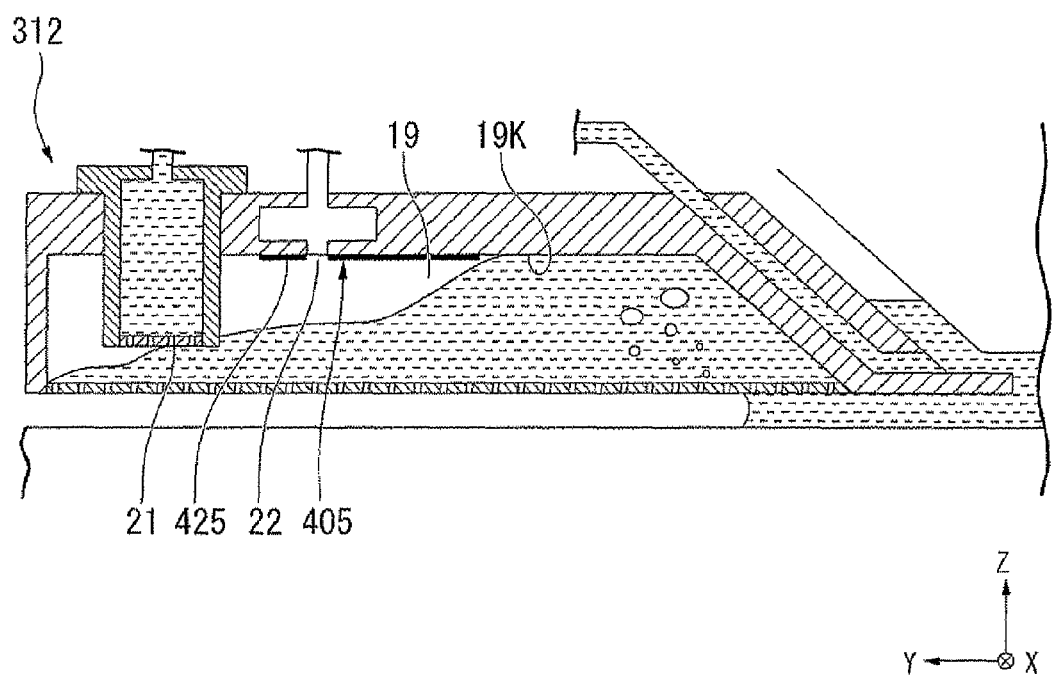
FIG. 20 is a partial side cross sectional view of the liquid immersion member according to an eleventh embodiment.

An eleventh embodiment will now be explained. FIG. 20 is a view that shows one example of a liquid immersion member 312 according to the eleventh embodiment. The liquid immersion member 312 comprises a hindering part 405, which comprises a liquid repellent part 425. In the present embodiment, the hindering part 405 does not comprise a projection.

The surface of the liquid repellent part 425 is liquid repellent with respect to the liquid LQ. The liquid repellent part 425 is disposed at least partly around the second discharge ports 22, and hinders the liquid LQ in the recovery passageway 19 from contacting the second discharge ports 22. A lyophilic inner surface 19K of the recovery passageway 19 is adjacent to the liquid repellent part 425. The inner surface 19K of the recovery passageway 19 is more lyophilic with respect to the liquid LQ than the liquid repellent part 425 is. The liquid repellent part 425 is disposed between the second discharge ports 22 and the lyophilic inner surface 19K.

Namely, the hindering part 405 of the present embodiment comprises: the liquid repellent part 425, which is disposed at least partly around the second discharge ports 22 and whose surface is liquid repellent with respect to the liquid LQ; and a lyophilic part (i.e., the inner surface 19K), which is disposed on the outer side of the liquid repellent part 425 with respect to the second discharge ports 22 and whose surface is lyophilic with respect to the liquid LQ.

In the present embodiment, too, the liquid LQ in the recovery passageway 19 can be hindered from contacting the second discharge ports 22.

<Twelfth Embodiment>

Figure 21A:
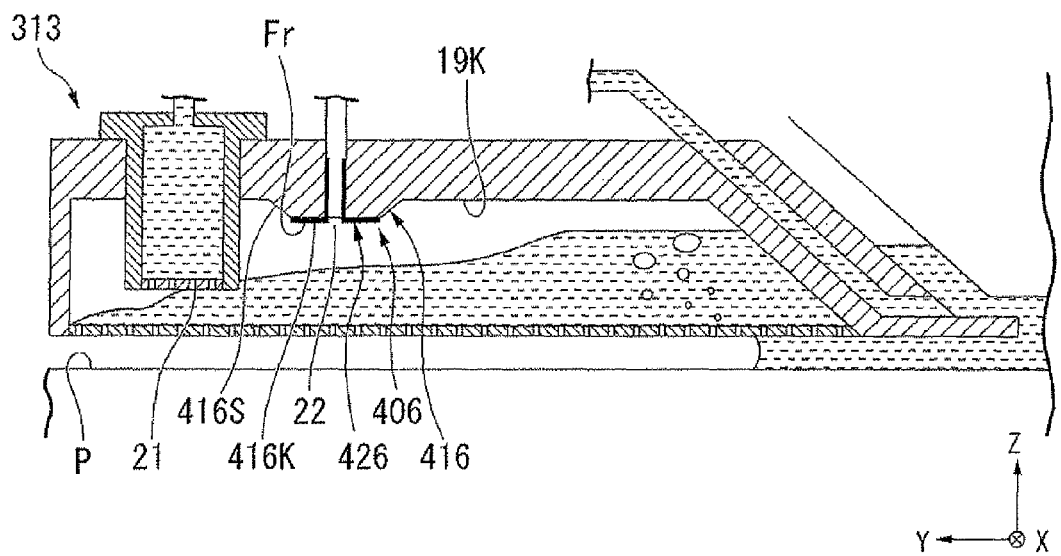
FIG. 21A is a partial side cross sectional view of the liquid immersion member according to a twelfth embodiment.
Figure 21B:
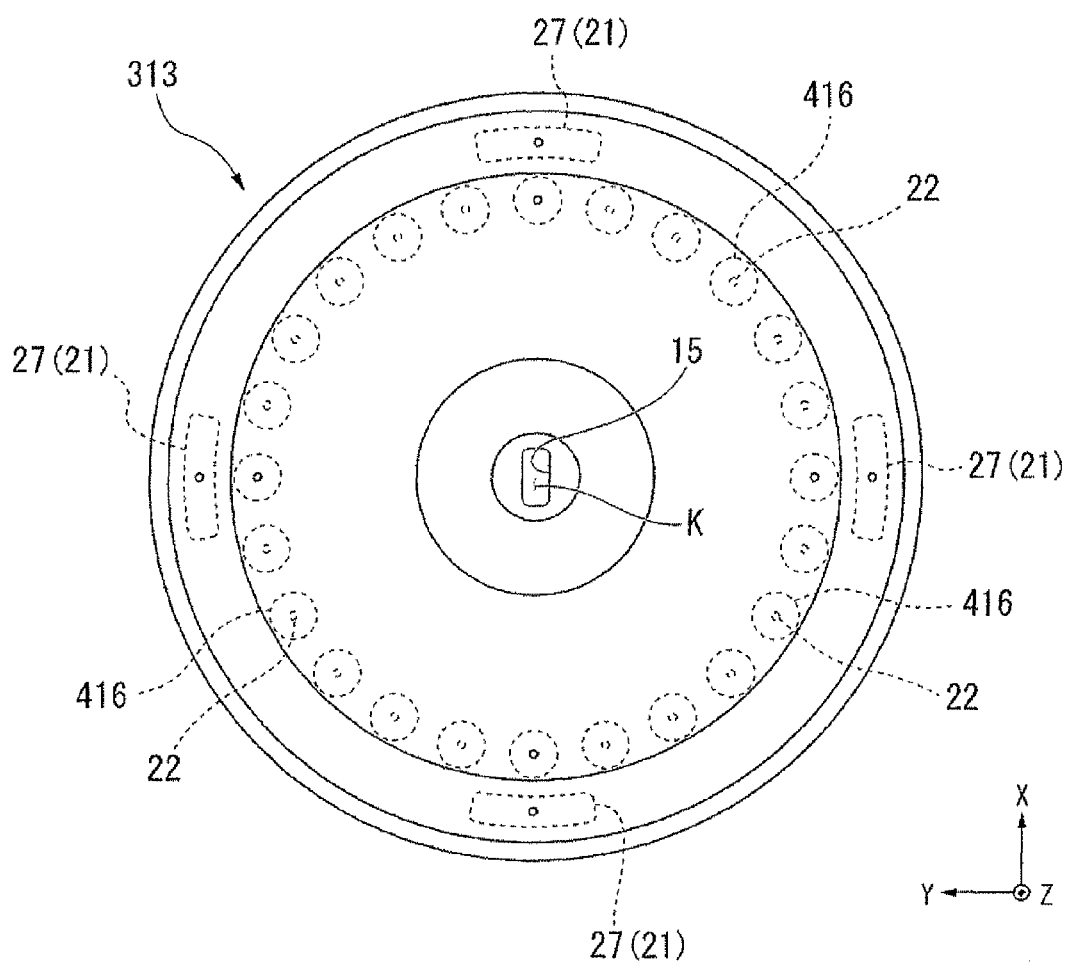
FIG. 21B is a partial top plan view of the liquid immersion member according to a twelfth embodiment.

A twelfth embodiment will now be explained. FIGS. 21A and 21B are views that show one example of a liquid immersion member 313 according to the twelfth embodiment. FIG. 21A is a partial side cross sectional view of the liquid immersion member 313, and FIG. 21B is a plan view of the liquid immersion member 313, viewed from above.

The liquid immersion member 313 comprises a hindering part 406, which comprises protruding parts 416 and liquid repellent parts 426. The protruding parts 416 project downward in the recovery passageway 19. The second discharge ports 22 are disposed at the tips of the downward projecting protruding parts 416.

Each of the protruding parts 416 has: a lower surface 416K, which is disposed below the downward facing inner surface 19K of the recovery passageway 19; and an inclined surface 416S, which is disposed around the lower surface 416K. Each of the lower surfaces 416K is substantially flat. Each of the lower surfaces 416K is substantially parallel to the XY plane. Furthermore, at least part of each of the lower surfaces 416K may be tilted with respect to the XY plane. Each of the second discharge ports 22 is disposed in substantially the center of the corresponding lower surface 416K, and each of the liquid repellent parts 426 is provided on the corresponding lower surface 416K and around the corresponding second discharge port 22. Each of the inclined surfaces 416S is inclined upward toward the outer side with respect to the corresponding second discharge port 22.

As shown in FIG. 21B, the protruding parts 416 are disposed around the optical path K. Each of the second discharge ports 22 is disposed in the corresponding protruding part 416.

In the present embodiment, too, the liquid LQ in the recovery passageway 19 can be hindered from contacting the second discharge ports 22.

<Thirteenth Embodiment>

Figure 22:
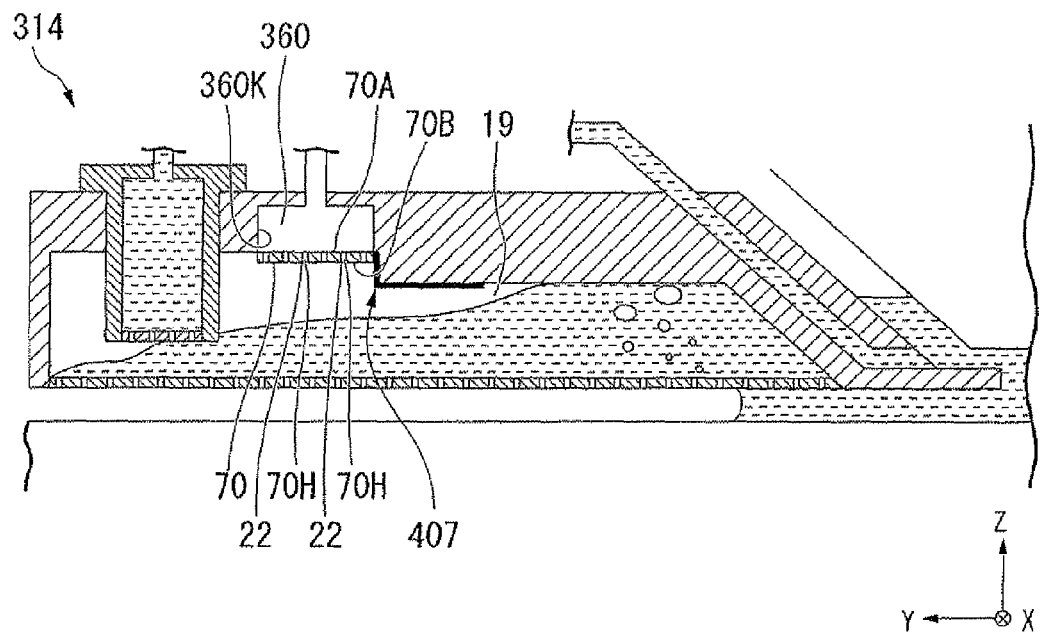
FIG. 22 is a partial side cross sectional view of the liquid immersion member according to a thirteenth embodiment.

A thirteenth embodiment will now be explained. FIG. 22 is a partial side cross sectional view of an immersion member 314 according to the thirteenth embodiment. The present embodiment is a modified example of the seventh embodiment, which was explained referencing FIG. 16. In FIG. 22, the liquid immersion member 314 comprises a third member 70, which has: a fifth surface 70B, which faces the recovery passageway 19; a sixth surface 70A, which faces a direction other than the direction faced by the fifth surface 70B; and a plurality of holes 70H, which connect the fifth surface 70B and the sixth surface 70A. In the present embodiment, each of the second discharge ports 22, which is for discharging the gas G from the recovery passageway 19, includes the holes 70H of the corresponding third member 70. Each of the third members 70 is a porous member that has a plurality of the holes 70H. Furthermore, each of the third members 70 may be a mesh filter.

In the present embodiment, the third members 70 are disposed in openings 360K at the lower ends of passageway 360. In the present embodiment, the third members 70 are plate shaped members. Each of the fifth surfaces 70B is one surface of the corresponding third member 70, and each of the sixth surfaces 70A is the other surface of the corresponding third member 70. In the present embodiment, the third members 70 are disposed in the openings 360K such that the fifth surfaces 70B face the recovery passageway 19 and the sixth surfaces 70A face the passageway 360. In the present embodiment, the fifth surfaces 70B and the sixth surfaces 70A are substantially parallel. The third members 70 are disposed in the openings 360K such that the sixth surfaces 70A face the +Z direction and the fifth surfaces 70B face the opposite direction (i.e., the −Z direction) to that faced by the sixth surfaces 70A. In addition, in the present embodiment, the third members 70 are disposed in the openings 360K such that the fifth surfaces 70B and the sixth surfaces 70A are substantially parallel to the XY plane.

In the explanation below, the fifth surfaces 70B are called the lower surfaces 70B where appropriate, and the sixth surfaces 70A are called the upper surfaces 70A where appropriate.

Furthermore, the lower surfaces 70B and the upper surfaces 70A may be nonparallel. In addition, at least part of each of the lower surfaces 70B may be tilted with respect to the XY plane and may include a curved surface. In addition, at least part of each of the upper surfaces 70A may be tilted with respect to the XY plane and may include a curved surface.

The holes 70H are disposed such that they connect each of the lower surfaces 70B to the corresponding upper surface 70A. The fluid (i.e., the fluid containing the gas G or the liquid LQ, or both) can flow through the holes 70H of the third members 70. In the present embodiment, the second discharge ports 22 include the openings at the lower ends of the holes 70H on the side of the lower surfaces 70B. Each of the lower surfaces 70B is disposed around the lower ends of the corresponding holes 70H, and each of the upper surfaces 70A is disposed around the upper ends of the corresponding holes 70H.

The passageway 360 is connected to the holes 70H (i.e., the second discharge port 22) of the corresponding third member 70. The third members 70 discharge the gas G from the recovery passageway 19 that the lower surfaces 70B face via the holes 70H (i.e., the second discharge ports 22). The gas G discharged via the holes 70H of the third members 70 flows through the passageway 360.

In the present embodiment, the pressure differential between the recovery passageway 19 that the lower surfaces 70B face and the passageway 360 (i.e., the spaces) that the upper surfaces 70A face is adjusted such that the discharge of the liquid LQ via the second discharge ports 22 is hindered.

In the present embodiment, the pressure differential between the spaces on the side of the upper surfaces 70A (i.e., the passageway 360) and the space on the side of the lower surfaces 70B (i.e., the recovery passageway 19) is adjusted such that substantially only the gas G is discharged via the holes 70H of the third members 70.

Figure 23:
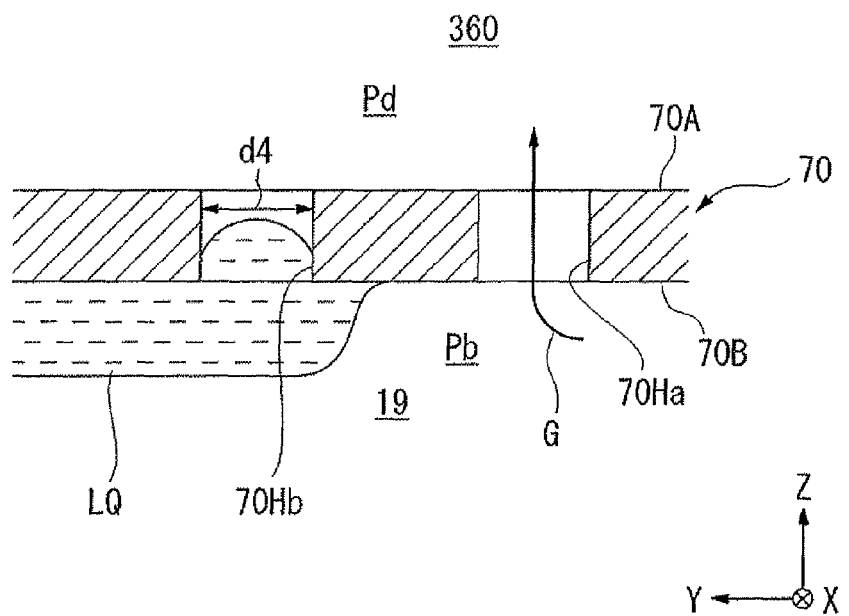
FIG. 23 is a schematic drawing that shows one example of a state wherein a second discharge port according to the thirteenth embodiment discharges a gas.

The text below explains the principle of a gas discharge operation via the second discharge ports 22 (i.e., the holes 70H), referencing FIG. 23. FIG. 23 is a partial enlarged cross sectional view of one of the second discharge ports 22, and is a schematic drawing for explaining the gas discharge operation, which is performed via the second discharge ports 22.

In FIG. 23, the gas space and the liquid space are formed in the recovery passageway 19, which the lower surface 70B of the third member 70 faces. In FIG. 23, the space that the lower end of a hole 70Ha of the third member 70 faces is the gas space, and the space that the lower end of a hole 70Hb of the third member 70 faces is the liquid space. In addition, the passageway 360 is formed on the upper side of the third member 70.

An adjustment is performed such that the condition below is satisfied.

$$(4 \times \gamma \times \cos \theta 4)/d4 < (Pd - Pb) \quad (3)$$

Therein, Pb is the pressure in the liquid space that the lower end of the hole 70Hb faces (i.e., the pressure on the lower surface 70B side), Pd is the pressure in the passageway 360 (i.e., the gas space) on the upper side of the third member 70 (i.e., the pressure on the upper surface 70A side), d4 is the dimension (i.e., the pore size or the diameter) of each of the holes 70Ha, 70Hb, θ4 is the contact angle of the liquid LQ with respect to the third member 70 (i.e., the inner surface of each of the holes 70H), and γ is the surface tension of the liquid LQ.

In this case, the contact angle θ4 of the liquid LQ with respect to the third member 70 (i.e., the inner surface of each of the holes 70H) satisfies the condition below.

$$\theta 4 > 90° \quad (4)$$

If the above condition holds, then, even if the liquid space is formed on the lower side of the hole 70Hb (i.e., the recovery passageway 19 side), the liquid LQ in the liquid space on the lower side of the third member 70 is hindered from moving to (i.e., flowing into) the passageway 360 on the upper side of the third member 70 via the hole 70Hb. Namely, adjusting the dimension d of the third member 70, the contact angle θ4 of the liquid LQ with respect to the surface of the third member 70, the surface tension y of the liquid LQ, and the pressures Pb, Pd such that the above condition is satisfied makes it possible to keep the interface between the liquid LQ and the gas G on the inner side of the hole 70Hb and to hinder the liquid LQ from flowing from the liquid space into the passageway 360 via the second hole 70Hb. In the present embodiment, too, a hindering part 407 that comprises a projection and a liquid repellent part is formed, and the gas space is formed on the lower side of the hole 70Ha (i.e., on the recovery passageway 19 side), which makes it possible to discharge substantially only the gas G via the hole 70Ha.

In the present embodiment, at least part of the surface of each of the third members 70 is liquid repellent with respect to the liquid LQ. In the present embodiment, the contact angle θ4 is 90° or greater. The contact angle θ4 may be 100° or greater, or 110° or greater.

Thus, in the present embodiment, by controlling the pressure differential between the passageway 360 on the upper sides of the third members 70 (i.e., the gas spaces) and the recovery passageway 19 on the lower sides of the third members 70 (i.e., the liquid space), namely, the pressure differential between the side of the upper surfaces 70A and the side of the lower surfaces 70B, such that the above condition is satisfied, substantially only the gas G is discharged via the holes 70H of the third members 70. Thereby, it is possible to stably continue the discharge of the gas G from the recovery passageway 19.

<Fourteenth Embodiment>

Figure 24:
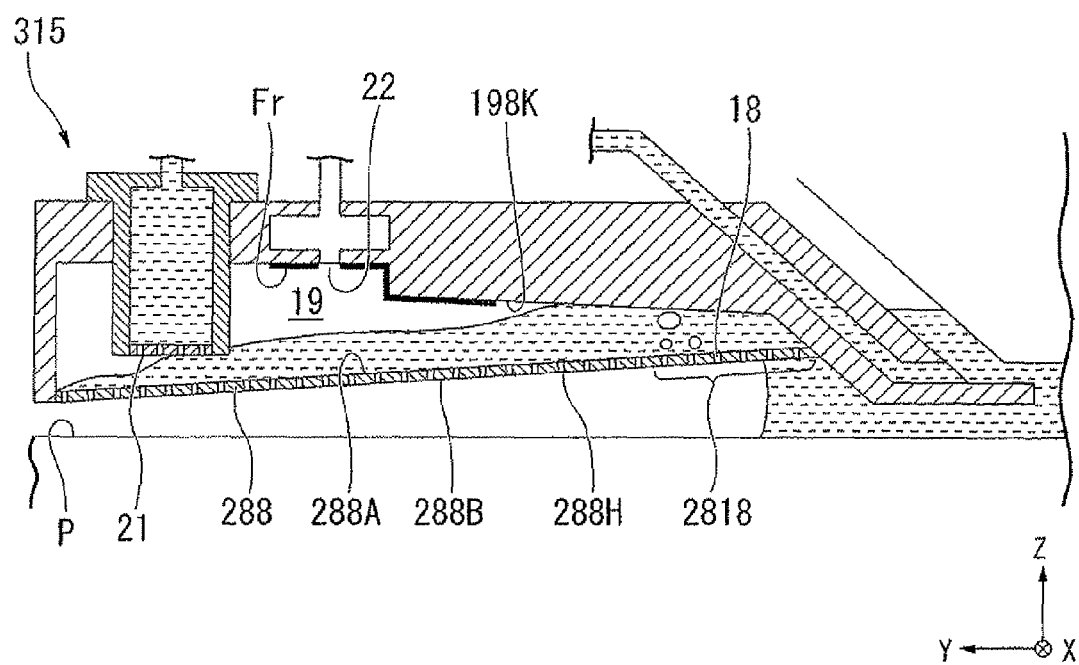
FIG. 24 is a partial side cross sectional view of the liquid immersion member according to a fourteenth embodiment.

A fourteenth embodiment will now be explained. FIG. 24 is a partial side cross sectional view of an immersion member 315 according to the fourteenth embodiment. The present embodiment is also a modified example of the seventh embodiment that was explained referencing FIG. 16. In FIG. 24, the liquid immersion member 315 comprises a first member 288, which has: an upper surface 288A; a lower surface 288B; and a plurality of holes 288H that connect the upper surface 288A and the lower surface 288H. The recovery ports 18 include the holes 288H.

In the present embodiment, at least part of the upper surface 288A is disposed such that at least part of the upper surface 288A is tilted with respect to the XY plane (i.e., the horizontal plane) in the radial directions with respect to the optical path K. In the example shown in FIG. 24, all of the upper surface 288A is disposed such that all of the upper surface 288A is tilted with respect to the horizontal plane in the radial directions with respect to the optical path K. The upper surface 288A is tilted such that the portion near the optical path K is higher than the portion far from the optical path K. Furthermore, part of the upper surface 288A may be tilted such that the portion near the optical path K is lower than the portion far from the optical path K.

In the present embodiment, at least part of the lower surface 288B is disposed such that it is tilted with respect to the XY plane (i.e., the horizontal plane) in the radial directions with respect to the optical path K. In the example shown in FIG. 24, all of the lower surface 288B is disposed such that it is tilted with respect to the horizontal plane in the radial directions with respect to the optical path K. The lower surface 288B is tilted such that the portion near the optical path K is higher than the portion far from the optical path K. Furthermore, part of the lower surface 288B may be tilted such that the portion near the optical path K is lower than the portion far from the optical path K.

Thereby, in the recovery passageway 19, the liquid LQ recovered via a first portion 2818 is guided smoothly to the first discharge ports 21, which are disposed on the outer side of the first portion 2818 in the radial directions with respect to the optical path K.

Furthermore, in the present embodiment, just one of the surfaces, namely, the upper surface 288A or the lower surface 288B, may be tilted as discussed above.

In addition, in FIG. 24, the inner surface that forms the recovery passageway 19 has a lower surface 198K, which opposes the upper surface 288A of the first member 288. At least part of the lower surface 198K is disposed such that at least part of the lower surface 198K is tilted with respect to the XY plane (i.e., the horizontal plane) in the radial directions with respect to the optical path K. In the example shown in FIG. 24, the lower surface 198K is tilted such that the portion near the optical path K is lower than the portion far from the optical path K. Thereby, in the recovery passageway 19, the upward flow of the gas G is promoted, and the gas G is discharged smoothly from the recovery passageway 19 via the second discharge port 22, which is disposed above the lower surface 198K and at a position that is more spaced apart from the optical path K than the lower surface 198K is. Accordingly, in the recovery passageway 19, the separation of the liquid LQ and the gas G is promoted and contact between the second discharge port 22 and the liquid LQ is hindered.

Furthermore, at least part of the lower surface 198K may be tilted such that the portion near the optical path K is higher than the portion far from the optical path K. In addition, in FIG. 24, the lower surface 198K may be parallel to the XY plane (i.e., the horizontal plane).

<Fifteenth Embodiment>

Figure 25:
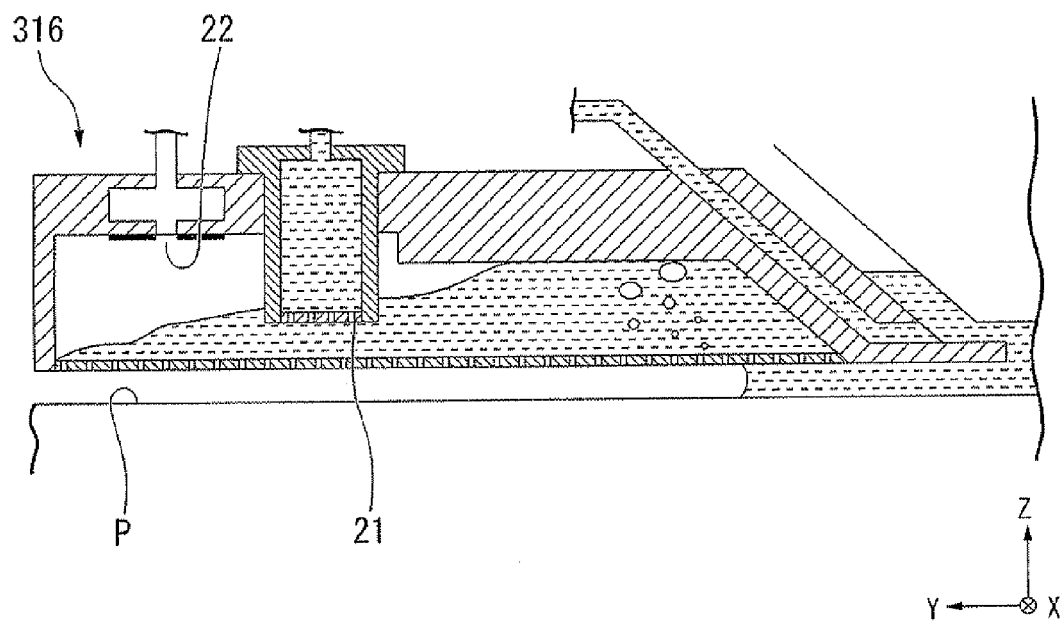
FIG. 25 is a partial side cross sectional view of the liquid immersion member according to a fifteenth embodiment.

A fifteenth embodiment will now be explained. FIG. 25 is a partial side cross sectional view of an immersion member 316 according to the fifteenth embodiment. The liquid immersion member 316 has the first discharge ports 21, which discharge the liquid LQ, and the second discharge ports 22, which discharge the gas G. The first discharge ports 21 are disposed on the inner side of the second discharge ports 22 in the radial directions with respect to the optical path K. In the liquid immersion member 316 according to the present embodiment, too, contact between the liquid LQ in the recovery passageway 19 and the second discharge ports 22 is hindered, and thereby the discharge of the liquid LQ via the second discharge ports 22 is hindered.

<Sixteenth Embodiment>

Figure 26:
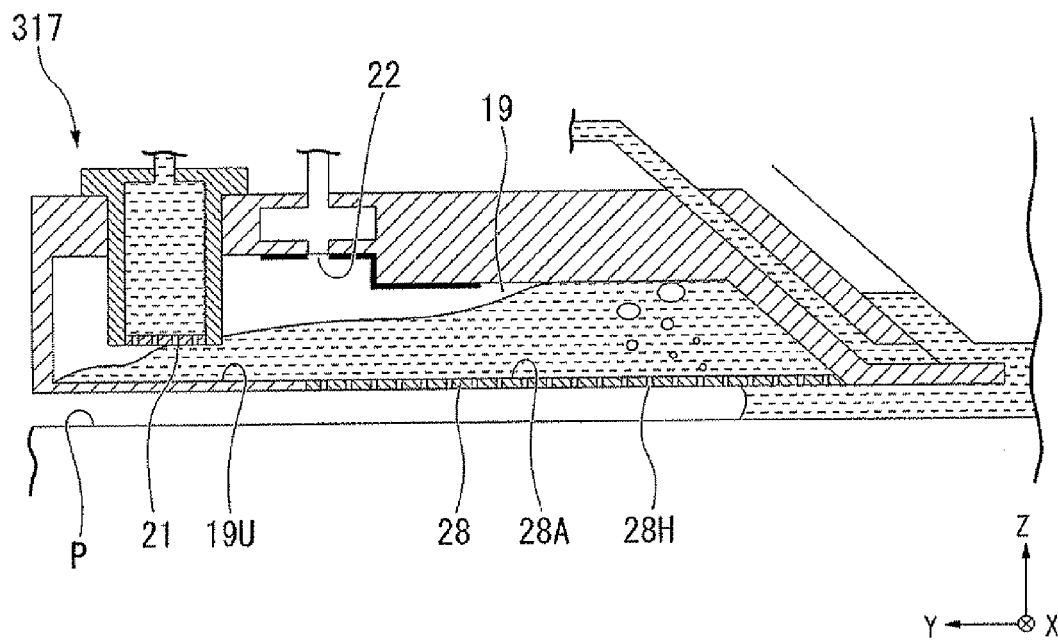
FIG. 26 is a partial side cross sectional view of the liquid immersion member according to a sixteenth embodiment.

A sixteenth embodiment will now be explained. FIG. 26 is a partial side cross sectional view of an immersion member 317 according to the sixteenth embodiment. In the first through fifteenth embodiments discussed above, it is given that the first discharge ports 21 oppose the upper surface (28A and the like) of the first member (28 and the like). In the liquid immersion member 317 according to the sixteenth embodiment, the first discharge ports 21 do not oppose the upper surface 28A of the first member 28.

In FIG. 26, the first discharge ports 21 oppose an inner surface 19U of the recovery passageway 19. The inner surface 19U is flat. In the present embodiment, too, the first discharge ports 21 can discharge the liquid LQ from the recovery passageway 19, and the second discharge port 22 can discharge the gas G from the recovery passageway 19. The first discharge ports 21 of the liquid immersion member 317 shown in FIG. 26 are disposed on the outer side of the second discharge port 22 in radial directions with respect to the optical path K. The first discharge ports 21 are disposed on the outer side of the recovery ports 18 (i.e., the first member 28) in radial directions with respect to the optical path K.

Furthermore, in the embodiment shown in FIG. 26, the second discharge port 22 likewise does not have to oppose the upper surface (28A and the like) of the first member (28 and the like). In this case, as in the fifteenth embodiment, the second discharge port 22 may be disposed on the outer side of the first discharge ports 21 in the radial directions with respect to the optical path K.

Figure 27:
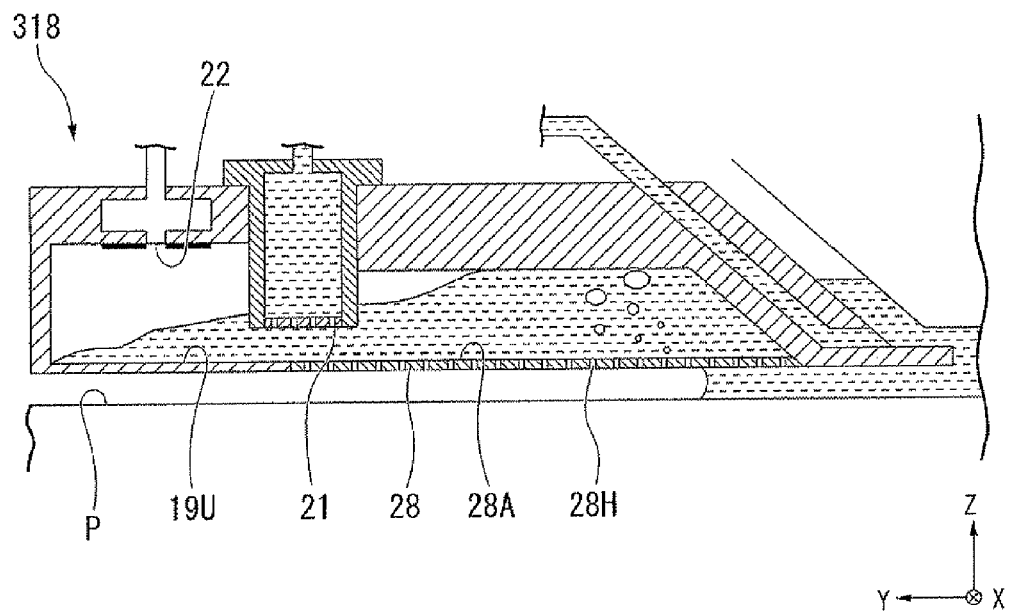
FIG. 27 is a partial side cross sectional view of the liquid immersion member according to the sixteenth embodiment.

As in a liquid immersion member 318 shown in FIG. 27, at least part of each of the first discharge ports 21 may oppose the upper surface 28A of the first member 28. The first discharge ports 21 of the liquid immersion member 318 shown in FIG. 27 are disposed on the inner side of the second discharge port 22 in the radial directions with respect to the optical path K. In FIG. 27, the second discharge port 22 opposes the inner surface 19U. The second discharge port 22 is disposed on the outer side of the recovery ports 18 (i.e., the first member 28) in radial directions with respect to the optical path K. In the embodiment shown in FIG. 27, the second discharge port 22 may be disposed on the inner side of the first discharge ports 21 in the radial directions with respect to the optical path K. Namely, the second discharge port 22 may be nearer to the optical path K than the first discharge ports 21 are.

<Seventeenth Embodiment>

A seventeenth embodiment will now be explained. In each of the embodiments discussed above, it is given that the first discharge ports 21 and the second discharge ports 22 are disposed on the outer side of at least some of the recovery ports 18 in the radial directions with respect to the optical path K. A characteristic feature of the seventeenth embodiment is that the first discharge ports 21 or the second discharge ports 22, or both, are disposed on the inner side of the recovery ports 18 (i.e., the first member 28) in the radial directions with respect to the optical path K. Namely, in the present embodiment, the first discharge ports 21 or the second discharge ports 22, or both, are nearer the optical path K than the recovery ports 18 (i.e., the first member 28) are.

Figure 28:
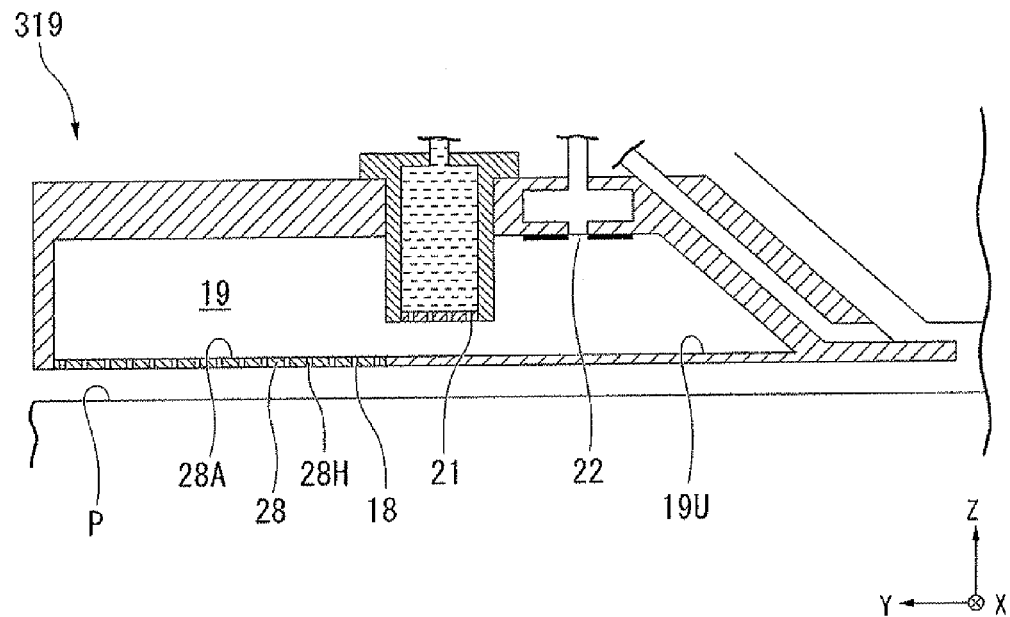
FIG. 28 is a partial side cross sectional view of the liquid immersion member according to a seventeenth embodiment.

FIG. 28 is a partial side cross sectional view of a liquid immersion member 319 according to the present embodiment. In FIG. 28, the first discharge ports 21 and the second discharge port 22 of the liquid immersion member 319 are disposed on the inner side of the recovery ports 18 (i.e., the first member 28) in the radial directions with respect to the optical path K. The first discharge ports 21 of the liquid immersion member 319 are disposed on the outer side of the second discharge port 22 in radial directions with respect to the optical path K. The first discharge ports 21 and the second discharge port 22 oppose the inner surface 19U of the recovery passageway 19.

Furthermore, in FIG. 28, the first discharge ports 21 may oppose the upper surface 28A of the first member 28. In this case, the first discharge ports 21 may oppose the upper surface 28A of the first portion 281 of the first member 28 or the upper surface 28A of the second portion 282 of the first member 28.

Figure 29:
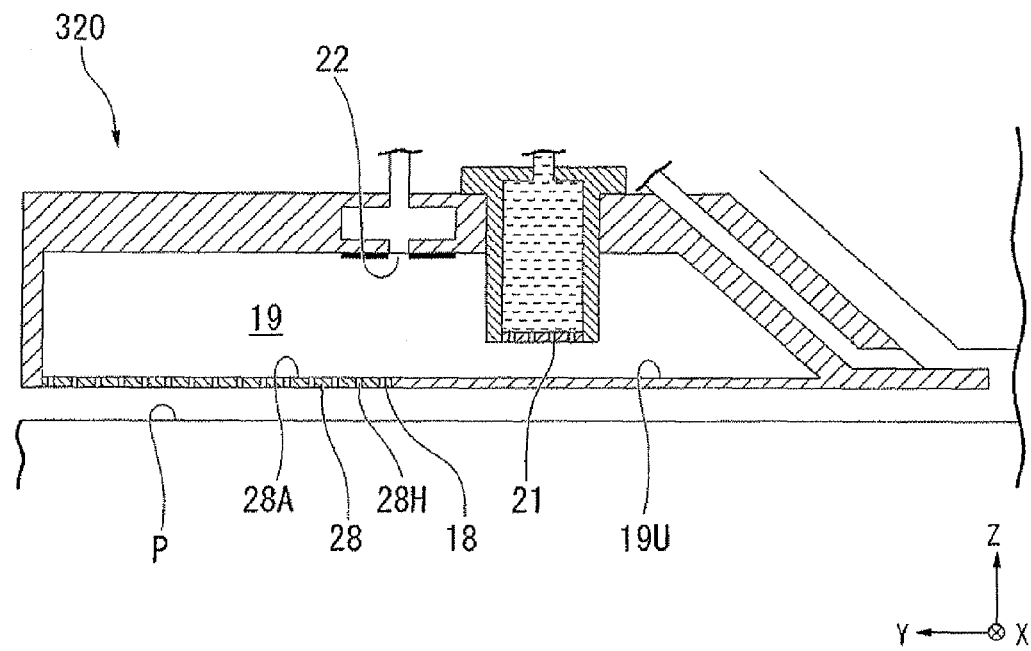
FIG. 29 is a partial side cross sectional view of the liquid immersion member according to the seventeenth embodiment.

FIG. 29 is a partial side cross sectional view of a liquid immersion member 320 according to the present embodiment. In FIG. 29, the first discharge ports 21 and the second discharge port 22 of the liquid immersion member 320 are disposed on the inner side of the recovery ports 18 (i.e., the first member 28) in the radial directions with respect to the optical path K. In the present embodiment, the first discharge ports 21 of the liquid immersion member 320 are disposed on the inner side of the second discharge port 22 in radial directions with respect to the optical path K. Furthermore, in FIG. 29, the second discharge port 22 may oppose the upper surface 28A of the first member 28. In this case, the second discharge port 22 may oppose the upper surface 28A of the first portion 281 of the first member 28 or the upper surface 28A of the second portion 282 of the first member 28.

Figure 30:
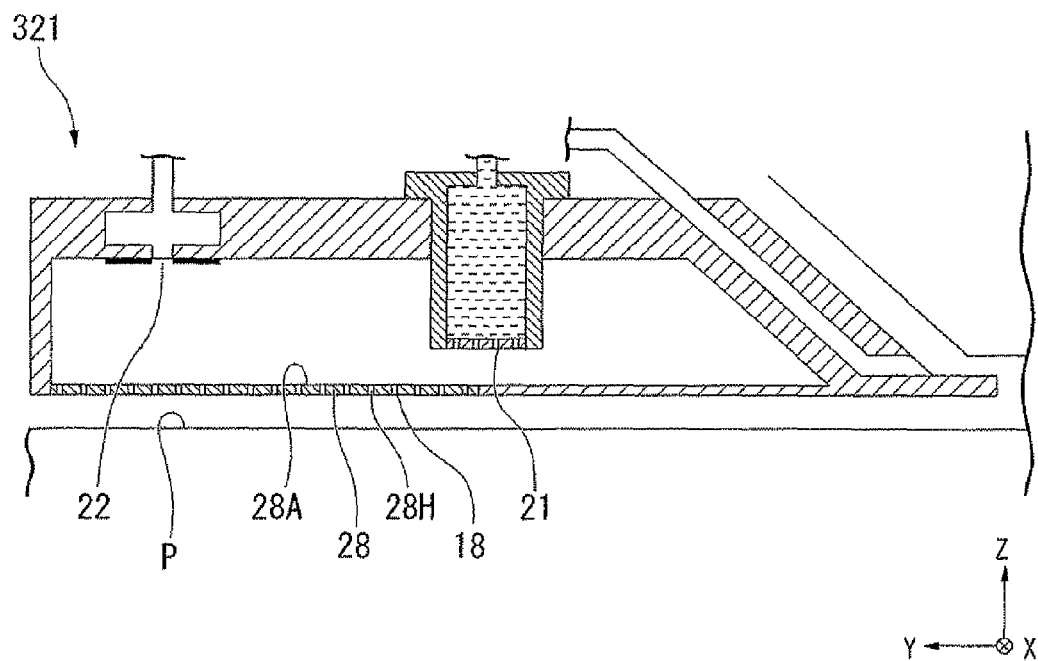
FIG. 30 is a partial side cross sectional view of the liquid immersion member according to the seventeenth embodiment.

In addition, as in a liquid immersion member 321 shown in FIG. 30, some of the first discharge ports 21 may be disposed such that they oppose the upper surface 28A of the first member 28 and some may be disposed such that they do not. Furthermore, in the example shown in FIG. 30, the second discharge port 22 opposes the upper surface 28A of the first member 28 (i.e., the second portion 282), but it does not have to oppose the upper surface 28A. In this case, the first discharge ports 21 may be disposed on the inner side of the second discharge port 22 in the radial directions with respect to the optical path K.

In addition, some of the second discharge ports 22 may be disposed such that they oppose the upper surface 28A of the first member 28 and some may be disposed such that they do not. In this case, the first discharge ports 21 may oppose the upper surface 28A of the first member 28 (i.e., the second portion 282), but they do not have to oppose the upper surface 28A. In addition, the first discharge ports 21 may be disposed on the inner side or the outer side of the second discharge ports 22 in the radial directions with respect to the optical path K.

<Eighteenth Embodiment>

Figure 31:
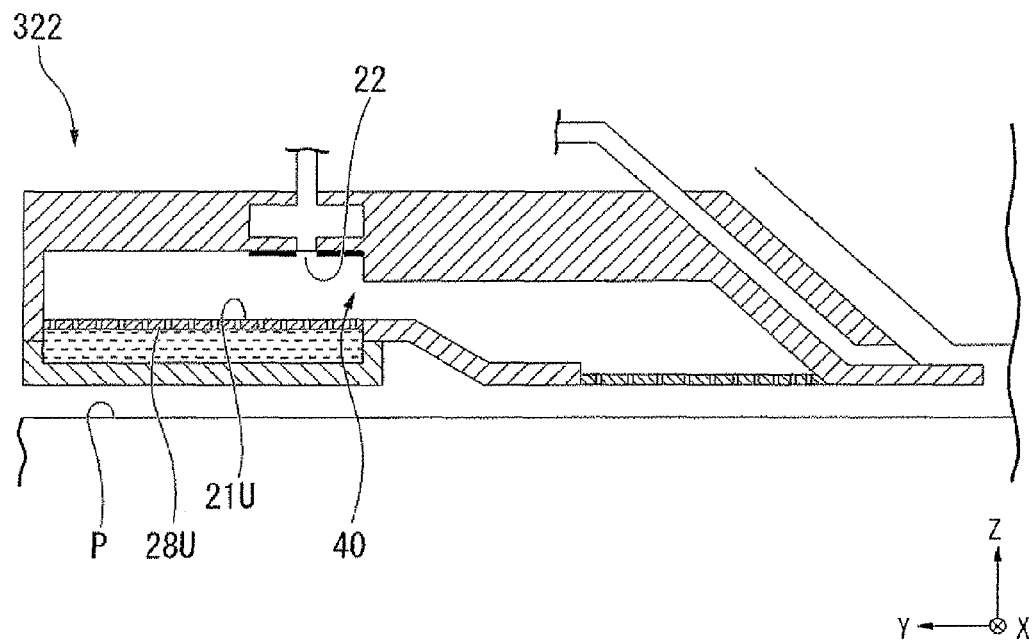
FIG. 31 is a partial side cross sectional view of the liquid immersion member according to an eighteenth embodiment.

An eighteenth embodiment will now be explained. FIG. 31 is a partial side cross sectional view of an immersion member 322 according to the eighteenth embodiment. The liquid immersion member 322 has first discharge ports 21U, which do not face in the −Z direction (i.e., downward). In the present embodiment, the first discharge ports 21U of the liquid immersion member 322 face upward. The first discharge ports 21U are disposed in a first member 28U. As in the first discharge ports 21 discussed above, the first discharge ports 21U recover the liquid LQ while hindering the inflow of the gas G. In FIG. 31, the second discharge port 22 faces downward.

Furthermore, at least a part of at least one of the plurality of first discharge ports 21U may be disposed such that they face the inner side in the radial directions with respect to the optical path K. In addition, at least a part of at least one of the first discharge ports 21U may be disposed such that they face the outer side in the radial directions with respect to the optical path K. In addition, the direction faced by some of the first discharge ports 21U among the plurality of the first discharge ports 21U and the direction faced by some other of the first discharge ports 21U among the plurality of the first discharge ports 21U may be different. For example, some of the first discharge ports 21 may face downward and some may face upward. Alternatively, some of the first discharge ports 21 may face the inner side in the radial directions with respect to the optical path K, and some may face the outer side in the radial directions with respect to the optical path K.

Furthermore, in each of the embodiments discussed above, it is given that the second discharge ports 22 face downward; however, the second discharge ports 22 do not have to face downward. For example, the second discharge ports 22 may face upward or may face the inner side or the outer side in the radial directions with respect to the optical path K. In addition, the direction faced by some of the second discharge ports 22 and the direction faced by some other of the second discharge ports 22 may be different.

<Nineteenth Embodiment>

Figure 32:
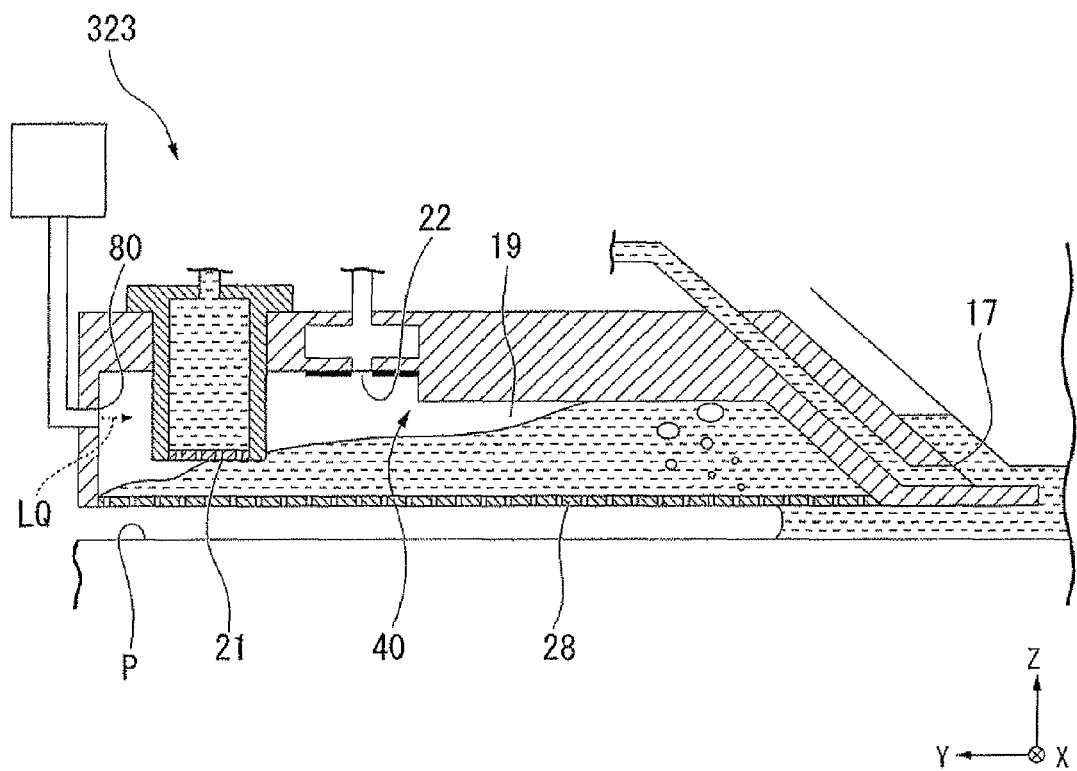
FIG. 32 is a partial side cross sectional view of the liquid immersion member according to a nineteenth embodiment.

A nineteenth embodiment will now be explained. FIG. 32 is a partial side cross sectional view of an immersion member 323 according to the nineteenth embodiment. The liquid immersion member 323 has supply ports 80, which are capable of supplying the liquid LQ to the recovery passageway 19. The supply ports 80 that supply the liquid LQ to the recovery passageway 19 are different from the supply ports 17 that supply the liquid LQ to the optical path K. In the present embodiment, the plurality of supply ports 80 is disposed around the optical path K.

The supply ports 80 are disposed on the outer side of the first discharge ports 21 in radial directions with respect to the optical path K. The supply ports 80 are disposed in the vicinities of the first discharge ports 21. The supply ports 80 are disposed above the first discharge ports 21.

Furthermore, the supply ports 80 may be disposed in the vicinities of the second discharge ports 22. Furthermore, the supply ports 80 may be disposed below the first discharge ports 21.

The temperature of at least part of the liquid immersion member 323 may be adjusted by the liquid LQ supplied to the recovery passageway 19 via the supply ports 80; alternatively, temperature fluctuations in at least part of the liquid immersion member 323 may be hindered by the liquid LQ supplied to the recovery passageway 19 via the supply ports 80. If the liquid LQ is recovered together with the gas G via the recovery ports 18, then temperature fluctuations in at least part of the liquid immersion member 323 owing to the vaporization of the liquid LQ may be hindered by the liquid LQ supplied to the recovery passageway 19 via the supply ports 80. In addition, the pressure in the recovery passageway 19 (e.g., the pressure in the gas space) and the like may be adjusted by supplying the liquid LQ to the recovery passageway 19 via the supply ports 80. In addition, any foreign matter present in the recovery passageway 19 may be eliminated by supplying the liquid LQ to the recovery passageway 19 via the supply ports 80. For example, the liquid LQ supplied to the recovery passageway 19 via the supply ports 80 may adjust the flow of the liquid LQ in the recovery passageway 19 and guide any foreign matter present in the recovery passageway 19 to the first discharge ports 21 or the second discharge ports 22, or both.

In addition, the flow of the liquid LQ in the recovery passageway 19 may be adjusted by supplying the liquid LQ to the recovery passageway 19 via the supply ports 80. For example, the supply ports 80 may be provided in the recovery passageway 19 in the vicinities of spaces wherein the flow of the liquid LQ in the recovery passageway 19 that was recovered via the recovery ports 18 is slow (i.e., stagnation spaces), and the flow of the liquid LQ in the recovery passageway 19 may be adjusted and any foreign matter in the stagnation spaces may be eliminated by supplying the liquid LQ to the stagnation spaces via the supply ports 80. In addition, the flow of the liquid LQ in the recovery passageway 19 may be adjusted by adjusting the flow velocity of the liquid LQ (i.e., the amount of the liquid LQ supplied per unit of time) supplied via the supply ports 80.

In addition, a configuration may be adopted wherein, if the recovery passageway 19 contains a space wherein the liquid LQ recovered via the recovery ports 18 flows (i.e., the liquid space) and a space wherein the liquid LQ recovered via the recovery ports 18 does not flow (i.e., the gas space), then the liquid LQ supplied via the supply ports 80 is supplied to that gas space.

In addition, the temperature of the liquid LQ supplied via the supply ports 80 may be different from that of the liquid LQ supplied via the supply ports 17. For example, the temperature of the liquid LQ supplied via the supply ports 80 may be higher or lower than that of the liquid LQ supplied via the supply ports 17. For example, if the temperature of at least part of the liquid immersion member 323 decreases owing to the vaporization of the liquid LQ as discussed above, then the temperature of the liquid LQ supplied via the supply ports 80 may be set higher than that of the liquid LQ supplied via the supply ports 17.

In addition, the temperature of the liquid LQ supplied via the supply ports 80 may be different from that of the liquid LQ recovered via the recovery ports 18 (i.e., the temperature of the liquid LQ that flows into the recovery passageway 19 via the recovery ports 18). For example, the temperature of the liquid LQ supplied via the supply ports 80 may be higher or lower than the temperature of the liquid LQ recovered via the recovery ports 18.

In addition, the temperature of the liquid immersion member 323 may be adjusted by adjusting the temperature of the liquid LQ supplied via the supply ports 80.

In addition, the type (i.e., the physical properties) of the liquid supplied via the supply ports 80 may be different from that of the liquid LQ supplied via the supply ports 17.

In addition, the gas may be supplied to the recovery passageway 19 via gas supply ports (not shown) other than the supply ports 80. By supplying the gas to the recovery passageway 19 via the gas supply ports, the temperature of at least part of the liquid immersion member 323 may be adjusted or temperature fluctuations in at least part of the liquid immersion member 323 may be hindered. In addition, by supplying the gas to the recovery passageway 19 via the gas supply ports, the pressure in the recovery passageway 19 (i.e., the pressure in the gas space) may be adjusted or the flow of the liquid LQ inside the recovery passageway 19 may be adjusted. In addition, the supply of the gas via the gas supply ports may be performed in parallel with the supply of the liquid LQ via the supply ports 80; alternatively, the supply of the gas via the gas supply ports does not have to be performed in parallel with the supply of the liquid LQ via the supply ports 80.

<Twentieth Embodiment>

Figure 33:
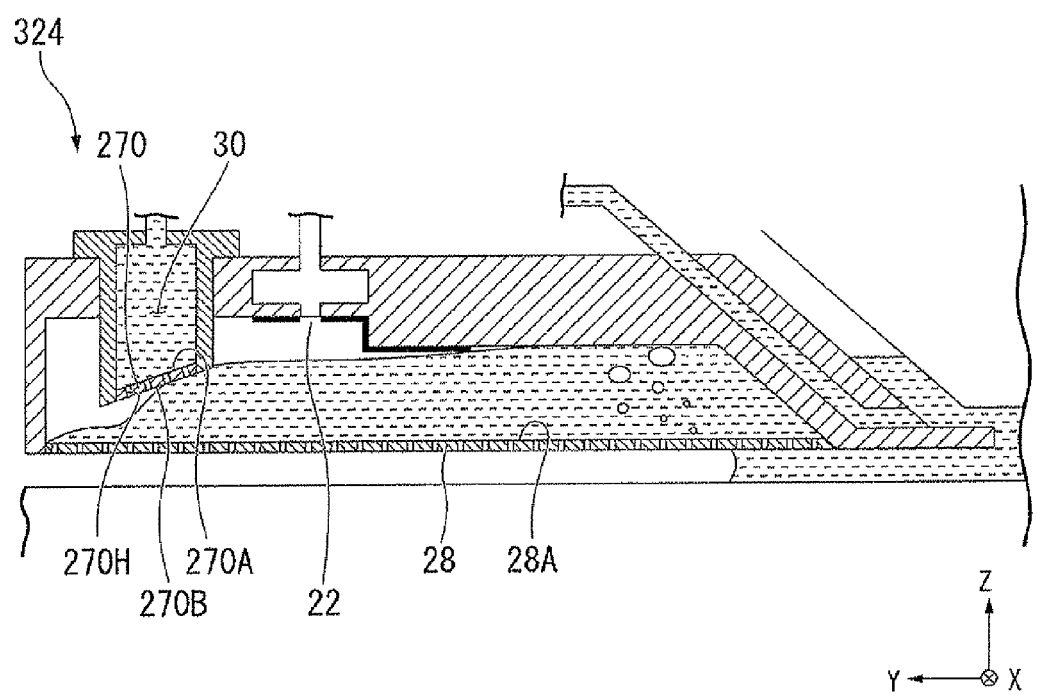
FIG. 33 is a partial side cross sectional view of the liquid immersion member according to a twentieth embodiment.
Figure 34A:
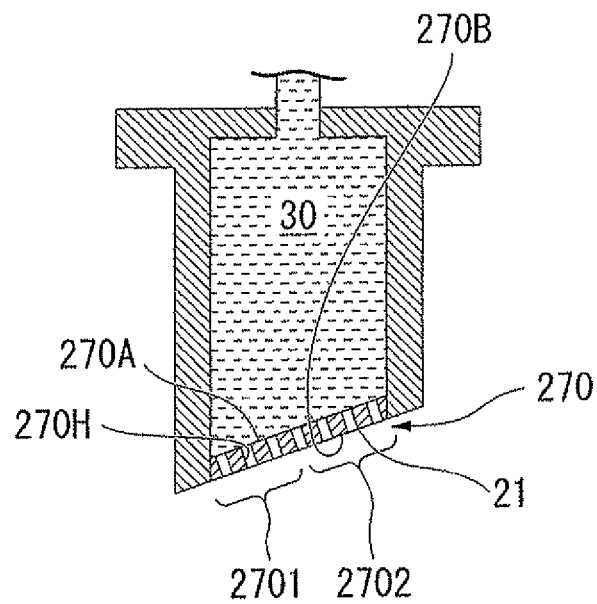
FIG. 34A is a partial side cross sectional view of the liquid immersion member according to the twentieth second embodiment.
Figure 34B:
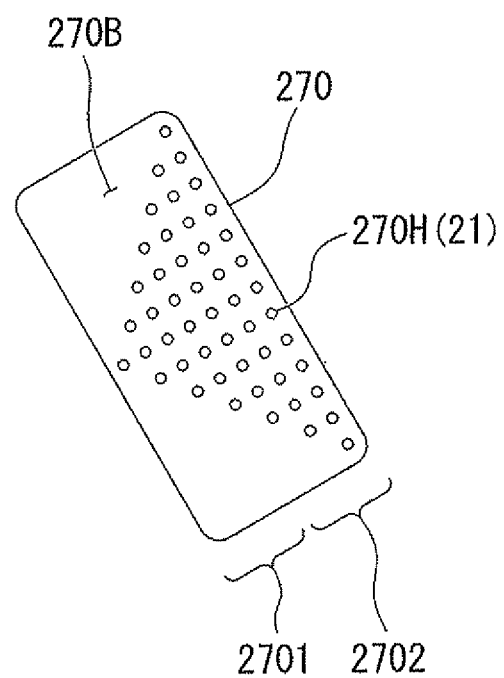
FIG. 34B is an enlarged view of the liquid immersion member according to a twelfth embodiment.

A twentieth embodiment will now be explained. FIG. 33 is a partial side cross sectional view of a liquid immersion member 324 according to the twentieth embodiment, and FIGS. 34A and 34B are enlarged views that show one example of a second member 270 according to the twentieth embodiment. FIG. 34A is a side cross sectional view of the vicinity of the second member 270, and FIG. 34B is a diagram of the second member 270, viewed from a lower surface 270B side.

In FIG. 33, FIGS. 34A and 34B, the second member 270 has a third portion 2701 and a fourth portion 2702, which is disposed at a position higher than the third portion 2701 and is capable of discharging a greater amount of the liquid LQ than the third portion 2701 is. The liquid LQ in the recovery passageway 19 is discharged via the first discharge ports 21 in the third portion 2701 or the first discharge ports 21 in the fourth portion 2702, or both.

The liquid discharge capacity per unit of area of the lower surface 270B of the second member 270 is higher in the fourth portion 2702 than in the third portion 2701. As shown in FIG. 34B, the percentage of the first discharge ports 21 (i.e., the holes 270H) per unit of area in the lower surface 270B is larger in the fourth portion 2702 than in the third portion 2701. In addition, the number of the first discharge ports 21 (i.e., the holes 270H) in the fourth portion 2702 is larger than the number of the first discharge ports 21 (i.e., the holes 270H) in the third portion 2701.

The fourth portion 2702 is disposed more spaced apart from the upper surface 28A of the first member 28 than the third portion 2701 is. In the present embodiment, the fourth portion 2702 is nearer the optical path K than the third portion 2701 is. In the present embodiment, at least part of the lower surface 270B of the second member 270 is nonparallel to the XY plane (i.e., the horizontal plane). An upper surface 270A faces a direction other than that faced by the lower surface 270B. In the present embodiment, the upper surface 270A faces the opposite direction to that faced by the lower surface 270B. In the present embodiment, the upper surface 270A and the lower surface 270B of the second member 270 are inclined surfaces that are inclined downward in the radial directions with respect to the optical path K. Furthermore, the fourth portion 2702 may be farther from the optical path K than the third portion 2701 is.

Because the second member 270 comprises the third portion 2701 and the fourth portion 2702, the second member 270 can contact the liquid LQ in the liquid space in the recovery passageway 19 even if, for example, the surface height (i.e., the water level or the liquid level) of the liquid space in the recovery passageway 19 varies. Accordingly, the second member 270 can continue to discharge the liquid LQ in the recovery passageway 19 continuously via the first discharge ports 21 in the third portion 2701 or the first discharge ports 21 in the fourth portion 2702, or both. Thereby, fluctuations in, for example, the pressure in each of the passageways 30 are hindered.

In the recovery passageway 19, if the surface height (i.e., the water level or the liquid level) of the liquid space is a first height and the liquid LQ in the liquid space contacts the third portion 2701 and not the fourth portion 2702, then the liquid LQ is discharged via the third portion 2701. Moreover, if the surface height of the liquid space in the recovery passageway 19 is a second height, which is higher than the first height, and the liquid LQ in the liquid space contacts both the third portion 2701 and the fourth portion 2702, then that liquid LQ is discharged via the third portion 2701 and the fourth portion 2702. Because the fourth portion 2702 is capable of discharging a greater amount of the liquid LQ than the third portion 2701 is, the amount of the liquid LQ discharged via the second member 270 increases if the surface height of the liquid space in the recovery passageway 19 increases. Moreover, if the surface height of the liquid space decreases, then the amount of the liquid LQ discharged via the second member 270 decreases. Accordingly, fluctuations in the height of the surface of the liquid space in the recovery passageway 19 can be hindered. Thereby, the second member 270 can continue to discharge the liquid LQ in the recovery passageway 19 continuously via the first discharge ports 21 in the third portion 2701 or the first discharge ports 21 in the fourth portion 2702, or both. Thereby, for example, a fluctuation of the pressure in each of the passageways 30 is hindered.

Figure 35A:
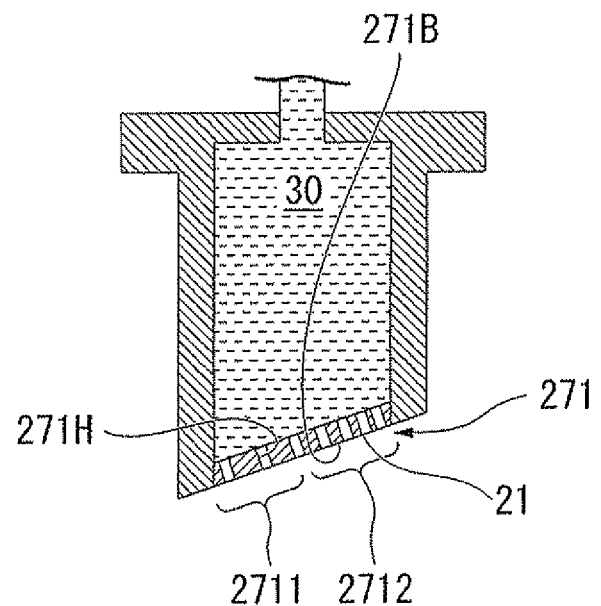
FIG. 35A is a partial side cross sectional view of the liquid immersion member according to the twentieth embodiment.
Figure 35B:
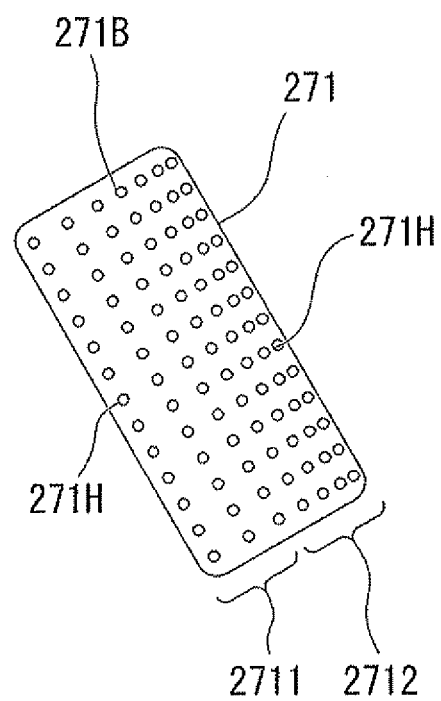
FIG. 35B is an enlarged view of the liquid immersion member according to a twelfth embodiment.

A second member 271 shown in FIGS. 35A and 35B comprises a third portion 2711 and a fourth portion 2712, which is disposed at a position higher than the third portion 2711 is and is capable of discharging a greater amount of the liquid LQ than the third portion 2711 is. In the second member 271, the spacing between adjacent holes 270H in the third portion 2711 is larger than the spacing between adjacent holes 271H in the fourth portion 2712. The percentage of the first discharge ports 21 (i.e., the holes 271H) per unit of area in a lower surface 271B is larger in the fourth portion 2712 than in the third portion 2711. In addition, the number of the first discharge ports 21 (i.e., the holes 271H) in the fourth portion 2712 is larger than the number of the first discharge ports 21 (i.e., the holes 271H) in the third portion 2711.

Figure 36A:
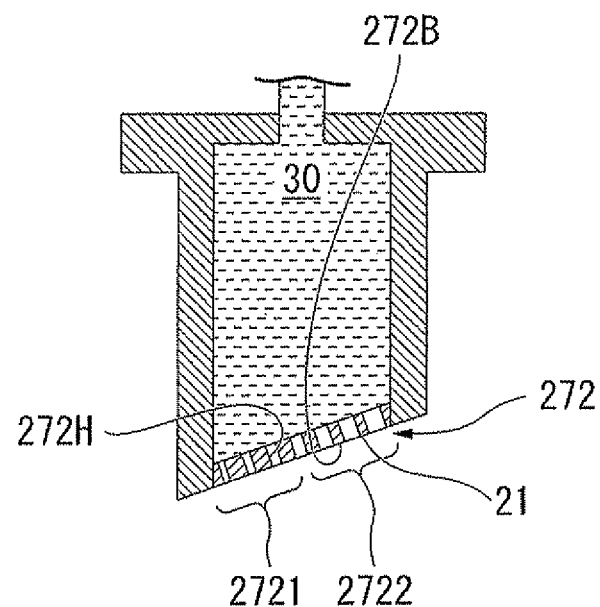
FIG. 36A is a partial side cross sectional view of the liquid immersion member according to the twentieth embodiment.
Figure 36B:
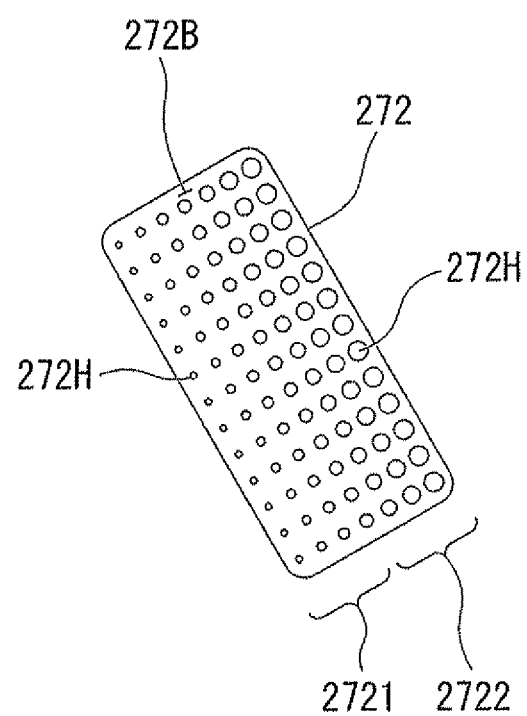
FIG. 36B is an enlarged view of the liquid immersion member according to a twelfth embodiment.

A second member 272 shown in FIGS. 36A and 36B comprises a third portion 2721 and a fourth portion 2722, which is disposed at a position higher than the third portion 2721 is and is capable of discharging a greater amount of the liquid LQ than the third portion 2721 is. In the second member 272, the dimension of holes 272H in the fourth portion 2722 is larger than the dimension of the holes 272H in the third portion 2721. In the example shown in FIGS. 36A and 36B, the percentage of the first discharge ports 21 (i.e., the holes 272H) per unit of area in a lower surface 272B is larger in the fourth portion 2722 than in the third portion 2721.

Figure 37:
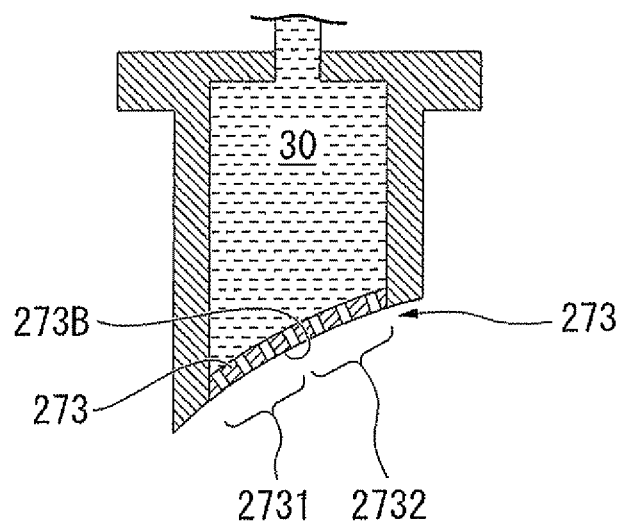
FIG. 37 is a partial side cross sectional view of the liquid immersion member according to the twentieth embodiment.

A second member 273 shown in FIG. 37 comprises a third portion 2731 and a fourth portion 2732, which is disposed at a position higher than the third portion 2731 is and is capable of discharging a greater amount of the liquid LQ than the third portion 2731 is. In FIG. 37, at least part of a lower surface 27313 is indented. In the example shown in FIG. 37, at least part of the lower surface 273B is a curved surface.

In the recovery passageway 19, if the surface height (i.e., the water level or the liquid level) of the liquid space is a first height and the liquid LQ in the liquid space contacts the third portion 2731 and not the fourth portion 2732, then the liquid LQ is discharged via the third portion 2731. Moreover, if the surface height of the liquid space is a second height, which is higher than the first height, and the liquid LQ in the liquid space contacts both the third portion 2731 and the fourth portion 2732, then that liquid LQ is discharged via the third portion 2731 and the fourth portion 2732. Because the lower surface 273B is an indented curved surface, if the surface height of the liquid space increases, then the contact area between the liquid LQ and the lower surface 273B increases and the amount of the liquid LQ discharged via the second member 273 increases. Moreover, if the surface height of the liquid space decreases, then the contact area between the liquid LQ and the lower surface 273B decreases and the amount of the liquid LQ discharged via the second member 273 decreases. Accordingly, in the second member 273 shown in FIG. 37, too, fluctuations in the height of the surface of the liquid space in the recovery passageway 19 can be hindered. Thereby, for example, a fluctuation of the pressure in each of the passageways 30 is hindered.

Figure 38:
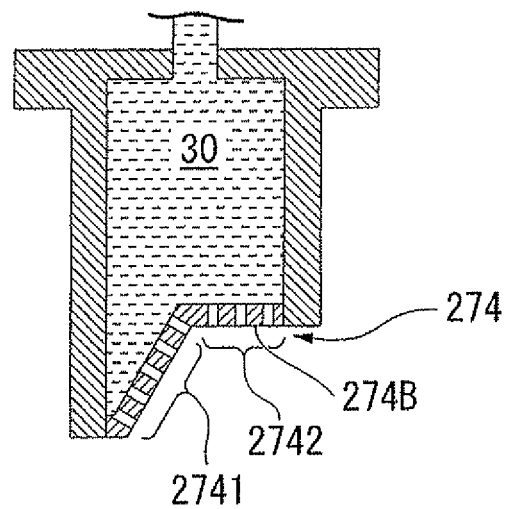
FIG. 38 is a partial side cross sectional view of the liquid immersion member according to the twentieth embodiment.

A second member 274 shown in FIG. 38 comprises a third portion 2741 and fourth portion 2742, which is disposed at a position higher than the third portion 2741 is and is capable of discharging a greater amount of the liquid LQ than the third portion 2741 is. In FIG. 38, at least part of a lower surface 274B is indented. In the example shown in FIG. 38, the lower surface 274B includes an area that forms a first angle with the horizontal plane and an area that forms a second angle, which is different from the first angle, with the horizontal plane. In the present embodiment, the third portion 2741 has the area that forms the first angle, and the fourth portion 2742 has the area that forms the second angle. In the present embodiment, the angle of the lower surface 274B in the fourth portion 2742 with respect to the horizontal plane is smaller than the angle of the lower surface 274B in the third portion 2741 with respect to the horizontal plane.

In the second member 274 shown in FIG. 38, too, if the surface height of the liquid space in the recovery passageway 19 increases, then the area of contact between the liquid LQ and the lower surface 274B increases. Moreover, if the surface height of the liquid space decreases, then the area of contact between the liquid LQ and the lower surface 274B decreases. Accordingly, in the second member 274 shown in FIG. 38, too, fluctuations in the height of the surface of the liquid space in the recovery passageway 19 can be hindered. Thereby, for example, a fluctuation of the pressure in each of the passageways 30 is hindered.

Furthermore, in each of the embodiments that was explained referencing FIG. 33 through FIG. 38, at least some of the first discharge ports 21 are disposed in an inclined surface such that they face the inner side in the radial directions with respect to the optical path K; however, some of the first discharge ports may be provided to an inclined surface such that they face the outer side in the radial directions with respect to the optical path K, or at least a part of at least one of the first discharge ports 21 may be provided to a plane that is parallel to the Z axis.

In addition, in each of the embodiments that was explained referencing FIG. 33 through FIG. 38, the second member (270 and the like) comprises the third portion (2701 and the like) and the fourth portion (2702 and the like), which have different liquid discharge capacities per unit of area; however, the liquid discharge capacity per unit of area of the second member (270 and the like) may be uniform. In such a case, too, fluctuations in, for example, the pressure in each of the passageways 30 is hindered.

<Twenty-First Embodiment>

Figure 39:
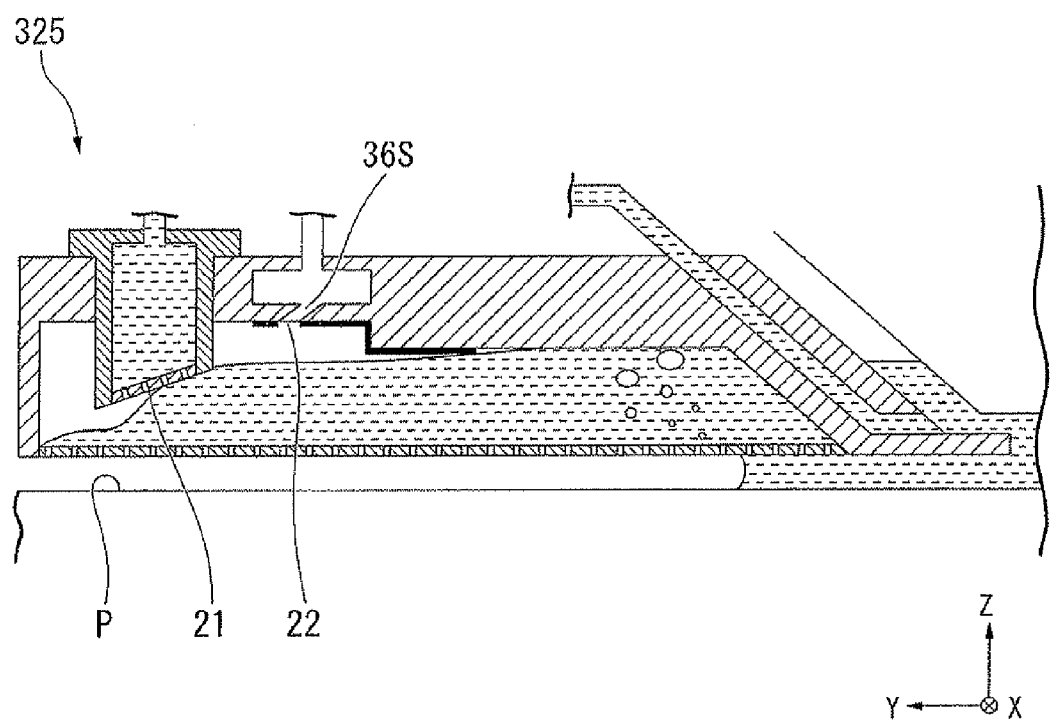
FIG. 39 is a partial side cross sectional view of the liquid immersion member according to a twenty-first embodiment.

A twenty-first embodiment will now be explained. FIG. 39 is a partial side cross sectional view of a liquid immersion member 325 according to the twenty-first embodiment. In FIG. 39, the liquid immersion member 325 has a passageways 36S, which is inclined and connected to the second discharge port 22. The second discharge port 22 is disposed at the lower end of the passageways 36S. The passageways 36S extends upward from the second discharge port 22 toward the inner side in the radial directions with respect to the optical path K. Thereby, the liquid LQ is hindered from flowing into the passageways 36S via the second discharge port 22.

<Twenty-Second Embodiment>

Figure 40:
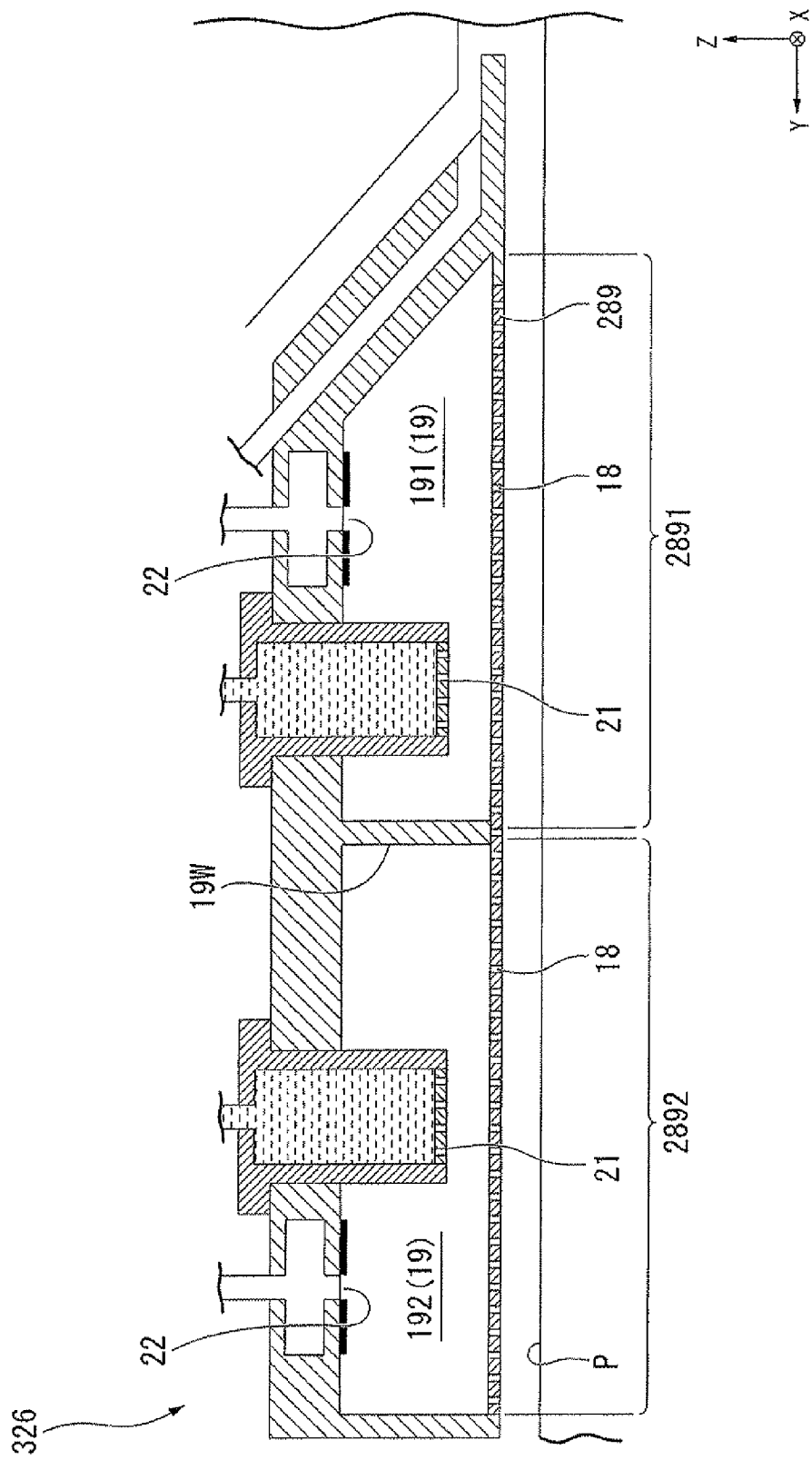
FIG. 40 is a partial side cross sectional view of the liquid immersion member according to a twenty-second embodiment.

A twenty-second embodiment will now be explained. FIG. 40 is a partial side cross sectional view of a liquid immersion member 326 according to the twenty-second embodiment. The liquid immersion member 326 comprises a first member 289, which has a first portion 2891 and a second portion 2892, and the recovery passageway 19, wherethrough the liquid LQ recovered via the recovery ports 18 of the first member 289 flows.

The recovery passageway 19 has a first recovery passageway 191, which the upper surface of the first portion 2891 faces, and a second recovery passageway 192, which the upper surface of the second portion 2892 faces. A partition 19W is disposed between the first recovery passageway 191 and the second recovery passageway 192. The first recovery passageway 191 and the second recovery passageway 192 are separate spaces.

In the present embodiment, the first and second discharge ports 21, 22 are both disposed in both the first recovery passageway 191 and the second recovery passageway 192. In the present embodiment, the pressure in the first recovery passageway 191 and the pressure in the second recovery passageway 192 can be set separately. For example, the pressure in the first recovery passageway 191 may be set such that the liquid LQ is recovered together with the gas G via the holes of the first portion 2891, and the pressure in the second recovery passageway 192 may be set such that the liquid LQ is recovered via the holes in the second portion 2892 while the inflow of the gas G via the holes in the second portion 2892 is hindered.

Furthermore, in the first through twenty-second embodiments discussed above, in the first member (28 and the like), the lower surface (28B and the like) of the first portion (281 and the like) and the lower surface (28B and the like) of the second portion (282 and the like) are disposed within the same plane; however, the height (i.e., the position in the Z axial directions) of the lower surface (28B and the like) of the first portion (281 and the like) and the height of the lower surface (28B and the like) of the second portion (282 and the like) may be different. In addition, the angle formed by the lower surface (28B and the like) of the first portion (281 and the like) with respect to the XY plane (i.e., the horizontal plane) and the angle formed by the lower surface (28B and the like) of the second portion (282 and the like) with respect to the XY plane may be different.

Furthermore, in each of the embodiments discussed above, the singular first member (28 and the like) has the first portion (281 and the like) and the second portion (282 and the like), but the first portion (281 and the like) and the second portion (282 and the like) may be separate members.

Figure 41A:
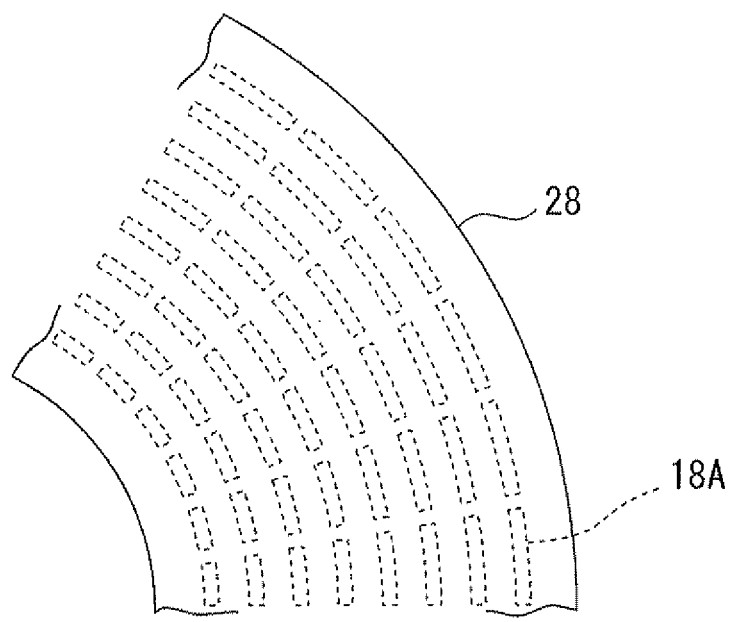
FIG. 41A is a diagram that shows one example of holes in the first member.
Figure 41B:
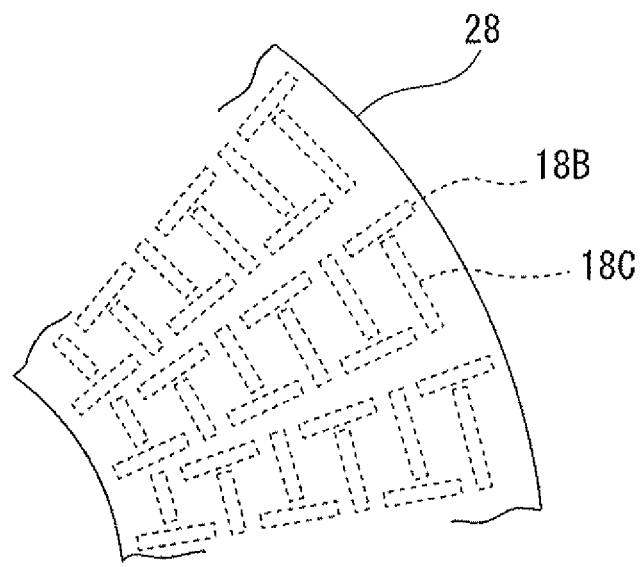
FIG. 41B is a diagram that shows one example of holes in the first member.

Furthermore, in each of the embodiments discussed above, the recovery ports 18 disposed in the first member (28 and the like) are circular, but may be an arbitrary polygonal shape, such as a quadrilateral or a hexagon, or may be elliptical. For example, they may be arcuate recovery ports 18A, as shown in FIG. 41A. In addition, as shown in FIG. 41B, first recovery ports 18B, which are long in the radial directions with respect to the optical path K, and second recovery ports 18C, which are long in the circumferential directions with respect to the optical path K, may be disposed in the first member (28 and the like).

Figure 42A:
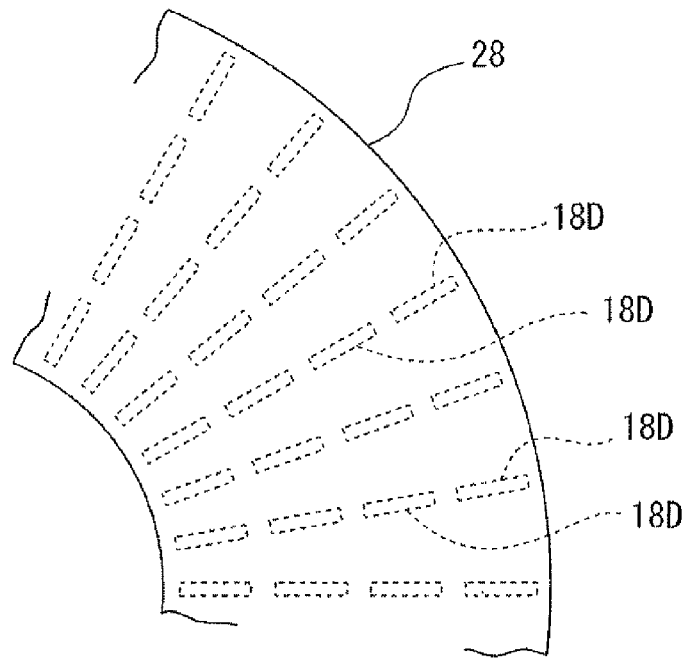
FIG. 42A is a diagram that shows one example of holes in the first member.
Figure 42B:
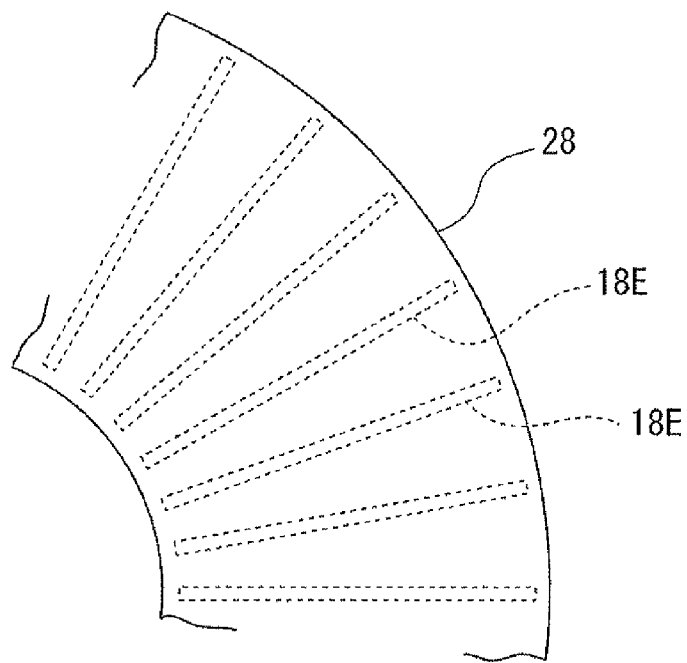
FIG. 42B is a diagram that shows one example of holes in the first member.

In addition, as shown in FIG. 42A, multiple recovery ports 18D, which are long in the radial directions with respect to the optical path K, may be disposed in the first member (28 and the like). In FIG. 42A, the recovery ports 18D are disposed in the radial directions with respect to the optical path K, and multiple groups of those recovery ports 18D disposed in the radial directions are disposed in the circumferential directions with respect to the optical path K. Recovery ports 18E shown in FIG. 42B have lengths such that they extend from an inner edge to an outer edge of the first member 28.

Furthermore, in each of the embodiments discussed above, the second portion (282 and the like) is disposed on the outer side of the first portion (281 and the like) in the radial directions with respect to the optical path K; however, for example, two of the second portions (282 and the like) may be provided, one disposed on the inner side and the other disposed on the outer side of the first portion (281 and the like) in the radial directions with respect to the optical path K. In addition, at least part of the second portion (282 and the like) may be disposed next to the first portion (281 and the like) in the circumferential directions with respect to the optical path K (i.e., in the circumferential directions with respect to the optical axis AX of the projection optical system PL).

In addition, in each of the embodiments discussed above, the hindering part (40 and the like), which hinders contact between the second discharge ports 22 and the liquid LQ, is provided, but it does not have to be provided.

Furthermore, in each of the embodiments discussed above, the inflow of the gas into the recovery passageway 19 via first portion (i.e., 281 and the like) may be hindered. Namely, substantially only the liquid LQ may flow into the recovery passageway 19 also via the first portion (i.e., 281 and the like).

In a case both of the first portion (i.e., 281 and the like) and the second portion (i.e., 282 and the like) recover substantially only the liquid LQ, a suction of the gas via the second discharge ports 22 may be stopped or the second discharge ports 22 are not necessary to be provided.

Furthermore, in each of the embodiments discussed above, the "radial directions with respect to the optical path K" may be regarded as the radial directions with respect to the optical axis AX of the projection optical system PL in the vicinity of the projection area PR.

Furthermore, as discussed above, the control apparatus 4 comprises a computer system, which comprises a CPU and the like. In addition, the control apparatus 4 comprises an interface, which is capable of conducting communication between the computer system and the external apparatus. The storage apparatus 5 comprises a storage medium such as memory (e.g., RAM), a hard disk, a CD-ROM, and the like. In the storage apparatus 5, an operating system (OS) that controls a computer system is installed, and a program for controlling the exposure apparatus EX is stored on the storage apparatus 5.

Furthermore, the control apparatus 4 may be connected to an input apparatus that is capable of inputting an input signal. The input apparatus comprises input equipment, such as a keyboard and a mouse, or a communication apparatus, which is capable of inputting data from the external apparatus. In addition, a display apparatus, such as a liquid crystal display, may be provided.

Various information, including the program stored in the storage apparatus 5, can be read by the control apparatus 4 (i.e., the computer system). In the storage apparatus 5, a program is stored that causes the control apparatus 4 to control the exposure apparatus EX such that the substrate P is exposed with the exposure light EL, which transits the liquid LQ.

The program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the second portion hinders the flow of the gas from the space that the first surface faces into the recovery passageway, which the second surface faces, via the holes more than the first portion does; and a process that separately discharges the liquid and the gas from the recovery passageway, wherethrough the liquid recovered via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the inflow resistance of the gas from the space that the first surface faces into the recovery passageway, which the second surface faces, via the holes is larger in the second portion than in the first portion; and a process that separately discharges the liquid and the gas from the recovery passageway, wherethrough the liquid recovered via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the percentage of the holes per unit of area in the first surface is smaller in the second portion than in the first portion; and a process that separately discharges the liquid and the gas from the recovery passageway, wherethrough the liquid recovered from the space above the substrate via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the dimension of the holes is smaller in the second portion than in the first portion; and a process that separately discharges the liquid and the gas from the recovery passageway, wherethrough the liquid recovered from the space above the substrate via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the number of the holes is smaller in the second portion than in the first portion; and a process that separately discharges the liquid and the gas from the recovery passageway, wherethrough the liquid recovered from the space above the substrate via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the surface of each of the holes in the second portion is more lyophilic with respect to the liquid than the surface of each of the holes in the first portion is; and a process that separately discharges the liquid and the gas from the recovery passageway, wherethrough the liquid recovered from the space above the substrate via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; and a process that separately discharges the liquid and the gas from the recovery passageway, wherethrough the liquid recovered from the space above the substrate via the holes of the first member flows.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the second portion hinders the flow of the gas from the space that the first surface faces into the recovery passageway, which the second surface faces, via the holes more than the first portion does; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the inflow resistance of the gas from the space that the first surface faces into the recovery passageway, which the second surface faces, via the holes is larger in the second portion than in the first portion; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the percentage of the holes per unit of area in the first surface is smaller in the second portion than in the first portion; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the dimension of the holes is smaller in the second portion than in the first portion; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the number of the holes is smaller in the second portion than in the first portion; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the surface of each of the holes in the second portion is more lyophilic with respect to the liquid than the surface of each of the holes in the first portion is; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

In addition, the program stored in the storage apparatus 5 may cause the control apparatus 4 to execute the following processes according to the embodiments discussed above: a process that forms the immersion space such that the optical path of the exposure light between the substrate and the last optical element, wherefrom the exposure light can emerge, is filled with the liquid; a process that exposes the substrate with the exposure light, which transits the liquid in the immersion space; a process that causes the substrate to oppose the first surface of the first member, the first member having the first surface, the second surface, which faces a direction other than that faced by the first surface, and a plurality of the holes that connect the first surface and the second surface; a process that recovers at least some of the liquid from the space above the substrate via the holes in the first portion or the second portion, or both, of the first member, wherein the second portion includes the holes whose inner surfaces have inclination angles that are different from those of the inner surfaces of the holes in the first portion such that the contact angle of the liquid with respect to the inner surfaces of the holes is substantially larger in the second portion than in the first portion; a process that discharges the fluid, which includes the liquid in the recovery passageway wherethrough the liquid recovered via the holes of the first member flows, via the first discharge ports, which face the recovery passageway; and a process that discharges the fluid, which includes the gas in the recovery passageway, via the second discharge port, which hinders the inflow of the liquid more than the first discharge ports do.

The program stored in the storage apparatus 5 is read by the control apparatus 4, and thereby the various processes, such as the immersion exposure of the substrate P in the state wherein the immersion space LS is formed, are executed in cooperation with the various apparatuses of the exposure apparatus EX, such as the substrate stage 2, the liquid immersion member 3, the liquid supply apparatus 35, the first discharge apparatus 24, and the second discharge apparatus 26.

Furthermore, in the embodiments discussed above, the optical path K on the emergent (i.e., the image plane) side of the last optical element 8 of the projection optical system PL is filled with the liquid LQ; however, the projection optical system PL may be a projection optical system wherein the optical path K on the incident (i.e., the object plane) side of the last optical element 8 is also filled with the liquid LQ, as disclosed in, for example, PCT International Publication No. WO2004/019128.

Furthermore, in each of the embodiments discussed above, the liquid LQ is water but may be a liquid other than water. Preferably, the liquid LQ is a liquid that is transparent with respect to the exposure light EL, has a high refractive index with respect to the exposure light EL, and is stable with respect to the projection optical system PL or the film of, for example, the photosensitive material (i.e., the photoresist) that forms the front surface of the substrate P. For example, the liquid LQ may be a fluorine-based liquid such as hydrofluoro-ether (HFE), perfluorinated polyether (PFPE), or Fomblin® oil. In addition, the liquid LQ may be any of various fluids, for example, a supercritical fluid.

Furthermore, the substrate P in each of the embodiments discussed above is a semiconductor wafer for fabricating semiconductor devices, but may be, for example, a glass substrate for display devices, a ceramic wafer for thin film magnetic heads, or the original plate of a mask or a reticle (e.g., synthetic quartz or a silicon wafer) used by an exposure apparatus.

Furthermore, the exposure apparatus EX in each of the embodiments discussed above is a step-and-scan type scanning exposure apparatus (i.e., a scanning stepper), which scans and exposes the pattern of the mask M by synchronously moving the mask M and the substrate P, but the exposure apparatus EX may be, for example, a step-and-repeat type projection exposure apparatus (i.e., a stepper), which performs a full field exposure of the pattern of the mask M—with the mask M and the substrate P in a stationary state—and then sequentially steps the substrate P.

In addition, the exposure apparatus EX may be a full-field exposure apparatus (i.e., a stitching type full-field exposure apparatus), which performs a full-field exposure of the substrate P; in this case, a step-and-repeat type exposure is performed using the projection optical system PL to transfer a reduced image of a first pattern onto the substrate P in a state wherein the first pattern and the substrate P are substantially stationary, after which the projection optical system PL is used to partially superpose a reduced image of a second pattern onto the transferred first pattern in the state wherein the second pattern and the substrate P are substantially stationary. In addition, the stitching type exposure apparatus may be a step-and-stitch type exposure apparatus that successively steps the substrate P and transfers at least two patterns onto the substrate P such that they are partially superposed.

In addition, the exposure apparatus EX may be an exposure apparatus that combines on the substrate P the patterns of two masks through a projection optical system and double exposes, substantially simultaneously, a single shot region on the substrate P using a single scanning exposure, as disclosed in, for example, U.S. Pat. No. 6,611,316. In addition, the exposure apparatus EX may be a proximity type exposure apparatus, a mirror projection aligner, or the like.

In addition, the exposure apparatus EX may be a twin stage type exposure apparatus, which comprises a plurality of substrate stages, as disclosed in, for example, U.S. Pat. Nos. 6,341,007, 6,208,407, and 6,262,796. For example, if the exposure apparatus EX comprises two of the substrate stages, then the object that is capable of being disposed such that the object opposes the emergent surface 7 is one of the substrate stages, a substrate held by a substrate holding part on that substrate stage, the other of the substrate stages, the substrate held by a substrate holding part on that other substrate stage, or any combination thereof.

In addition, the exposure apparatus EX can also be adapted to an exposure apparatus that is provided with a substrate stage that holds a substrate and a measurement stage that does not hold the substrate to be exposed and whereon a fiducial member (wherein a fiducial mark is formed) and/or various photoelectric sensors are mounted, as disclosed in, for example, U.S. Pat. No. 6,897,963 and U.S. Patent Application Publication No. 2007/0127006. In such a case, the objects that are capable of being disposed such that they oppose the emergent surface 7 are the substrate stage, the substrate held by the substrate holding part on that substrate stage, the measurement stage, or any combination thereof. In addition, the exposure apparatus EX may be an exposure apparatus that comprises a plurality of the substrate stages and the measurement stages.

The exposure apparatus EX may be a semiconductor device fabrication exposure apparatus that exposes the pattern of a semiconductor device on the substrate P, an exposure apparatus used for fabricating, for example, liquid crystal devices or displays, or an exposure apparatus for fabricating thin film magnetic heads, image capturing devices (e.g., CCDs), micromachines, MEMS, DNA chips, or reticles and masks.

Furthermore, in each of the embodiments discussed above, the position of each of the stages is measured using an interferometer system 13, but the present invention is not limited thereto; for example, an encoder system that detects a scale (i.e., a diffraction grating) provided to each of the stages may be used, or the interferometer system may be used in parallel with the encoder system.

Furthermore, in the embodiments discussed above, the optically transmissive mask M wherein a prescribed shielding pattern (or phase pattern or dimming pattern) is formed on an optically transmissive substrate is used; however, instead of such a mask, a variable shaped mask (also called an electronic mask, an active mask, or an image generator), wherein a transmissive pattern, a reflective pattern, or a light emitting pattern is formed based on electronic data of the pattern to be exposed, as disclosed in, for example, U.S. Pat. No. 6,778, 257, may be used. In addition, instead of a variable shaped mask that comprises a non-emissive type image display device, a pattern forming apparatus that comprises a self-luminous type image display device may be provided.

In each of the embodiments discussed above, the exposure apparatus EX comprises the projection optical system PL; however, the constituent elements explained in each of the embodiments discussed above may be adapted to an exposure apparatus and an exposing method that does not use the projection optical system PL. For example, the constituent elements explained in each of the embodiments discussed above may be adapted to an exposure apparatus and an exposing method wherein the immersion space LS is formed between the substrate P and an optical member such as a lens, and the exposure light EL is radiated to the substrate P via that optical member.

In addition, the exposure apparatus EX may be an exposure apparatus (i.e., a lithographic system) that exposes the substrate P with a line-and-space pattern by forming interference fringes on the substrate P, as disclosed in, for example, PCT International Publication No. WO2001/035168.

The exposure apparatus EX according to the embodiments discussed above is manufactured by assembling various subsystems, including each constituent element discussed above, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the connection of mechanical components, the wiring and connection of electrical circuits, and the piping and connection of the pneumatic circuits among the various subsystems. Naturally, prior to performing the process of assembling the exposure apparatus EX from these various subsystems, there are also the processes of assembling each individual subsystem. After the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room, wherein the temperature, the cleanliness level, and the like are controlled.

Figure 43:
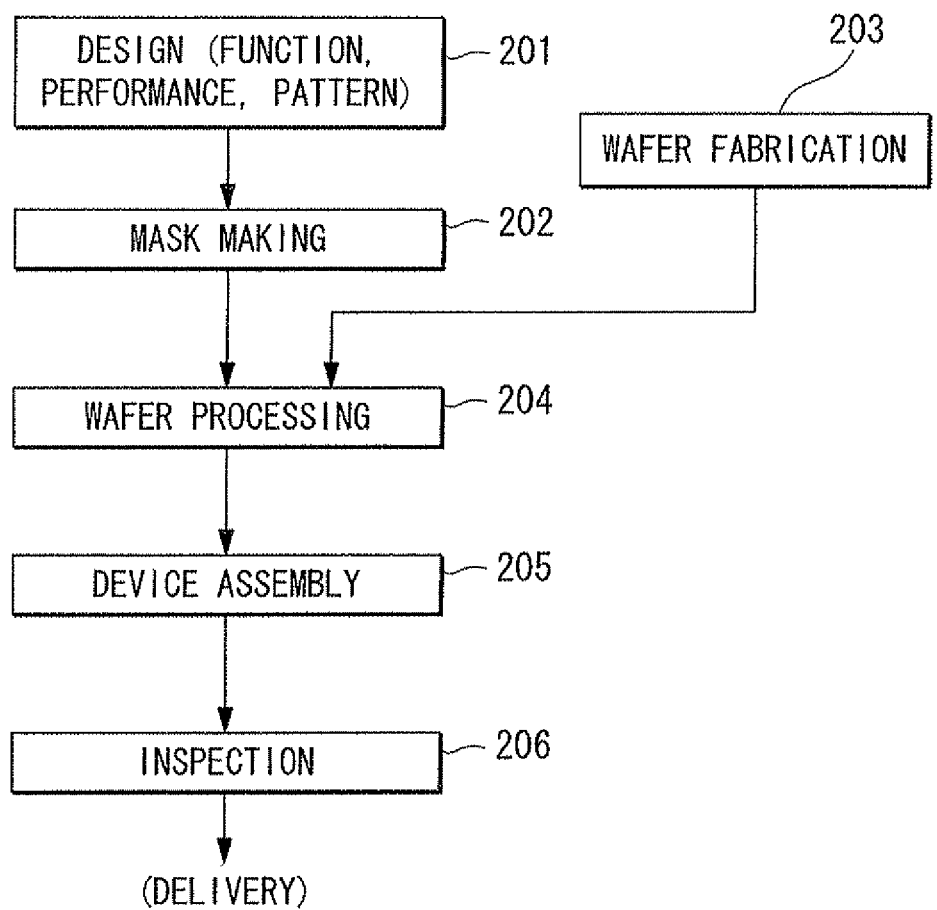
FIG. 43 is a flow chart for explaining one example of a microdevice fabricating process.

As shown in FIG. 43, a microdevice, such as a semiconductor device, is manufactured by: a step 201 that designs the functions and performance of the microdevice; a step 202 that fabricates the mask M (i.e., the reticle) based on this designing step; a step 203 that manufactures the substrate P, which is the base material of the device; a substrate processing step 204 that comprises a substrate process (i.e., an exposure process) that includes, in accordance with the embodiments discussed above, exposing the substrate P with the exposure light EL that emerges from the pattern of the mask M and developing the exposed substrate P; a device assembling step 205 (which includes fabrication processes such as dicing, bonding, and packaging processes); an inspecting step 206; and the like.

Furthermore, the features of each of the embodiments discussed above can be combined as appropriate. In addition, there are also cases wherein some of the constituent elements are not used. In addition, each disclosure of every Japanese published patent application and U.S. patent related to the exposure apparatus EX recited in each of the embodiments discussed above, the modified examples, and the like is hereby incorporated by reference in its entirety to the extent permitted by the national laws and regulations.

What is claimed is:

1. A liquid immersion member, which is disposed inside an immersion exposure apparatus and at least partly around an optical member and around an optical path of exposure light that passes through a liquid between the optical member and an object, the liquid immersion member comprising:
    a first member, which has a first surface, a second surface that faces a direction other than that faced by the first surface, and a plurality of holes that connects the first surface and the second surface, that recovers at least some of the liquid from a space above the object opposing the first surface via the holes;
    a recovery passageway through which the liquid recovered via the holes of the first member flows; and
    a discharge part, which separately discharges the liquid and a gas from the recovery passageway; wherein
    the first member comprises a first portion and a second portion; and
    the second portion hinders the gas from flowing from the space between the object and the first surface into the recovery passageway via the holes more than the first portion hinders the gas from flowing from the space between the object and the first surface into the recovery passageway via the holes.

2. A liquid immersion member according to claim 1, wherein
    a resistance to the flow of the gas from the space between the object and the first surface into the recovery passageway via the holes is larger in the second portion than in the first portion.

3. A liquid immersion member according to claim 1, wherein
    a percentage of the holes per unit of area in the first surface is smaller in the second portion than in the first portion.

4. A liquid immersion member according to claim 1, wherein
    a dimension of the holes in the second portion is smaller than the dimension of the holes in the first portion.

5. A liquid immersion member according to claim 1, wherein
    a number of the holes in the second portion is smaller than the number of the holes in the first portion.

6. A liquid immersion member according to claim 1, wherein
    a surface of each of the holes in the second portion is more lyophilic with respect to the liquid than is the surface of each of the holes in the first portion.

7. A liquid immersion member according to claim 1, wherein
    an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

8. A liquid immersion member according to claim 7, wherein
    each of the holes in the first portion is formed such that it widens from the first surface to the second surface; and
    each of the holes in the second portion is formed such that it widens from the second surface to the first surface.

9. A liquid immersion member according to claim 1, wherein
    the discharge part has a first discharge port, which faces the recovery passageway and is for discharging the liquid from the recovery passageway, and a second discharge port, which faces the recovery passageway and is for discharging the gas from the recovery passageway.

10. A liquid immersion member according to claim 9, wherein
    the first discharge port discharges substantially only the liquid from the recovery passageway; and
    the second discharge port discharges substantially only the gas from the recovery passageway.

11. A liquid immersion member according to claim 9, further comprising:
    a hindering part, which is disposed inside the recovery passageway and hinders the liquid in the recovery passageway from contacting the second discharge port.

12. A liquid immersion member according to claim 11, wherein
    a gas space and a liquid space are formed in the recovery passageway; and
    the hindering part is provided in the recovery passageway such that the second discharge port is disposed in the gas space.

13. A liquid immersion member according to claim 11, wherein
    the hindering part comprises a projection, which is disposed at least partly around the second discharge port.

14. A liquid immersion member according to claim 11, wherein the hindering part comprises a liquid repellent part, which is disposed at least partly around the second discharge port and whose surface is liquid repellent with respect to the liquid.

15. A liquid immersion member according to claim 14, wherein
the recovery passageway has an inner surface, which is adjacent to the liquid repellent part and is more lyophilic with respect to the liquid than is the liquid repellent part; and
the liquid repellent part is disposed between the lyophilic inner surface and the second discharge port.

16. A liquid immersion member according to claim 11, wherein
the hindering part comprises a gas supply port, which supplies the gas at least partly around the second discharge port.

17. A liquid immersion member according to claim 11, wherein
inside the immersion exposure apparatus, the second discharge port is disposed on an outer side of the hindering part in radial directions with respect to the optical path.

18. A liquid immersion member according to claim 9, further comprising:
a projection, which is disposed inside the recovery passageway at least partly around the second discharge port and hinders the liquid in the recovery passageway from contacting the second discharge port.

19. A liquid immersion member according to claim 18, wherein
at least part of the surface of the projection is liquid repellent with respect to the liquid.

20. A liquid immersion member according to claim 18, further comprising:
a liquid repellent part, which is disposed inside the recovery passageway at least partly around the second discharge port and whose surface is liquid repellent with respect to the liquid;
wherein,
the liquid repellent part is disposed between the second discharge port and the projection.

21. A liquid immersion member according to claim 18, wherein
inside the immersion exposure apparatus, the second discharge port is disposed on an outer side of the projection in radial directions with respect to the optical path.

22. A liquid immersion member according to claim 18, wherein
a gas space and a liquid space are formed in the recovery passageway; and
the projection is provided inside the recovery passageway such that the second discharge port is disposed in the gas space.

23. A liquid immersion member according to claim 18, wherein
a tip of the projection is disposed at a position that is lower than the second discharge port.

24. A liquid immersion member according to claim 9, further comprising:
a liquid repellent part, which is disposed at least partly around the second discharge port and hinders the liquid in the recovery passageway from contacting the second discharge port, and whose surface is liquid repellent with respect to the liquid.

25. A liquid immersion member according to claim 24, wherein
the recovery passageway has an inner surface, which is adjacent to the liquid repellent part and is more lyophilic with respect to the liquid than is the liquid repellent part; and
the liquid repellent part is disposed between the lyophilic inner surface and the second discharge port.

26. A liquid immersion member according to claim 24, wherein
a gas space and a liquid space are formed in the recovery passageway; and
the liquid repellent part is provided inside the recovery passageway such that the second discharge port is disposed in the gas space.

27. A liquid immersion member according to claim 9, further comprising:
a gas supply port, which is disposed at least partly around the second discharge port and supplies the gas such that the liquid does not contact the second discharge port.

28. A liquid immersion member according to claim 9, further comprising:
a second member, which has a third surface that faces the recovery passageway, a fourth surface that faces a direction other than that faced by the third surface, and a plurality of holes that connect the third surface and the fourth surface;
wherein,
the first discharge port includes at least one of the holes of the second member.

29. A liquid immersion member according to claim 28, wherein
a pressure differential between the recovery passageway and a space that the fourth surface faces is adjusted such that the discharge of the gas via the first discharge port is hindered.

30. A liquid immersion member according to claim 28, wherein
at least part of the surface of the second member is lyophilic with respect to the liquid.

31. A liquid immersion member according to claim 28, wherein
the second member comprises a third portion and a forth portion, which is disposed at a position higher than the third portion and is capable of discharging a greater amount of the liquid than is the third portion.

32. A liquid immersion member according to claim 31, wherein
the fourth portion is disposed such that the fourth portion is more spaced apart from the second surface of the first member than is the third portion.

33. A liquid immersion member according to claim 31, wherein
a liquid discharge capacity per unit of area of the third surface is higher in the fourth portion than in the third portion.

34. A liquid immersion member according to claim 31, wherein
a percentage of the holes per unit of area of the third surface is larger in the fourth portion than in the third portion.

35. A liquid immersion member according to claim 31, wherein
a dimension of the holes in the fourth portion is larger than the dimension of the holes in the third portion.

36. A liquid immersion member according to claim 31, wherein
a number of the holes in the fourth portion is larger than the number of the holes in the third portion.

37. A liquid immersion member according to claim 31, wherein
an angle with respect to the horizontal plane of the third surface in the fourth portion is smaller than an angle with respect to the horizontal plane of the third surface in the third portion.

38. A liquid immersion member according to claim 28, wherein
at least part of the third surface is nonparallel to the horizontal plane.

39. A liquid immersion member according to claim 38, wherein
the third surface includes an area that forms a first angle with the horizontal plane and an area that forms a second angle, which is different from the first angle.

40. A liquid immersion member according to claim 28, wherein
at least part of the third surface is a curved surface.

41. A liquid immersion member according to claim 28, wherein
at least part of the third surface is indented.

42. A liquid immersion member according to claim 28, wherein
the second member comprises a porous member.

43. A liquid immersion member according to claim 9, further comprising:
a third member, which has a fifth surface that faces the recovery passageway, a sixth surface that faces a direction other than that faced by the fifth surface, and a plurality of holes that connect the fifth surface and the sixth surface;
wherein,
the second discharge port includes at least one of the holes of the third member.

44. A liquid immersion member according to claim 43, wherein
a pressure differential between the recovery passageway and a space that the sixth surface faces is adjusted such that the discharge of the liquid via the second discharge port is hindered.

45. A liquid immersion member according to claim 43, wherein
at least part of the surface of the third member is liquid repellent with respect to the liquid.

46. A liquid immersion member according to claim 43, wherein
the third member comprises a porous member, which has the plurality of the holes.

47. A liquid immersion member according to claim 9, wherein
at least part of the first discharge port opposes the second surface.

48. A liquid immersion member according to claim 9, wherein
inside the immersion exposure apparatus, the first discharge port is disposed on an outer side of the second discharge port in radial directions with respect to the optical path.

49. A liquid immersion member according to claim 9, wherein
inside the immersion exposure apparatus, the first discharge port is disposed on an inner side of the second discharge port in radial directions with respect to the optical path.

50. A liquid immersion member according to claim 9, wherein
at least part of the second discharge port opposes the second surface at the second portion.

51. A liquid immersion member according to claim 9, wherein
the first discharge port is disposed below the second discharge port.

52. A liquid immersion member according to claim 9, wherein
the second discharge port is disposed more spaced apart from the second surface of the first member than is the first discharge port.

53. A liquid immersion member according to claim 9, wherein
at least part of the first discharge port faces upward.

54. A liquid immersion member according to claim 9, wherein
inside the immersion exposure apparatus, the second portion is disposed on an outer side of the first portion in radial directions with respect to the optical path; and
at least part of the second portion is disposed on the outer side of the first discharge port and the second discharge port in the radial directions with respect to the optical path.

55. A liquid immersion member according to claim 54, wherein
inside the immersion exposure apparatus, at least part of the first portion is disposed on an inner side of the first discharge port and the second discharge port in the radial directions with respect to the optical path.

56. A liquid immersion member according to claim 9, wherein
inside the immersion exposure apparatus, the second portion is disposed on an outer side of the first portion in radial directions with respect to the optical path; and
at least part of the first portion is disposed on an inner side of the first discharge port and the second discharge port in the radial directions with respect to the optical path.

57. A liquid immersion member according to claim 9, wherein
inside the immersion exposure apparatus, the first discharge port and the second discharge port are disposed at least partly around the optical path.

58. A liquid immersion member according to claim 1, wherein
inside the immersion exposure apparatus, the second surface comprises a plurality of protruding parts, the protruding parts being disposed at least partly around the optical path and each protruding parts are extending in radial directions with respect to the optical path.

59. A liquid immersion member according to claim 58, wherein
the protruding parts are disposed in the first portion and in the second portion.

60. A liquid immersion member according to claim 1, wherein
inside the immersion exposure apparatus, at least part of the second surface is tilted in radial directions with respect to the optical path relative to a horizontal plane.

61. A liquid immersion member according to claim 60, wherein
inside the immersion exposure apparatus, at least part of the second surface is tilted such that a portion closer to the optical path is lower than a portion farther from the optical path.

62. A liquid immersion member according to claim 1, wherein inside the immersion exposure apparatus, at least part of the first surface is tilted in radial directions with respect to the optical path relative to a horizontal plane.

63. A liquid immersion member according to claim 62, wherein
inside the immersion exposure apparatus, at least part of the first surface is tilted such that a portion closer to the optical path is lower than a portion farther from the optical path.

64. A liquid immersion member according to claim 1, wherein
inside the immersion exposure apparatus, the second portion is disposed on an outer side of the first portion in radial directions with respect to the optical path.

65. A liquid immersion member according to claim 1, wherein
inside the immersion exposure apparatus, the first member is disposed at least partly around the optical path.

66. A liquid immersion member according to claim 1, wherein
inside the immersion exposure apparatus, the second portion is capable of recovering the liquid from the space above the object to the recovery passageway via the holes that contact the liquid in the space above the object and hinders the flow of the gas into the recovery passageway via the holes that do not contact the liquid in the space above the object.

67. A liquid immersion member according to claim 1, wherein
inside the immersion exposure apparatus, the second portion is capable of recovering the liquid from an immersion space, which is formed above the object, to the recovery passageway via the holes that face the immersion space and hinders the flow of the gas into the recovery passageway via the holes that face the gas space on the outer side of the immersion space.

68. A liquid immersion member according to claim 66, wherein
inside the immersion exposure apparatus, when the liquid is being recovered from the space above the object via the first member, a difference in a pressure in the space between the first surface and the object and a pressure in the recovery passageway is set such that the liquid is recovered from the space above the object to the recovery passageway via the holes in the second portion and the flow of the gas into the recovery passageway via the holes in the second portion is hindered.

69. A liquid immersion member according to claim 1, wherein
inside the immersion exposure apparatus, the first portion is capable of recovering the liquid from the space above the object to the recovery passageway via the holes that contact the liquid in the space above the object and suctions the gas into the recovery passageway via the holes that do not contact the liquid in the space above the object.

70. A liquid immersion member according to claim 69, wherein
inside the immersion exposure apparatus, when the liquid is being recovered from the space above the object via the first member, a difference in a pressure in the space between the first surface and the object and a pressure in the recovery passageway is set such that the gas is suctioned into the recovery passageway via the holes in the first portion.

71. A liquid immersion member according to claim 1, wherein
inside the immersion exposure apparatus, the first portion is capable of recovering the liquid from the immersion space, which is formed above the object, to the recovery passageway via the holes that face the immersion space and suctions the gas into the recovery passageway via the holes that face the gas space on the outer side of the immersion space.

72. A liquid immersion member according to claim 1, wherein
inside the immersion exposure apparatus, the first portion is capable of recovering the liquid from the immersion space, which is formed above the object, to the recovery passageway via the holes that face the immersion space and suctions the gas into the recovery passageway via the holes that do not face the immersion space.

73. A liquid immersion member according to claim 1, wherein
inside the immersion exposure apparatus, when the liquid is being recovered from the space above the object via the first member, the second surface in the second portion is covered with the liquid in the recovery passageway.

74. A liquid immersion member according to claim 1, further comprising:
a liquid supply port, which is capable of supplying the liquid to the recovery passageway.

75. A liquid immersion member according to claim 1, wherein
the first member comprises a porous member which has the plurality of the holes.

76. A liquid immersion member according to claim 1, further comprising:
a seventh surface, which opposes at least part of the second surface;
wherein,
inside the immersion exposure apparatus, at least part of the seventh surface is tilted in radial directions with respect to the optical path relative to a horizontal plane.

77. A liquid immersion member according to claim 76, wherein
inside the immersion exposure apparatus, at least part of the seventh surface is tilted such that a portion closer to the optical path is lower than a portion farther from the optical path.

78. An immersion exposure apparatus, which exposes a substrate with exposure light that transits a liquid, comprising:
the liquid immersion member according to claim 1.

79. A device fabricating method, comprising:
exposing a substrate using the immersion exposure apparatus according to claim 78; and
developing the exposed substrate.

80. A liquid immersion member, which is disposed inside an immersion exposure apparatus and at least partly around an optical member and around an optical path of exposure light that passes through a liquid between the optical member and an object, the liquid immersion member comprising:
a first member, which has a first surface, a second surface that faces a direction other than that faced by the first surface, and a plurality of holes that connects the first surface and the second surface, that recovers at least some of the liquid from a space above the object opposing the first surface via the holes;
a recovery passageway through which the liquid recovered via the holes of the first member flows; and
a discharge part, which separately discharges the liquid and a gas from the recovery passageway; wherein the first member comprises a first portion and a second portion; and a resistance to the flow of the gas from the space between the object and the first surface into the recovery passageway via the holes is larger in the second portion than in the first portion.

81. A liquid immersion member, which is disposed inside an immersion exposure apparatus and at least partly around an optical member and around an optical path of exposure light that passes through a liquid between the optical member and an object, the liquid immersion member comprising:

a first member, which has a first surface, a second surface that faces a direction other than that faced by the first surface, and a plurality of holes that connects the first surface and the second surface, that recovers at least some of the liquid from a space above the object opposing the first surface via the holes;

a recovery passageway through which the liquid recovered via the holes of the first member flows; and a discharge part, which separately discharges the liquid and a gas from the recovery passageway; wherein the first member comprises a first portion and a second portion; and a dimension of the holes in the second portion is smaller than the dimension of the holes in the first portion.

82. A liquid immersion member, which is disposed inside an immersion exposure apparatus and at least partly around an optical member and around an optical path of exposure light that passes through a liquid between the optical member and an object, the liquid immersion member comprising:

a first member, which has a first surface, a second surface that faces a direction other than that faced by the first surface, and a plurality of holes that connects the first surface and the second surface, that recovers at least some of the liquid from a space above the object opposing the first surface via the holes;

a recovery passageway through which the liquid recovered via the holes of the first member flows; and a discharge part, which separately discharges the liquid and a gas from the recovery passageway; wherein the first member comprises a first portion and a second portion; and a surface of each of the holes in the second portion is more lyophilic with respect to the liquid than is the surface of each of the holes in the first portion.

83. A liquid immersion member, which is disposed inside an immersion exposure apparatus and at least partly around an optical member and around an optical path of exposure light that passes through a liquid between the optical member and an object, the liquid immersion member comprising:

a first member, which has a first surface, a second surface that faces a direction other than that faced by the first surface, and a plurality of holes that connects the first surface and the second surface, that recovers at least some of the liquid from a space above the object opposing the first surface via the holes;

a recovery passageway through which the liquid recovered via the holes of the first member flows; and a discharge part, which separately discharges the liquid and a gas from the recovery passageway; wherein the first member comprises a first portion and a second portion; and an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

84. A liquid immersion member, which is disposed inside an immersion exposure apparatus and at least partly around an optical member and around an optical path of exposure light that passes through a liquid between the optical member and an object, the liquid immersion member comprising:

a first member, which has a first surface, a second surface that faces a direction other than that faced by the first surface, and a plurality of holes that connects the first surface and the second surface, that recovers at least some of the liquid from a space above the object opposing the first surface via the holes;

a recovery passageway through which the liquid recovered via the holes of the first member flows; and a discharge part, which discharges the liquid and a gas from the recovery passageway; wherein the discharge part has a first discharge port and a second discharge port;

the first discharge port hinders the inflow of the gas more than the second discharge port hinders the inflow of the gas;

the second discharge port hinders the inflow of the liquid more than the first discharge port hinders the inflow of the liquid;

the first member comprises a first portion and a second portion; and the second portion hinders the gas from flowing from the space between the object and the first surface into the recovery passageway via the holes more than the first portion hinders the gas from flowing from the space between the object and the first surface into the recovery passageway via the holes.

85. A liquid immersion member according to claim 84, wherein a resistance to the flow of the gas from the space between the object and the first surface into the recovery passageway via the holes is larger in the second portion than in the first portion.

86. A liquid immersion member according to claim 84, wherein a percentage of the holes per unit of area in the first surface is smaller in the second portion than in the first portion.

87. A liquid immersion member according to claim 84, wherein a dimension of the holes in the second portion is smaller than the dimension of the holes in the first portion.

88. A liquid immersion member according to claim 84, wherein a number of the holes in the second portion is smaller than the number of the holes in the first portion.

89. A liquid immersion member according to claim 84, wherein a surface of each of the holes in the second portion is more lyophilic with respect to the liquid than is the surface of each of the holes in the first portion.

90. A liquid immersion member according to claim 84, wherein an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

91. A liquid immersion member according to claim 90, wherein
   each of the holes of the first portion is formed such that it widens from the first surface to the second surface; and
   each of the holes of the second portion is formed such that it widens from the second surface to the first surface.

92. A liquid immersion member, which is disposed inside an immersion exposure apparatus and at least partly around an optical member and around an optical path of exposure light that passes through a liquid between the optical member and an object, the liquid immersion member comprising:
   a first member, which has a first surface, a second surface that faces a direction other than that faced by the first surface, and a plurality of holes that connects the first surface and the second surface, that recovers at least some of the liquid from a space above the object opposing the first surface via the holes;
   a recovery passageway through which the liquid recovered via the holes of the first member flows; and
   a discharge part, which discharges the liquid and a gas from the recovery passageway; wherein
   the discharge part has a first discharge port and a second discharge port;
   the first discharge port hinders the inflow of the gas more than the second discharge port hinders the inflow of the gas;
   the second discharge port hinders the inflow of the liquid more than the first discharge port hinders the inflow of the liquid;
   the first member comprises a first portion and a second portion; and
   a resistance to the flow of the gas from the space between the object and the first surface into the recovery passageway via the holes is larger in the second portion than in the first portion.

93. A liquid immersion member, which is disposed inside an immersion exposure apparatus and at least partly around an optical member and around an optical path of exposure light that passes through a liquid between the optical member and an object, the liquid immersion member comprising:
   a first member, which has a first surface, a second surface that faces a direction other than that faced by the first surface, and a plurality of holes that connects the first surface and the second surface, that recovers at least some of the liquid from a space above the object opposing the first surface via the holes;
   a recovery passageway through which the liquid recovered via the holes of the first member flows; and
   a discharge part, which discharges the liquid and a gas from the recovery passageway; wherein
   the discharge part has a first discharge port and a second discharge port;
   the first discharge port hinders the inflow of the gas more than the second discharge port hinders the inflow of the gas;
   the second discharge port hinders the inflow of the liquid more than the first discharge port hinders the inflow of the liquid;
   the first member comprises a first portion and a second portion; and
   a dimension of the holes in the second portion is smaller than the dimension of the holes in the first portion.

94. A liquid immersion member, which is disposed inside an immersion exposure apparatus and at least partly around an optical member and around an optical path of exposure light that passes through a liquid between the optical member and an object, the liquid immersion member comprising:
   a first member, which has a first surface, a second surface that faces a direction other than that faced by the first surface, and a plurality of holes that connects the first surface and the second surface, that recovers at least some of the liquid from a space above the object opposing the first surface via the holes;
   a recovery passageway through which the liquid recovered via the holes of the first member flows; and
   a discharge part, which discharges the liquid and a gas from the recovery passageway; wherein
   the discharge part has a first discharge port and a second discharge port;
   the first discharge port hinders the inflow of the gas more than the second discharge port hinders the inflow of the gas;
   the second discharge port hinders the inflow of the liquid more than the first discharge port hinders the inflow of the liquid;
   the first member comprises a first portion and a second portion; and
   a surface of each of the holes in the second portion is more lyophilic with respect to the liquid than is the surface of each of the holes in the first portion.

95. A liquid immersion member, which is disposed inside an immersion exposure apparatus and at least partly around an optical member and around an optical path of exposure light that passes through a liquid between the optical member and an object, the liquid immersion member comprising:
   a first member, which has a first surface, a second surface that faces a direction other than that faced by the first surface, and a plurality of holes that connects the first surface and the second surface, that recovers at least some of the liquid from a space above the object opposing the first surface via the holes;
   a recovery passageway through which the liquid recovered via the holes of the first member flows; and
   a discharge part, which discharges the liquid and a gas from the recovery passageway; wherein
   the discharge part has a first discharge port and a second discharge port;
   the first discharge port hinders the inflow of the gas more than the second discharge port hinders the inflow of the gas;
   the second discharge port hinders the inflow of the liquid more than the first discharge port hinders the inflow of the liquid;
   the first member comprises a first portion and a second portion; and
   an inclination angle of an inner surface of each of the holes in the first portion and an inclination angle of an inner surface of each of the holes in the second portion are different such that a contact angle of the liquid with respect to the inner surface of each of the holes in the second portion is substantially larger than a contact angle of the liquid with respect to the inner surface of each of the holes in the first portion.

96. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
   causing the substrate to oppose a first surface of a first member, the first member having the first surface, a second surface that faces a direction other than that faced by the first surface, and a plurality of holes that connect the first surface and the second surface;

recovering at least some of the liquid from the space above the substrate via the holes in at least one of first and second portions of the first member, the second portion hindering the flow of a gas from the space that the first surface faces into a recovery passageway, which the second surface faces, via the holes more than the first portion hinders the flow of the gas from the space that the first surface faces into the recovery passageway; and separately discharging the liquid and the gas from the recovery passageway through which the liquid recovered via the holes of the first member flows.

97. A liquid recovering method according to claim 96, further comprising:

separately discharging the liquid and the gas from the recovery passageway;

discharging substantially only the liquid via a first discharge port, which faces the recovery passageway; and discharging substantially only the gas via a second discharge port, which faces the recovery passageway.

98. A liquid recovering method according to claim 96, wherein an amount of the liquid that flows to the recovery passageway via the holes of the first member is larger than the amount of the gas that flows to the recovery passageway via the holes of the first member.

99. A liquid recovering method according to claim 96, wherein an amount of the liquid that flows to the recovery passageway via the holes in the first portion is larger than the amount of the liquid that flows to the recovery passageway via the holes in the second portion.

100. A liquid recovering method according to claim 96, wherein in the recovery passageway, substantially all of the second surface contacts the liquid.

101. A liquid recovering method according to claim 96, wherein between the substrate and the first surface, an interface of the liquid is disposed between the substrate, and at least one of an outer edge of the first portion and an inner edge of the second portion.

102. A device fabricating method, comprising:

filling an optical path of exposure light radiated to a substrate with a liquid using the liquid recovering method according to claim 96;

exposing the substrate with the exposure light via the liquid; and developing the exposed substrate.

103. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a resistance to the flow of gas from the space that the first surface faces into a recovery passageway, which the second surface faces, via the holes is larger in the second portion than in the first portion; and separately discharging the liquid and the gas from the recovery passageway through which the liquid recovered via the holes of the first member flows.

104. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a dimension of the holes in the second portion is smaller than the dimension of the holes in the first portion; and separately discharging the liquid and a gas from a recovery passageway through which the liquid recovered from the space above the substrate via the holes of the first member flows.

105. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a surface of each of the holes in the second portion is more lyophilic with respect to the liquid than is the surface of each of the holes in the first portion; and separately discharging the liquid and a gas from a recovery passageway through which the liquid recovered from the space above the substrate via the holes of the first member flows.

106. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein the holes in the second portion have inner surfaces with inclination angles that are different from inclination angles of the inner surfaces of the holes in the first portion such that a contact angle of the liquid with respect to the inner surfaces of the holes is substantially larger in the second portion than in the first portion; and separately discharging the liquid and a gas from a recovery passageway through which the liquid recovered from the space above the substrate via the holes of the first member flows.

107. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least of first and second portions of the first member, the second portion hindering the flow of a gas from the space that the first surface faces into a recovery passageway, which the second surface faces, via the holes more than the first portion hinders the flow of the gas from the space that the first surface faces into the recovery passageway;
discharging a first fluid that includes the liquid in the recovery passageway through which the liquid recovered via the holes of the first member flows, via a first discharge port, which faces the recovery passageway; and
discharging a second fluid that includes the gas in the recovery passageway via a second discharge port, which hinders the inflow of the liquid more than the first discharge port hinders the inflow of the liquid.

108. A liquid recovering method according to claim 107, further comprising:
discharging substantially only the liquid via the first discharge port; and
discharging substantially only the gas via the second discharge port.

109. A liquid recovering method according to claim 108, comprising:
hindering the liquid in the recovery passageway from contacting the second discharge port.

110. A liquid recovering method according to claim 109, wherein:
a gas space and a liquid space are formed in the recovery passageway, and an interface of the liquid space is adjusted such that the second discharge port is disposed in the gas space.

111. A liquid recovering method according to claim 109, wherein
the first discharge port is disposed at an end part of holes on a third surface side of a second member, the second member comprising a porous member and having a third surface, a fourth surface that faces a direction other than that faced by the third surface, and a plurality of holes that connect the third surface and the fourth surface; comprising:
discharging at least some of the liquid from the recovery passageway via the first discharge port after passim through at least one of a third portion and a fourth portion of the second member, wherein the fourth portion is disposed higher than the third portion and an amount of the liquid discharged from the fourth portion is larger than that discharged from the third portion.

112. A liquid recovering method according to claim 109, wherein
the first discharge port is disposed at an end part of holes on a third surface side of a second member, the second member comprising a porous member and having the third surface that is nonparallel with respect to a horizontal plane, a fourth surface that faces a direction other than that faced by the third surface, and a plurality of holes that connect the third surface and the fourth surface.

113. A liquid recovering method according to claim 109, wherein
the first discharge port is disposed at an end part of holes on a third surface side of a second member, the second member comprising a porous member and having the third surface, at least part of which includes a curved surface, a fourth surface that faces a direction other than that faced by the third surface, and a plurality of holes that connect the third surface and the fourth surface.

114. A liquid recovering method according to claim 108, wherein
a projection is disposed at least partly around the second discharge port, and substantially only the gas is recovered from the recovery passageway via the second discharge port.

115. A liquid recovering method according to claim 114, wherein:
a gas space and a liquid space are formed in the recovery passageway, and wherein an interface of the liquid space is defined by the projection such that the second discharge port is disposed in the gas space.

116. A liquid recovering method according to claim 108, wherein:
a liquid repellent part, whose surface is liquid repellent with respect to the liquid, is disposed at least partly around the second discharge port, and substantially only the gas is recovered from the recovery passageway via the second discharge port.

117. A liquid recovering method according to claim 116, wherein:
a gas space and a liquid space are formed in the recovery passageway, and wherein an interface of the liquid space is defined by the liquid repellent part such that the second discharge port is disposed in the gas space.

118. A liquid recovering method according to claim 108, comprising:
supplying the gas at least partly around the second discharge port via a gas supply port.

119. A liquid recovering method according to claim 118, wherein
the gas is supplied via the gas supply port such that the liquid does not contact the second discharge port.

120. A liquid recovering method to according to claim 108, wherein
the first discharge port is disposed at an end part of holes on a third surface side of a second member, the second member comprising a porous member and having a third surface, a fourth surface that faces a direction other than that faced by the third surface, and a plurality of holes that connect the third surface and the fourth surface; comprising:
discharging at least some of the liquid from the recovery passageway via the first discharge port after passing through at least one of a third portion and a fourth portion of the second member, wherein the fourth portion is disposed higher than the third portion and an amount of the liquid discharged from the fourth portion is larger than that discharged from the third portion.

121. A liquid recovering method according to claim 108, wherein the first discharge port is disposed at an end part of holes on a third surface side of a second member, the second member comprising a porous member and having the third surface that is nonparallel with respect to a horizontal plane, a fourth surface that faces a direction other than that faced by the third surface, and a plurality of holes that connect the third surface and the fourth surface.

122. A liquid recovering method according to claim 108, wherein
the first discharge port is disposed at an end part of holes on a third surface side of a second member, the second member comprising a porous member and having the third surface, at least part of which includes a curved surface, a fourth surface that faces a direction other than that faced by the third surface, and a plurality of holes that connect the third surface and the fourth surface.

123. A liquid recovering method according to claim 108, wherein
the liquid and the gas between the substrate and the first member flows to the recovery passageway via the first member; and
a liquid space and a gas space are formed in the recovery passageway.

124. A liquid recovering method according to claim 108, wherein
the liquid and the gas flow to the recovery passageway via the first member such that the liquid in the recovery passageway does not contact with the second discharge port and contacts with the first discharge port.

125. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a resistance to the flow of a gas from a space that the first surface faces into a recovery passageway, which the second surface faces, via the holes is larger in the second portion than in the first portion;
discharging a first fluid that includes the liquid in the recovery passageway through which the liquid recovered via the holes of the first member flows, via a first discharge port, which faces the recovery passageway; and
discharging a second fluid that includes the gas in the recovery passageway via a second discharge port, which hinders the inflow of the liquid more than the first discharge port hinders the inflow of the liquid.

126. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a dimension of the holes in the second portion is smaller than the dimension of the holes in the first portion;
discharging a first fluid that includes the liquid in a recovery passageway through which the liquid recovered via the holes of the first member flows, via a first discharge port, which faces the recovery passageway; and
discharging a second fluid that includes a gas in the recovery passageway via a second discharge port, which hinders the inflow of the liquid more than the first discharge port hinders the inflow of the liquid.

127. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a surface of each of the holes in the second portion is more lyophilic with respect to the liquid than is the surface of each of the holes in the first portion;
discharging a first fluid that includes the liquid in a recovery passageway through which the liquid recovered via the holes of the first member flows, via a first discharge port, which faces the recovery passageway; and
discharging a second fluid that includes a gas in the recovery passageway via a second discharge port, which hinders the inflow of the liquid more than the first discharge port hinders the inflow of the liquid.

128. A liquid recovering method that is used in an immersion exposure apparatus in which an immersion space is formed such that an optical path of exposure light between an optical member, from which the exposure light emerges, and a substrate is filled with a liquid and the substrate is exposed with the exposure light via the liquid, the method comprising:
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein the holes of the second portion have inner surfaces with inclination angles that are different from inclination angles of inner surfaces of the holes in the first portion such that a contact angle of the liquid with respect to the inner surfaces of the holes is substantially larger in the second portion than in the first portion;
discharging a first fluid that includes the liquid in a recovery passageway through which the liquid recovered via the holes of the first member flows, via a first discharge port, which faces the recovery passageway; and
discharging a second fluid that includes a gas in the recovery passageway via a second discharge port, which hinders the inflow of the liquid more than the first discharge port hinders the inflow of the liquid.

129. A non-transitory computer-readable storage medium storing a program that causes a computer to control an immersion exposure apparatus that exposes a substrate with exposure light via a liquid, to perform the steps of:
forming an immersion space such that an optical path of the exposure light between the substrate and an optical member, from which the exposure light emerges, is filled with the liquid;
exposing the substrate with the exposure light via the liquid in the immersion space;
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein the second portion hinders the flow of a gas from the space that the first surface faces into a recovery passageway, which the second surface faces, via the holes more than the first portion hinders the flow of the gas from the space that the first surface faces into the recovery passageway, which the second surface faces, via the holes; and
separately discharging the liquid and the gas from the recovery passageway through which the liquid recovered via the holes of the first member flows.

130. A non-transitory computer-readable storage medium storing a program that causes a computer to control an immersion exposure apparatus that exposes a substrate with exposure light via a liquid, to perform the steps of:
forming an immersion space such that an optical path of the exposure light between the substrate and an optical member, from which the exposure light emerges, is filled with the liquid;
exposing the substrate with the exposure light via the liquid in the immersion space;
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a resistance to the flow of a gas from a space that the first surface faces into a recovery passageway, which the second surface faces, via the holes is larger in the second portion than in the first portion; and
separately discharging the liquid and the gas from the recovery passageway through which the liquid recovered via the holes of the first member flows.

131. A non-transitory computer-readable storage medium storing a program that causes a computer to control an immersion exposure apparatus that exposes a substrate with exposure light via a liquid, to perform the steps of:
forming an immersion space such that an optical path of the exposure light between the substrate and an optical member, from which the exposure light emerges, is filled with the liquid;
exposing the substrate with the exposure light via the liquid in the immersion space;
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a dimension of the holes in the second portion is smaller than the dimension of the holes in the first portion; and
separately discharging the liquid and a gas from a recovery passageway through which the liquid recovered from the space above the substrate via the holes of the first member flows.

132. A non-transitory computer-readable storage medium storing a program that causes a computer to control an immersion exposure apparatus that exposes a substrate with exposure light via a liquid, to perform the steps of:
forming an immersion space such that an optical path of the exposure light between the substrate and an optical member, from which the exposure light emerges, is filled with the liquid;
exposing the substrate with the exposure light via the liquid in the immersion space;
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein a surface of each of the holes in the second portion is more lyophilic with respect to the liquid than is the surface of each of the holes in the first portion; and
separately discharging the liquid and a gas from a recovery passageway through which the liquid recovered from the space above the substrate via the holes of the first member flows.

133. A non-transitory computer-readable storage medium storing a program that causes a computer to control an immersion exposure apparatus that exposes a substrate with exposure light via a liquid, to perform the steps of:
forming an immersion space such that an optical path of the exposure light between the substrate and an optical member, from which the exposure light emerges, is filled with the liquid;
exposing the substrate with the exposure light via the liquid in the immersion space;
causing the substrate to oppose a first surface of a first member, the first member having the first surface, a second surface that faces a direction other than that faced by the first surface, and a plurality of holes that connect the first surface and the second surface;
recovering at least some of the liquid from a space above the substrate via the holes in at least one of first and second portions of the first member, wherein the holes in the second portion have inner surfaces with inclination angles that are different from inclination angles of inner surfaces of the holes in the first portion such that a contact angle of the liquid with respect to the inner surfaces of the holes is substantially larger in the second portion than in the first portion; and
separately discharging the liquid and a gas from a recovery passageway through which the liquid recovered from the space above the substrate via the holes of the first member flows.

134. A non-transitory computer-readable storage medium storing a program that causes a computer to control an immersion exposure apparatus that exposes a substrate with exposure light via a liquid, to perform the steps of:

forming an immersion space such that an optical path of the exposure light between the substrate and an optical member, from which the exposure light emerges, is filled with the liquid;

exposing the substrate with the exposure light via the liquid in the immersion space;

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein the second portion hinders the flow of a gas from the space that the first surface faces into a recovery passageway, which the second surface faces, via the holes more than the first portion hinders the flow of the gas from the space that the first surface faces into the recovery passageway, which the second surface faces, via the holes;

discharging a first fluid that includes the liquid in the recovery passageway through which the liquid recovered via the holes of the first member flows, via a first discharge port, which faces the recovery port; and discharging a second fluid that includes the gas in the recovery passageway via a second discharge port, which hinders the inflow of the liquid more than the first discharge port hinders the inflow of the liquid.

135. A non-transitory computer-readable storage medium storing a program that causes a computer to control an immersion exposure apparatus that exposes a substrate with exposure light via a liquid, to perform the steps of:

forming an immersion space such that an optical path of the exposure light between the substrate and an optical member, from which the exposure light emerges, is filled with the liquid;

exposing the substrate with the exposure light via the liquid in the immersion space;

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a resistance to the flow of a gas from the space that the first surface faces into a recovery passageway, which the second surface faces, via the holes is larger in the second portion than in the first portion;

discharging a first fluid that includes the liquid in the recovery passageway through which the liquid recovered via the holes of the first member flows, via a first discharge port, which faces the recovery port; and discharging a second fluid that includes the gas in the recovery passageway via a second discharge port, which hinders the inflow of the liquid more than the first discharge port hinders the inflow of the liquid.

136. A non-transitory computer-readable storage medium storing a program that causes a computer to control an immersion exposure apparatus that exposes a substrate with exposure light via a liquid, to perform the steps of:

forming an immersion space such that an optical path of the exposure light between the substrate and an optical member, from which the exposure light emerges, is filled with the liquid;

exposing the substrate with the exposure light via the liquid in the immersion space;

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a dimension of the holes in the second portion is smaller than the dimension of the holes in the first portion;

discharging a first fluid that includes the liquid in the recovery passageway through which the liquid recovered via the holes of the first member flows, via a first discharge port, which faces the recovery port; and discharging a second fluid that includes a gas in the recovery passageway via a second discharge port, which hinders the inflow of the liquid more than the first discharge port hinders the inflow of the liquid.

137. A non-transitory computer-readable storage medium storing a program that causes a computer to control an immersion exposure apparatus that exposes a substrate with exposure light via a liquid, to perform the steps of:

forming an immersion space such that an optical path of the exposure light between the substrate and an optical member, from which the exposure light emerges, is filled with the liquid;

exposing the substrate with the exposure light via the liquid in the immersion space;

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein a surface of each of the holes in the second portion is more lyophilic with respect to the liquid than is the surface of each of the holes in the first portion;

discharging a first fluid that includes the liquid in the recovery passageway through which the liquid recovered via the holes of the first member flows, via a first discharge port, which faces the recovery port; and discharging a second fluid that includes a gas in the recovery passageway via a second discharge port, which hinders the inflow of the liquid more than the first discharge port hinders the inflow of the liquid.

138. A non-transitory computer-readable storage medium storing a program that causes a computer to control an immersion exposure apparatus that exposes a substrate with exposure light via a liquid, to perform the steps of:

forming an immersion space such that an optical path of the exposure light between the substrate and an optical member, from which the exposure light emerges, is filled with the liquid;

exposing the substrate with the exposure light via the liquid in the immersion space;

causing the substrate to oppose a first surface of a first member, the first member having the first surface, a second surface that faces a direction other than that faced by the first surface, and a plurality of holes that connect the first surface and the second surface;

recovering at least some of the liquid from a space above the substrate via the holes in at least one of first and second portions of the first member, wherein the holes in the second portion have inner surfaces with inclination angles that are different from inclination angles of inner surfaces of the holes in the first portion such that a contact angle of the liquid with respect to the inner surfaces of the holes is substantially larger in the second portion than in the first portion;

discharging a first fluid that includes the liquid in the recovery passageway through which the liquid recovered via the holes of the first member flows, via a first discharge port, which faces the recovery port; and discharging a second fluid that includes a gas in the recovery passageway via a second discharge port, which hinders the inflow of the liquid more than the first discharge port hinders the inflow of the liquid.

* * * * *